(12) United States Patent
Kawano et al.

(10) Patent No.: US 6,400,191 B2
(45) Date of Patent: Jun. 4, 2002

(54) OUTPUT CIRCUIT, INPUT CIRCUIT AND INPUT/OUTPUT CIRCUIT

(75) Inventors: Harumi Kawano; Akihiro Sushihara, both of Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/794,052

(22) Filed: Feb. 28, 2001

Related U.S. Application Data

(62) Division of application No. 09/541,430, filed on Apr. 3, 2000, which is a division of application No. 09/049,146, filed on Mar. 27, 1998, now Pat. No. 6,057,717.

(30) Foreign Application Priority Data

Mar. 31, 1997 (JP) .............................................. 9-079385

(51) Int. Cl.[7] .............................. H03B 1/00; H03K 3/00
(52) U.S. Cl. ........................ 327/112; 327/537; 327/333; 326/81; 326/87
(58) Field of Search ................................. 327/108, 112, 327/534, 537, 170, 374, 379, 333, 381, 383; 326/80, 81, 83, 86, 87, 27

(56) References Cited

U.S. PATENT DOCUMENTS

| | | | |
|---|---|---|---|
| 3,909,679 A | | 9/1975 | Perti |
| 5,247,800 A | | 9/1993 | Mruzek et al. ............... 62/51.1 |
| 5,297,617 A | | 3/1994 | Herbert ....................... 165/80.3 |
| 5,378,950 A | | 1/1995 | Takamoto et al. ........... 327/401 |
| 5,387,826 A | | 2/1995 | Shay et al. .................... 326/21 |
| 5,444,397 A | * | 8/1995 | Wong et al. ................... 326/81 |
| 5,623,221 A | | 4/1997 | Miyake ....................... 327/108 |
| 5,801,573 A | | 9/1998 | Kelly et al. .................. 327/434 |
| 5,828,262 A | | 10/1998 | Rees ........................... 327/390 |
| 5,892,377 A | * | 4/1999 | Johnson et al. .............. 327/108 |
| 5,903,179 A | | 5/1999 | Kim ............................ 327/309 |
| 5,930,893 A | | 8/1999 | Eaton ....................... 29/890.03 |
| 6,034,430 A | | 3/2000 | Hambergen et al. ........ 257/722 |
| 6,057,601 A | | 5/2000 | Lau et al. .................... 257/758 |
| 6,057,717 A | * | 5/2000 | Kawano et al. ............. 327/112 |
| 6,078,197 A | * | 6/2000 | Kawano ...................... 327/108 |
| 6,269,042 B1 | * | 7/2001 | Kawano et al. ............... 326/81 |
| 6,307,421 B1 | * | 10/2001 | Kawano et al. ............. 327/333 |
| 6,326,835 B1 | * | 12/2001 | Kawano ..................... 327/537 |

FOREIGN PATENT DOCUMENTS

| WO | WO 9429961 | 12/1994 |
|---|---|---|

OTHER PUBLICATIONS

Patent Abstracts of Japan vol. 015, No. 419 (E–1126), Oct. 24, 1991 & JP03 175727 A (NEC Corp), Jul. 30, 1991 *abstract*.

Patent Abstracts of Japan vol. 095, No. 006, Jul. 31, 1995 & JP 07 079150 A (NEC IC Microcomput Syst Ltd), Mar. 20, 1991 *abstract*.

* cited by examiner

Primary Examiner—Terry D. Cunningham
Assistant Examiner—Long Nguyen
(74) Attorney, Agent, or Firm—Volentine Francos, PLLC

(57) ABSTRACT

An output circuit that outputs a voltage signal to a circuit having a power supply higher than that of the output circuit, wherein the voltage signal quickly increases to the potential level of the power supply of the output circuit. An input/output circuit includes the output circuit, and an input circuit that receives a voltage signal from a circuit having a power supply higher than that of the output circuit, and forwards the voltage signal to a circuit having a power identical to that of the input circuit. The potential level of the forwarded signal is the voltage of the power supply of the input circuit.

10 Claims, 26 Drawing Sheets

OUTPUT CIRCUIT, INPUT CIRCUIT AND INPUT/OUTPUT CIRCUIT

This is a divisional application of application Ser. No. 09/541,430 filed Apr. 3, 2000, which is a divisional of patent application Ser. No. 09/049,146 filed on Mar. 27, 1998 now U.S. Pat. No. 6,057,717, which are hereby incorporated by reference in their entirety for all purposes.

FIELD OF THE INVENTION

This invention relates to output circuits, input circuits and input/output circuits which can be built-in in an integrated circuit or an IC. More specifically, this invention relates to a plurality of improvements developed for providing three independent groups of circuits which are allowed to be built-in in an IC.

The circuits belonging to the first group of this invention are output circuits each of which acts as an interface employable for outputting a voltage signal to an external circuit which works under a power supply of which the voltage is e.g. 5V which is higher than the voltage e.g. 3V which is the voltage of a power supply under which the output circuit works. The ultimate purpose of this invention is to provide output circuits which are possible to output such voltage signals quickly with a higher speed without consuming a large amount of electric power. More precisely, the output circuits belong to the first group of this invention are output circuits which are possible to increase the potential level of such an output signal at least to the level of the voltage e.g. 3V which is the voltage of a power supply employed in the output circuits, very quickly, without consuming a large amount of electric power.

The circuits belonging to the second group of this invention are input circuits each of which acts as an interface employable for receiving a voltage signal from an external circuit which works under a power supply of which the voltage is e.g. 5V which is higher than the voltage e.g. 3V which is the voltage of a power supply under which the input circuit works. The ultimate purpose of this invention is to provide input circuits which are possible to receive voltage signals of which the potential is higher than the voltage of a power supply employed in the input circuit and forward the voltage signals toward the next stage circuit in a voltage corresponding to the full amount of the voltage of a power supply employed in the input circuit. More precisely, the input circuits belonging to the second group of this invention are input circuits which are possible to forward a voltage signal having a sufficient potential level, with respect to the VIH rule, to the next stage circuit. More specifically, the input circuits belonging to the second group of this invention are input circuits which receive a voltage signal from a circuit which works under a power supply of which the voltage is higher than the voltage of a power supply under which the input circuits work and forward the voltage signal having a voltage of the full amount of the voltage of a power supply under which the input circuits work or $V_{DD}$, rather than ($V_{DD}$-$V_{th}$) to the next stage circuit.

The circuits belonging to the third group of this invention are input/output circuits each of which is convertible between an output circuit having an advantage referred to above and an input circuit having an advantage referred to above.

BACKGROUND OF THE INVENTION

An output circuit allowable to be built-in in an integrated circuit and which is available in the prior art and an input circuit allowable to be built-in in an integrated circuit and which is available in the prior art will be described below, referring to drawings.

Referring to FIGS. 1 and 2, an output circuit allowable to be built-in in an integrated circuit and which is available in the prior art has an open drain circuit consisting of an n channel normally on type field effect transistor (N101) connected a pull-up resister ($R_1$) through a "PAD" of the IC in which the output circuit is built-in. The pull-up resister ($R_1$) is arranged outside the IC and works under a power supply Vcc of e.g. 5V, despite the output circuit works under a power supply of e.g. 3V. The n channel normally on type field effect transistor (N101) has a function to reduce the voltage applied between the source and the drain of the n channel normally on type field effect transistor (N102). FIG. 2 shows that the voltage of the output signal very slowly increases up to the voltage of Vcc or 4V in this example, in excess of the voltage level of the voltage signal which is outputted from this output circuit and which is shown by (IN). It is noted that a very long time is required for transmission of a voltage signal having a potential level of e.g. 3V to an external circuit which works under a power supply of a higher voltage of e.g. 5V. Incidentally, it is noted the output circuit can be employed as the output circuit of an IC having a less amount of dielectric strength.

Referring to FIGS. 3 and 4, an input circuit allowable to be built-in in an integrated circuit and which is available in the prior art has an n channel normally on type field effect transistor (N100) which has a function to reduce the voltage of an input signal which is inputted through a "PAD" of the IC and which has a voltage range of zero through 5V to a voltage range ranging from zero to the voltage difference between the $V_{DD}$ voltage or the power supply voltage of circuit and the threshold voltage of the n channel normally on type field effect transistor (N100), before forwarding the input signal to the next stage circuit produced the IC. Therefore, the input circuit can be employed for an integrated circuit having a less amount of dielectric strength. The threshold voltage of the IC is designed to be less than that of the ordinary input circuit. In the drawing, "PAD" means the bonding pad for the input circuit. FIG. 4 shows the voltage of an input signal received at an input terminal (IN) is reduced to the potential level of the node (Y), before being applied to an amplifier and forwarded to the next stage circuit.

In the first place, referring to FIG. 2, the output signal outputted from the output circuit illustrated in FIG. 1 increases at a rate determined by a time constant which is further determined by the amount of the pull-up resister ($R_1$). This means that if a high operation speed is required, a less amount of the pull-up resister ($R_1$) is required. If the amount of the pull-up resister ($R_1$) is made less, the power consumption increases accordingly, vice versa.

This is a drawback inevitably involved with the foregoing output circuit available in the prior art, described referring to FIGS. 1 and 2.

In the second place, supposing the power supply voltage of the input circuit illustrated in FIG. 3 or the $V_{DD}$ is 3V, an input signal of 5V inputted into the input circuit through the "PAD" is reduced to a value which is $V_{DD}$ less the threshold voltage of the n channel normally on type field effect transistor (N100), ($V_{DD}$-$V_{th}$) or approximately 2.3V, before being applied to the node (Y). Accordingly, it is not easy for such an input circuit to satisfy the requirement of VIH, which is a regulation inspecting whether or not an "H" level voltage issued by an input circuit has a sufficient amount of margin with respect to the threshold value of the internal circuit of the input circuit.

This is a drawback inevitably involved with the foregoing input circuit available in the prior art, described referring to FIGS. 3 and 4.

OBJECTS AND SUMMARY OF THE INVENTION

Accordingly, an object of this invention is to provide output circuits which are allowed to be built-in in an integrated circuit and which can output voltage signals into an external circuit which works under a power supply of which the voltage is higher than the voltage of a power supply under which the output circuits work, with a higher operation rate and without consuming a large amount of electric power.

Another object of this invention is to provide input circuits which are allowed to be built-in in an integrated circuit and which can receive input voltage signals from an external circuit which works under a power supply of which the voltage is higher than the voltage of a power supply under which the input circuits work, and to forward the input signals to the next stage circuit, in the voltage corresponding to the full amount of the voltage of a power supply under which the input circuits work, or voltage signals sufficiently high with respect to the VIH rule (voltage signals having a voltage high enough to remain a sufficient amount of margin stipulated in the VIH rule.).

A further object of this invention is to provide input/output circuits which are allowed to be built-in in an integrated circuit and which are convertible between output circuits which can output voltage signals into an external circuit which works under a power supply of which the voltage is higher than the voltage of a power supply under which the output circuits work, with a higher operation rate and without consuming a large amount of electric power and input circuits which can receive input voltage signals from an external circuit which works under a power supply of which the voltage is higher than the voltage of a power supply under which the input circuits work, and to forward the inputted signals to the next stage circuit, in the voltage corresponding to the full amount of the voltage of a power supply under which the input circuits work, or voltage signals sufficiently high with respect to the VIH rule (voltage signals having a voltage high enough to remain a sufficient amount of margin stipulated in the VIH rule.).

An output circuit (This corresponds to claim 1.) in accordance with the first embodiment of this invention described referring to FIG. 5 is defined as:

an output circuit comprising:

a first normally off type field effect transistor (($P_1$) of FIG. 5) having a channel of one conductivity, having a gate connected a first node, having a first electrode connected a first power supply and having a second electrode connected a second node, a second normally off type field effect transistor (($P_2$) of FIG. 5) having a channel of one conductivity, having a gate connected a third node, having a first electrode connected the second node, having a second electrode connected a fourth node and having a substrate connected a fifth node which is floating, a third normally off type field effect transistor (($P_4$) of FIG. 5) having a channel of one conductivity, having a gate connected a sixth node, having a first electrode connected the third node, having a second electrode connected the fourth node and having a substrate connected the fifth node, a fourth normally off type field effect transistor (($N_3$) of FIG. 5) having a channel of the opposite conductivity, having a gate connected the sixth node, having a first electrode connected the third node and having a second electrode connected a second power supply, and an inverter means having an input terminal connected the fourth node and an output terminal connected the sixth node.

Three modifications stem from the foregoing output circuit defined in claim 1.

The first modification (This corresponds to claim 3.) is the output circuit defined in claim 1 to which a fifth normally off type field effect transistor (($P_3$) of FIG. 3) having a channel of one conductivity having a gate connected the third node, having a first electrode connected the second node, having a second electrode connected the fifth node, and having a substrate connected the fifth node, is newly introduced.

The second modification (This corresponds to claim 4.) is the output circuit defined in claim 1 to which a sixth normally off type field effect transistor (($P_5$) of FIG. 3) having a channel of one conductivity having a gate connected the first power supply, having a first electrode connected the second node, having a second electrode connected the firth node and having a substrate connected the fifth node, is newly introduced.

The third modification (This corresponds to claim 5.) is the output circuit defined in claim 1 to which:

a first input terminal connected the first node, a second input terminal connected a seventh node, an output terminal connected the fourth node, and a seventh normally off type field effect transistor (($N_1$) of FIG. 3) having a channel of the opposite conductivity having a gate connected the seventh node, having a first electrode connected said second power supply and having a second electrode connected the fourth node, are newly introduced.

An input circuit (This corresponds to claim 2.) in accordance with the second embodiment of this invention described referring to FIG. 7, is the output circuit defined in claim 1 to which a delay circuit connected between the gate of the third normally off type field effect transistor (($P_4$) of FIG. 5) having a channel of one conductivity and the gate of the fourth normally off type field effect transistor (($N_3$) of FIG. 3) having a channel of the opposite conductivity, is newly introduced.

An output circuit (This corresponds to claim 6.) in accordance with the third embodiment of this invention described referring to FIG. 9 is defined as:

an output circuit comprising:

a first normally off type field effect transistor (($P_1$) of FIG. 9) having a channel of one conductivity, having a gate connected a first node, having a first electrode connected a first power supply and having a second electrode connected a second node, a second normally off type field effect transistor (($P_2$) of FIG. 9) having a channel of one conductivity, having a gate connected a third node, having a first electrode connected the second node, having a second electrode connected a fourth node and having a substrate connected a fifth node which is floating, a third normally off type field effect transistor (($P_4$) of FIG. 9) having a channel of one conductivity, having a gate connected a sixth node, having a first electrode connected the third node, having a second electrode connected the fourth node and having a substrate connected the fifth node, a fourth normally off type field effect transistor (($N_7$) of FIG. 9) having a channel of the opposite conductivity, having a gate connected the first power supply, having a first electrode connected fourth node and having a second electrode connected a seventh node, a fifth normally off type field effect transistor (($P_7$) of FIG. 9) having a channel of one conductivity, having a gate connected the third node, having a first electrode connected the seventh node, having a second electrode connected the fourth node and a substrate connected the fifth node, an inverter means having an input terminal connected the seventh node and an output terminal connected an eighth node, a sixth normally off type field effect transistor (($N_3$) of FIG. 9) having a channel of the opposite conductivity, having a gate connected the eighth node, having a first electrode connected a second power supply and having a second electrode connected the sixth node, and a seventh normally off type field effect transistor (($N_7$) of FIG. 9) having a channel of the opposite conductivity, having a gate connected the first power supply, having a first electrode connected the sixth node and having a second electrode connected the third node.

Four modifications stem from the foregoing output circuit defined in claim 6.

The first modification (This corresponds to claim 7.) is the output circuit defined in claim 6 to which an eighth normally off type field effect transistor (($P_6$) of FIG. 9) having a channel of one conductivity, having a gate connected the first power supply, having a first electrode connected the first power supply, having a first electrode connected the first power supply and having a second electrode connected said seventh node, is newly introduced.

The second modification (This corresponds to claim 8.) is the output circuit defined in claim 6 to which a ninth normally off type field effect transistor (($P_3$) of FIG. 9) having a channel of one conductivity, having a gate connected the third node, having a first electrode connected the second node, having a second electrode connected the fifth node and having a substrate connected the fifth node, is newly introduced.

The third modification (This corresponds to claim 9.) is the output circuit defined in claim 6 to which a tenth normally off type field effect transistor (($P_5$) of FIG. 9) having a channel of one conductivity, having a gate connected the first power supply, having a first electrode connected the fourth node, having a second electrode connected the fifth node and having a substrate connected the fifth node, is newly introduced.

The fourth modification (This corresponds to claim 10.) is the output circuit defined in claim 6 to which:
a first input terminal connected the first node,
a second input terminal connected a ninth node,
an output terminal connected the fourth node,
an eleventh normally off type field effect transistor (($N_1$) of FIG. 9) having a channel of the opposite conductivity, having a gate connected the ninth node, having a first electrode connected the second power supply and having a second electrode connected a tenth node, and
a twelfth normally off type field effect transistor (($N_2$) of FIG. 9) having a channel of the opposite conductivity, having a gate connected the first power supply, having a first electrode connected the tenth node and having a second electrode connected the fourth node are newly introduced.

An output circuit (This corresponds to claim 11.) in accordance with the fourth embodiment of this invention described referring to FIG. 11 is defined as:

an output circuit comprising:
a first normally off type field effect transistor (($P_1$) of FIG. 11) having a channel of one conductivity, having a gate connected a first node, having a first electrode connected a first power supply and having a second electrode connected a second node, a second normally off type field effect transistor (($P_2$) of FIG. 11) having a channel of one conductivity, having a gate connected a third node, having a first electrode connected the second node, having a second electrode connected a fourth node and having a substrate connected a fifth node which is floating, a third normally off type field effect transistor (($P_4$) of FIG. 11) having a channel of one conductivity, having a gate connected a sixth node, having a first electrode connected the third node, having a second electrode connected the fourth node and having a substrate connected the fifth node, a fourth normally off type field effect transistor (($N_7$) of FIG. 11) having a channel of the opposite conductivity, having a gate connected the first power supply, having a first electrode connected the fourth node and having a second electrode connected a seventh node, a fifth normally off type field effect transistor (($P_7$) of FIG. 11) having a channel of one conductivity, having a gate connected the third node, having a first electrode connected the seventh node, having a second electrode connected the fourth node and having a substrate connected the fifth node, a NOR gate means having a first input terminal connected the seventh node, having a second input terminal connected an eighth node and an output terminal connected a ninth node, a sixth normally off type field effect transistor (($N_3$) of FIG. 11) having a channel of the opposite conductivity, having a gate connected the ninth node, having a first electrode connected a second power supply and having a second electrode connected a tenth node, a seventh normally off type field effect transistor (($N_4$) of FIG. 11) having a channel of the opposite conductivity, having a gate connected the first power supply, having a first electrode connected the tenth node and having a second electrode connected the third node, an eighth normally off type field effect transistor (($N_6$) of FIG. 11) having a channel of the opposite conductivity, having a gate connected the first power supply, having a first electrode connected the third node and having a second electrode connected an eleventh node, a ninth normally off type field effect transistor (($N_5$) of FIG. 11) having a channel of the opposite conductivity, having a gate connected the eighth node, having a first electrode connected the eleventh node and having a second electrode connected the first node, a tenth normally off type field effect transistor (($N_8$) of FIG. 11) having a channel of the opposite conductivity, having a gate connected a twelfth node, having a first electrode connected the tenth node and having a second electrode connected the sixth node, and an eleventh normally off type field effect transistor (($P_8$) of FIG. 11) having a channel of one conductivity, having a gate connected the twelfth node, having a first electrode connected the first power supply and having a second electrode connected the sixth node.

Four modifications stem from the foregoing output circuit defined in claim 11.

The first modification (This corresponds to claim 12.) is the output circuit defined in claim 11 to which a twelfth normally off type field effect transistor ($(P_3)$ of FIG. 11) having a channel of one conductivity, having a gate connected the first power supply, having a first electrode connected the first power supply and having a second electrode connected the seventh node, is newly introduced.

The second modification (This corresponds to claim 13.) is the output circuit defined in claim 11 to which a thirteenth normally off type field effect transistor ($(P_3)$ of FIG. 11) having a channel of one conductivity, having a gate connected the third node, having a first electrode connected the second node, having a second electrode connected the fifth node and having a substrate connected the fifth node
is newly introduced.

The third modification (This corresponds to claim 14.) is the output circuit defined in claim 11 to which a fourteenth normally off type field effect transistor ($(P_5)$ of FIG. 11) having a channel of one conductivity, having a gate connected the first power supply, having a first electrode connected the fourth node, having a second electrode connected the fifth node and having a substrate connected the fifth node
is newly introduced.

The fourth modification (This corresponds to claim 15.) is the output circuit defined in claim 11 to which:
a first input terminal connected the first node,
a second input terminal connected a thirteenth node,
a third input terminal connected the twelfth node,
a fourth input terminal connected the eighth node,
an output terminal connected said fourth node,
a fifteenth normally off type field effect transistor ($(N_1)$ of FIG. 11) having a channel of the opposite conductivity, having a gate connected the thirteenth node, having a first electrode connected the second power supply and having a second electrode connected a fourteenth node, and
a sixteenth normally off type field effect transistor ($(N_2)$ of FIG. 11) having a channel of the opposite conductivity, having a gate connected the first power supply, having a first electrode connected the fourteenth node and having a second electrode connected the fourth node
are newly introduced.

An input circuit (This corresponds to claim 16.) in accordance with the fifth embodiment of this invention described referring to FIG. 14 is defined as:
an input circuit comprising:
a first normally off type field effect transistor ($(P_1)$ of FIG. 14) having a channel of one conductivity, having a gate connected a first power supply, having a first electrode connected the first power supply and having a second electrode connected a first node,
a second normally off type field effect transistor ($(P_2)$ of FIG. 14) having a channel of one conductivity, having a gate connected a second node, having a first electrode connected the first node, having a second electrode connected a third node and having a substrate connected a fourth node which is floating,
a third normally off type field effect transistor ($(P_4)$ of FIG. 14) having a channel of one conductivity, having a gate connected the first power supply, having a first electrode connected the second node, having a second electrode connected the third node and having a substrate connected the fourth node,
a fourth normally off type field effect transistor ($(N_7)$ of FIG. 14) having a channel of the opposite conductivity, having a gate connected the first power supply, having a first electrode connected the third node and having a second electrode connected a fifth node,
a fifth normally off type field effect transistor ($(P_7)$ of FIG. 14) having a channel of one conductivity, having a gate connected the second node, having a first electrode connected the fifth node, having a second electrode connected the third node and having a substrate connected the fourth node,
an inverter means having an input terminal connected the fifth node and an output terminal connected a sixth node,
a sixth normally off type field effect transistor ($(N_3)$ of FIG. 14) having a channel of the opposite conductivity, having a gate connected the sixth node, having a first electrode connected a second power supply and having a second electrode connected a seventh node, and
a seventh normally off type field effect transistor ($(N_4)$ of FIG. 14) having a channel of the opposite conductivity, having a gate connected the first power supply, having a first electrode connected the seventh node and having a second electrode connected the second node.

A modification (This corresponds to claim 17.) stems from the foregoing input circuit defined in claim 16. The input circuit is the input circuit defined in claim 16 to which an eighth normally off type field effect transistor ($(P_6)$ of FIG. 14) having a channel of one conductivity, having a gate connected the first power supply, having a first electrode connected the first power supply and having a second electrode connected the fifth node, is newly introduced.

An input circuit (This corresponds to claim 18.) in accordance with the sixth embodiment of this invention described referring to FIG. 15 is the input circuit defined in claim 16 to which a ninth normally off type field effect transistor ($(P_{21})$ of FIG. 15) having a channel of one conductivity, having a gate connected said second power supply, having a first electrode connected said first power supply and having a second electrode connected said fifth node, is newly introduced.

An input circuit (This corresponds to claim 19.) in accordance with the seventh embodiment of this invention described referring to FIG. 16 is the input circuit defined in claim 16 to which a tenth normally off type field effect transistor ($(N_{21})$ of FIG. 16) having a channel of the opposite conductivity, having a gate connected the first power supply, having a first electrode connected the fifth node and having a second electrode connected the second power supply, is newly introduced.

An input circuit (This corresponds to claim 20.) in accordance with the eighth embodiment of this invention described referring to FIG. 17 is the input circuit defined in claim 16 to which:
an eleventh normally off type field effect transistor ($(N_{22})$ of FIG. 17) having a channel of the opposite conductivity, having a gate connected the first power supply, having a first electrode connected the third node and having a second electrode connected an eighth node, and
a twelfth normally off type field effect transistor ($(P_{22})$ of FIG. 17) having a channel of one conductivity, having a gate connected the eighth node, having a first electrode connected the first power supply, having a second electrode connected the third node and having a substrate connected the fourth node are newly introduced.

An input circuit (This corresponds to claim 21.) in accordance with the ninth embodiment of this invention described referring to FIG. 19 is the input circuit defined in claim 16 to which:
a thirteenth normally off type field effect transistor ($(N_{23})$ of FIG. 19) having a channel of the opposite conductivity, having a gate connected the first power supply, having a first electrode connected the second power supply and having a second electrode connected the eighth node, and
a fourteenth normally off type field effect transistor ($(N_{24})$ of FIG. 19) having a channel of the opposite conductivity, having a gate connected the first power supply, having a first electrode connected the eighth node and having a second electrode connected the third node
are newly introduced.

Three modifications stem from the input circuit defined in claim 16.

The first modification (This corresponds to claim 22.) is the input circuit defined in claim 16 to which a fifteenth normally off type field effect transistor (($P_3$) of FIG. 14) having a channel of one conductivity, having a gate connected the second power supply, having a first electrode connected the first node, having a second electrode connected the fourth node and having a substrate connected said fourth node, is newly introduced.

The second modification (This corresponds to claim 23.) is the input circuit defined in claim 16 to which a sixteenth normally off type field effect transistor (($P_5$) of FIG. 14) having a channel of one conductivity, having a gate connected the first power supply, having a first electrode connected the third node, having a second electrode connected the fourth node and having a substrate connected said fourth node, is newly introduced.

The third modification (This corresponds to claim 24.) is the input circuit defined in claim 16 to which:
an input terminal connected the third node,
an output terminal connected the fifth node,
a seventeenth normally off type field effect transistor (($N_1$) of FIG. 14) having a channel of the opposite conductivity, having a gate connected the second power supply, having a first electrode connected the second power supply and having a second electrode connected the eighth node, and
an eighteenth normally off type field effect transistor (($N_2$) of FIG. 14) having a channel of the opposite conductivity, having a gate connected the first power supply, having a first electrode connected the eighth node and having a second electrode connected the third node
are newly introduced.

An input circuit (This corresponds to claim 25.) in accordance with the tenth embodiment of this invention described referring to FIG. 20 is the input circuit defined in claim 24 to which a nineteenth normally off type field effect transistor (($N_{23}$) of FIG. 20) having a channel of the opposite conductivity, having a gate connected the first power supply, having a first electrode connected the eighth node and having a second electrode connected the second power supply, is newly introduced.

An input circuit (This corresponds to claim 26.) in accordance with the eleventh embodiment of this invention described referring to FIG. 21 is defined as:
an input circuit comprising:
an input terminal connected a first node,
a first normally off type field effect transistor (($P_{31}$) of FIG. 21) having a channel of one conductivity, having a gate connected the first node, having a first electrode connected a first power supply, having a second electrode connected a second node which is floating and having a substrate connected a second node which is floating,
a second normally off type field effect transistor (($P_{32}$) of FIG. 21) having a channel of one conductivity, having a gate connected the first power supply having a first electrode connected the first node, having a second electrode connected a third node and having a substrate connected the second node,
a load circuit means having a first terminal connected the third node and a second terminal connected the second power supply,
a third normally off type field effect transistor (($N_{37}$) of FIG. 21) having a channel of the opposite conductivity, having a gate connected the first power supply, having a first electrode connected the third node and having a second electrode connected a fourth node,
a comparator circuit means having an input terminal connected the fourth node and having an output terminal connected a fifth node, and
an output terminal connected the fifth node.

An input circuit (This corresponds to claim 27.) in accordance with the twelfth embodiment of this invention described referring to FIG. 24 is defined as:
an input circuit comprising:
an input terminal connected a first node,
a first normally off type field effect transistor (($P_{31}$) of FIG. 24) having a channel of one conductivity, having a gate connected the first node, having a first electrode connected a first power supply, having a second electrode which is floating and having a substrate connected a second node which is floating,
a second normally off type field effect transistor (($P_{32}$) of FIG. 24) having a channel of one conductivity, having a gate connected the first power supply, having a first electrode connected the first node, having a second electrode connected a third node and having a substrate connected the second node,
a load circuit means having a first terminal connected the third node and having a second terminal connected a second power supply,
a third normally off type field effect transistor (($N_{37}$) of FIG. 24) having a channel of the opposite conductivity, having a gate connected the first power supply, having a first electrode connected the third node and having a second electrode connected a fourth node,
a fourth normally off type field effect transistor (($N_{38}$) of FIG. 24) having a channel of the opposite conductivity, having a gate connected the fourth node, having a first electrode connected a fifth node and having a second electrode connected the second power supply,
a fifth normally off type field effect transistor (($P_{38}$) of FIG. 24) having a channel of one conductivity, having a gate connected the fourth node, having a first electrode connected a sixth node, having a second electrode connected the fifth node and having a substrate connected the sixth node,
an inverter means having an input terminal connected the fifth node and having an output terminal connected a seventh node,
a sixth normally off type field effect transistor (($P_{39}$) of FIG. 24) having a channel of one conductivity, having a gate connected the seventh node, having a first electrode connected the first power supply and having a second electrode connected the sixth node,
a seventh normally off type field effect transistor (($N_{39}$) of FIG. 24) having a channel of the opposite conductivity, having a gate connected the seventh node, having a first electrode connected the sixth node and having a second electrode connected the first power supply, and
an output terminal connected the seventh node.

An input/output circuit (This corresponds to claim 28.) can be produced by combining an output circuit defined by claim 15 and an input circuit defined by claim 26, and by connecting the third input terminal of the output circuit and the second output terminal of the input circuit, the first output terminal of the output circuit and an external circuit, and the fifth input terminal of the input circuit and the power supply of the external circuit.

An input/output circuit (This corresponds to claim 29.) can be produced by combining an output circuit defined by claim 15 and an input circuit defined by claim 27, and by connecting the third input terminal of the output circuit and the second output terminal of the input circuit, the first output terminal of the output circuit and an external circuit, and the fifth input terminal of the input circuit and the power supply of the external circuit.

An input/output circuit (This corresponds to claim 30.) in accordance with the thirteenth embodiment of this invention described referring to FIG. 26 is defined as:

an input/output circuit comprising:

a first normally off type field effect transistor (($P_1$) of FIG. 26) having a channel of one conductivity, having a gate connected a first node, having a first electrode connected a first power supply and a second electrode connected a second node, a second normally off type field effect transistor (($P_2$) of FIG. 26) having a channel of one conductivity, having a gate connected a third node, having a first electrode connected a second node, having a second electrode connected a fourth node and having a substrate connected a fifth node which is floating, a third normally off type field effect transistor (($P_4$) of FIG. 26) having a channel of one conductivity, having a gate connected the first power supply, having a first electrode connected the third node, having a second electrode connected the fourth node and having a substrate connected the fifth node, a fourth normally off type field effect transistor (($N_7$) of FIG. 26) having a channel of the opposite conductivity, having a gate connected the first power supply, having a first electrode connected the fourth node and having a second electrode connected a sixth node, a fifth normally off type field effect transistor (($P_7$) of FIG. 26) having a channel of one conductivity, having a gate connected the third node, having a first electrode connected the sixth node, having a second electrode connected the fourth node and having a substrate connected the fifth node, an inverter means having an input terminal connected the sixth node and having an output terminal connected a seventh node, a sixth normally off type field effect transistor (($N_3$) of FIG. 26) having a channel of the opposite conductivity, having a gate connected the seventh node, having a first electrode connected a second power supply and a second electrode connected an eighth node, a seventh normally off type field effect transistor (($N_4$) of FIG. 26) having a channel of the opposite conductivity, having a gate connected a ninth node, having a first electrode connected a eighth node and having a second electrode connected a tenth node, an eighth normally off type field effect transistor (($N_5$) of FIG. 26) having a channel of the opposite conductivity, having a gate connected an eleventh node, having a first electrode connected the tenth node and having a second electrode connected the first node, and a ninth normally off type field effect transistor (($N_9$) of FIG. 26) having a channel of the opposite conductivity, having a gate connected the first power supply, having a first electrode connected the tenth node and having a second electrode connected the third node.

Four modifications stem from the foregoing input/output circuit defined in claim 30.

The first modification (This corresponds to claim 31.) is the input/output circuit defined in claim 30 to which a tenth normally off type field effect transistor (($P_6$) of FIG. 26) having a channel of one conductivity, having a gate connected the first power supply, having a first electrode connected the first power supply and having a second electrode connected the sixth node, is newly introduced.

The second modification (This corresponds to claim 32.) is the input/output circuit defined in claim 30 to which an eleventh normally off type field effect transistor (($P_3$) of FIG. 26) having a channel of one conductivity, having a gate connected the third node, having a first electrode connected the second node, having a second electrode connected the fifth node, and having a substrate connected the fifth node, is newly introduced.

The third modification (This corresponds to claim 33.) is the input/output circuit defined in claim 30 to which a twelfth normally off type field effect transistor (($P_5$) of FIG. 26) having a channel of one conductivity, having a gate connected the first power supply, having a first electrode connected the fourth node, having a second electrode connected the fifth node and having a substrate connected the fifth node, is newly introduced.

The fourth modification (This corresponds to claim 34.) is the input/output circuit defined in claim 30 to which:

a first input terminal connected the first node,
a second input terminal connected the eleventh node,
a third input terminal connected the ninth node,
a fourth input terminal connected an eleventh node,
an output terminal connected the sixth node,
an input/output terminal connected the fourth node,
a thirteenth normally off type field effect transistor (($N_1$) of FIG. 26) having a channel of the opposite conductivity, having a gate connected the twelfth node, having a first electrode connected the second power supply and a second electrode connected a thirteenth node, and
a fourteenth normally off type field effect transistor (($N_2$) of FIG. 26) having a channel of the opposite conductivity, having a gate connected the first power supply, having a first electrode connected the thirteenth node and having a second electrode connected the fourth node are newly introduced.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS

First Embodiment

An output circuit having an advantage in which the rising rate of an output signal is large until it arrives at the voltage of the power supply employed in the output circuit, even if the resistance of a pull-up resister is large.

Figure 1:
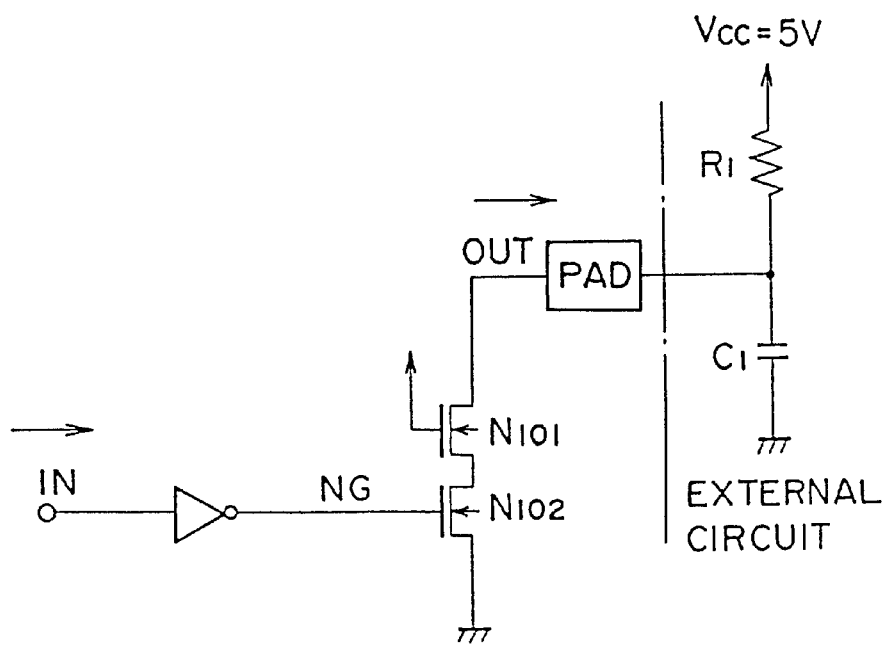
FIG. 1 is a circuit diagram of an output circuit available in the prior art.
Figure 2:
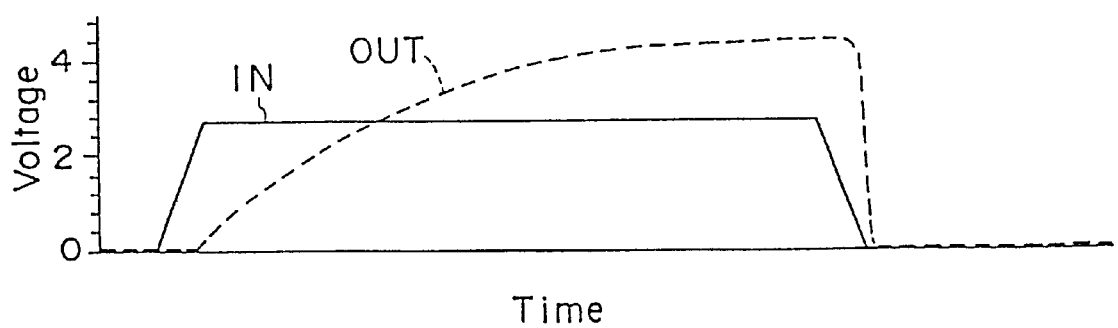
FIG. 2 is a timing chart illustrating the time-wise move of the potential at the input and output terminals.
Figure 3:
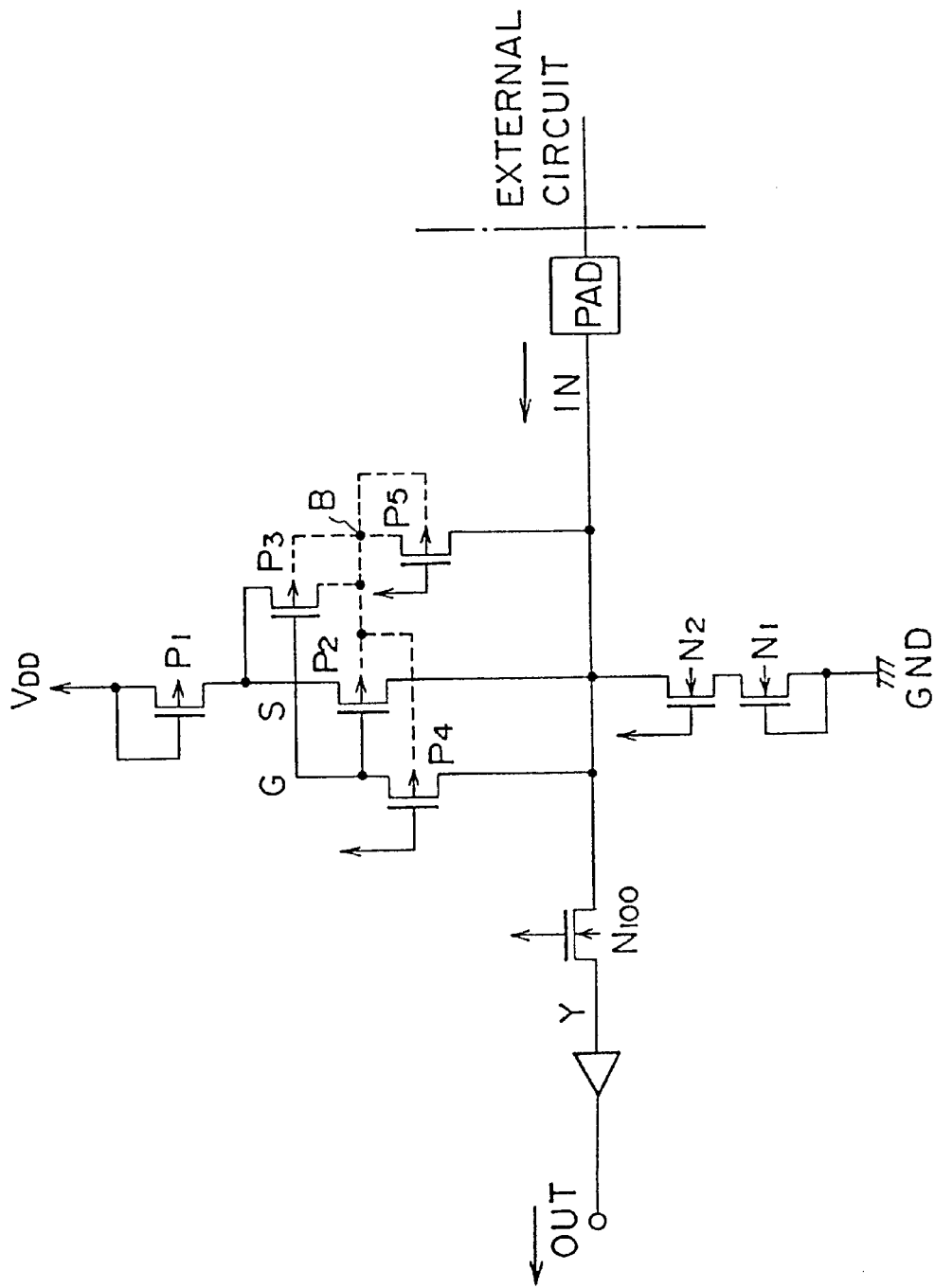
FIG. 3 is a circuit diagram of an input circuit available in the prior art.
Figure 4:
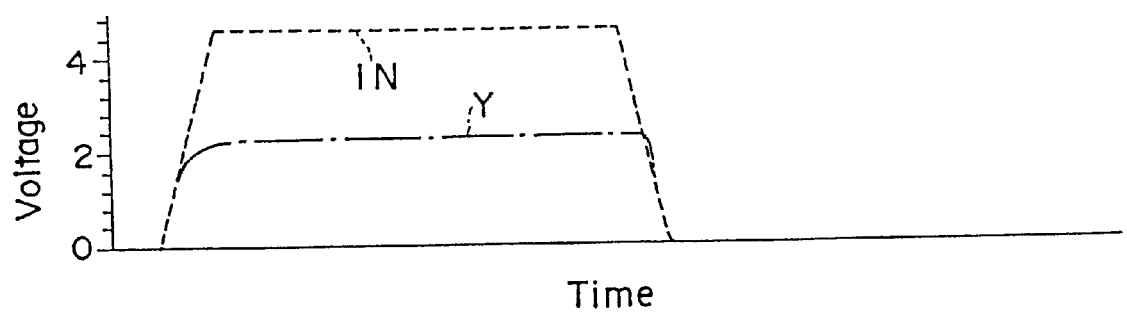
FIG. 4 is a timing chart illustrating the time-wise move of the potential at the input terminal and the node (Y)
Figure 5:
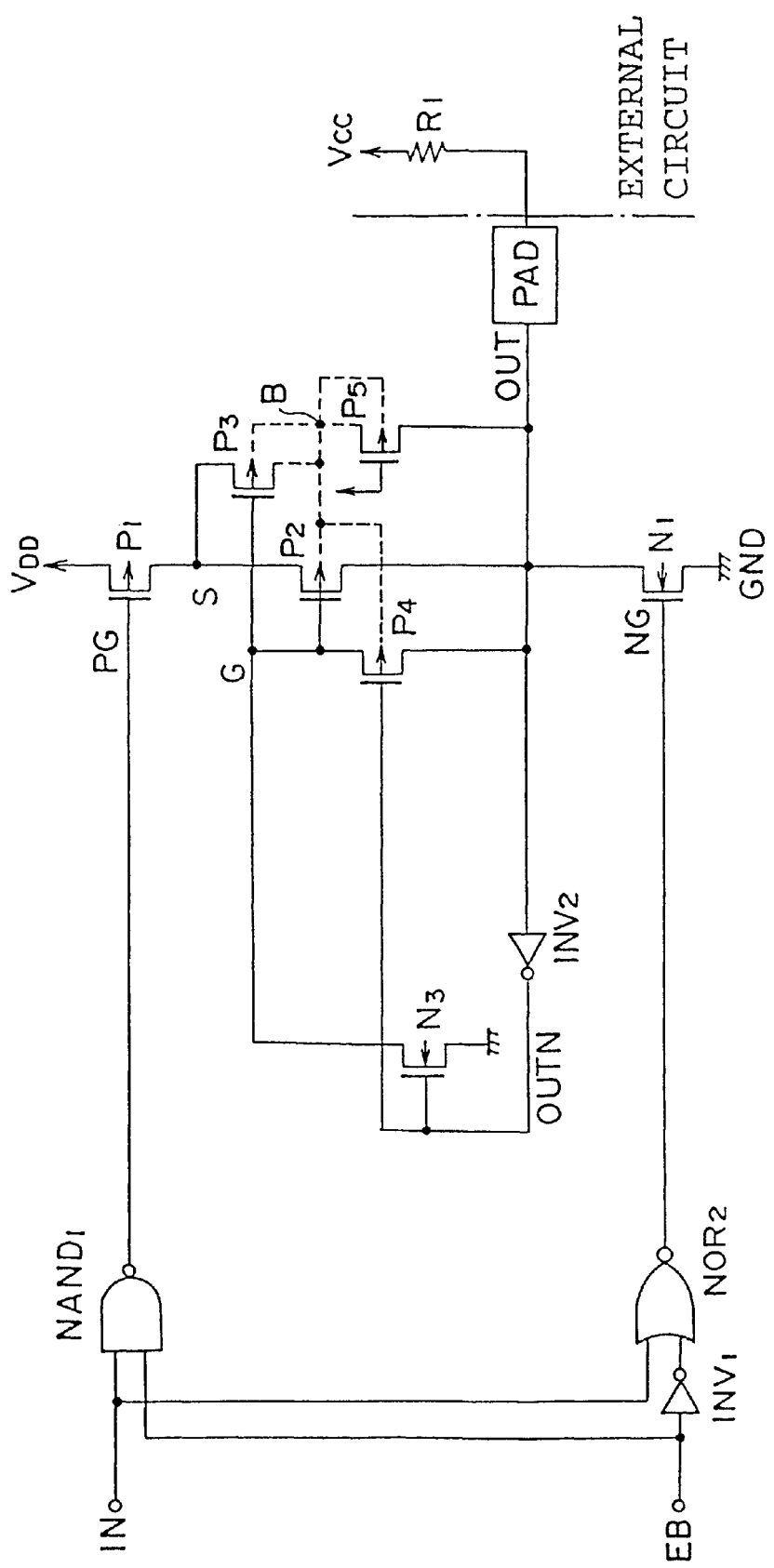
FIG. 5 is a circuit diagram of an output circuit in accordance with the first embodiment of this invention.

Referring to FIG. 5, an output circuit which is allowable to be built-in in an integrated circuit in accordance with the first embodiment of this invention is composed of an input terminal (IN), an enable input terminal (EB), an output terminal (OUT) arranged on a pad of the integrated circuit in which the output circuit is built-in, a NAND gate ($NAND_1$) having two input ports, a NOR gate ($NOR_2$) having two input ports, p channel normally off FETs ($P_1$) through ($P_5$), n channel normally off FETs ($N_1$) and ($N_3$) and inverters ($INV_1$) and ($INV_2$). The voltage of a power supply $V_{DD}$ is e.g. 3V. The output terminal (OUT) is a terminal through which a voltage signal is outputted out of the integrated circuit in which the output circuit is built-in toward an external circuit. One end of a pull-up resister arranged outside the integrated circuit is connected the output terminal (OUT). The function of the pull-up resister of which the other end is connected a power supply of the external circuit of which the power supply Vcc is e.g. 5V, is to pull-up the potential of the output terminal (OUT) to the voltage e.g. 5V.

The first input terminal of the NAND gate ($NAND_1$) is connected the input terminal (IN), and the second input terminal of the NAND gate ($NAND_1$) is connected the enable input terminal (EB), and the output terminal of the NAND gate ($NAND_1$) is connected an internal node (PG). The first input terminal of the NOR gate ($NOR_2$) is connected the input terminal (IN), and the second input terminal of the NOR gate (NOR$_2$) is connected the enable input terminal (EB) via the inverter (INV$_1$). The output terminal of the NOR gate (NOR$_2$) is connected an internal node (NG). The input terminal of the inverter (INV$_2$) is connected the output terminal (OUT), and the output terminal of the inverter (INV$_2$) is connected an internal node (OUTN).

The gate electrode of an n channel normally off FET (N$_1$) is connected the node (NG), the drain electrode of the n channel normally off FET (N$_1$) is connected the output terminal (OUT), and the source electrode of the n channel normally off FET (N$_1$) is connected the ground potential (GND). The gate electrode of the n channel normally off type FET (N$_3$) is connected the node (OUTN), the drain of the n channel normally off type FET (N$_3$) is connected the internal node (G), and the source electrode of the n channel normally off type FET (N$_3$) is connected the ground potential (GND).

The gate electrode of the p channel normally off FET (P$_1$) is connected the node (PG), the source electrode of the p channel normally off FET (P$_1$) is connected the internal power supply (V$_{DD}$) and the drain electrode of the p channel normally off FET (P$_1$) is connected an internal node (S). The gate electrode of a p channel normally off FET (P$_2$) is connected the node (G), the drain electrode of a p channel normally off FET (P$_2$) is connected the output terminal (OUT), and the source electrode of the p channel normally off FET (P$_2$) is connected the node (S). The gate electrode of a p channel normally off FET (P$_3$) is connected the node (G) and the source electrode of the p channel normally off FET (P$_3$) is connected the node (S). The gate electrode of a p channel normally off FET (P$_4$) is connected the node (OUTN), the drain electrode of the p channel normally off FET (P$_4$) is connected the node (G) and the source electrode of the p channel normally off FET (P$_4$) is connected the output terminal (OUT). The gate electrode of a p channel normally off FET (P$_5$) is connected the internal power supply (V$_{DD}$) and the source electrode of the p channel normally off FET (P$_5$) is connected the output terminal (OUT).

The p channel normally off FETs (P$_2$), (P$_3$), (P$_4$) and (P$_5$) are produced in one common n well (B) or a bulk (B) which is floating from the internal power supply (V$_{DD}$) and from the ground potential (GND). The drain electrodes of the p channel normally off FETs (P$_3$) and (P$_5$) are connected the floating bulk (B). The source of the p channel normally off FET (P$_1$) is connected the internal power supply (V$_{DD}$) and the sources of the n channel normally off FETs (N$_1$) and (N$_3$) are connected the ground potential (GND).

The drain electrode of the p channel normally off FET (P$_2$), the source electrodes of the p channel normally off FETs (P$_4$) and (P$_5$), the drain electrode of the n channel normally off FET (N$_1$) and the input terminal of the inverter (INV$_2$) are connected the output terminal (OUT). The gate electrodes of the p channel normally off FETs (P$_2$) and (P$_3$), the drain electrode of the p channel normally off FET (P$_4$) and the drain electrode of the n channel normally off FET (N$_3$) are connected the node (G). The drain electrode of the p channel normally off FET (P$_1$) and the source electrodes of the p channel normally off FETs (P$_2$) and (P$_3$) are connected the node (S). The output terminal of the inverter (INV$_2$) and the gate electrodes of the p channel normally off FET (P$_4$) and the n channel normally off FET (N$_3$) are connected the node (OUTN).

Supposing the enable input terminal (EB) is set to an "L" level or 0V, the operation of the output circuit in accordance with the first embodiment of this invention will be described below.

Referring to FIG. 5, regardless the polarity of a signal applied to the input terminal (IN), the output level of the NAND gate (NAND$_1$) or the potential of the node (PG) is "H" or e.g. 3V. As a result, the p channel normally off FET (P$_1$) is in an OFF position.

Since the output level of the inverter (INV$_1$) is "H", the output level of the NOR gate (NOR$_2$) or the potential of the node (NG) is "L", resultantly turning off the n channel normally off FET (N$_1$). In this manner, provided the enable input terminal (EB) is set an "L" level, both the p channel normally off FET (P$_1$) and n channel normally off FET (N$_1$) are OFF and the impedance of the output terminal (OUT) is high, regardless the potential level of the input terminal (IN). Thus the potential level of the output terminal (OUT) is identical to the potential level of the external power supply (Vcc) or 5V, due to the external pull-up resister (R$_1$).

Since the potential level of the output terminal (OUT) is "H" or 5V, the output level of the inverter (INV$_2$) or the potential level of the node (OUTN) is "L". As a result, the n channel normally off FET (N$_3$) is OFF. Since the potential level of the node (OUTN) is "L", and since the potential level of the output terminal (OUT) is 5V, the p channel normally off FET (P$_4$) is ON. As a result, the potential level of the node (G) is identical to the potential level of the output terminal (OUT) or 5V. Since the potential level of the output terminal (OUT) is 5V, the p channel normally off FET (P$_5$) is ON, because the source thereof is connected the output terminal (OUT) of which the potential level is 5V and because the gate thereof is connected the internal power supply (V$_{DD}$) which is 3V. As a result, the potential level of a floating bulk (B) is identical to the potential level of the output terminal (OUT) or 5V.

Since the potential level of both the output terminal (OUT) and of the node (G) is 5V, the p channel normally off FET (P$_2$) is OFF. Since the potential level of both the output terminal (OUT) and of the floating bulk (B) is 5V, the p channel normally off FET (P$_3$) is OFF.

Since the p channel normally off FETs (P$_2$) and (P$_3$) are OFF, the impedance level of the drain electrode of the p channel normally off FET (P$_1$) or the node (S) is high. This prevents an electric current from flowing from the output terminal (OUT) toward the internal power supply (V$_{DD}$) through the node (S) and through the bulk of the p channel normally off FET (P$_1$). Since the floating bulk (B) is not connected the internal power supply (V$_{DD}$), no leak current is allowed to flow from the floating bulk (B) toward the internal power supply (V$_{DD}$) through the drain of the p channel normally off FET (P$_2$) and the sources of the p channel normally off FETs (P$_4$) and (P$_5$). Since the input terminal of the inverter (INV$_2$) is connected the gate of a MOS FET (not shown) constituting the inverter (INV$_2$), the impedance level thereof is high. The drain of the n channel normally off FET (N$_1$) and the bulk of the n channel normally off FET (N$_1$) are connected in a counter bias, the impedance level of the drain of the n channel normally off FET (N$_1$) is high. Therefore, no electric current is allowed to flow from the output terminal (OUT) toward the ground (GND).

Supposing the enable input terminal (EB) is set an "H" level or 3V, the operation of the output circuit in accordance with the first embodiment of this invention will be described below.

Referring to FIG. 5, provided an "L" level signal or 0V is applied to the input terminal (IN), the NAND gate (NAND$_1$) outputs an "H" level signal to make the potential level of the node (PG) an "H" level or 3V. As a result, the p channel normally off FET (P$_1$) is OFF. The NOR gate (NOR$_2$)

outputs an "H" level signal to make the potential level of the node (NG) an "H" level. As a result, the n channel normally off FET ($N_1$) is ON. As a result, the potential level of the output terminal (OUT) is "L" or 0V.

The potential level of the output terminal of the inverter ($INV_2$) or of the node (OUTN) is "H" or 3V. Since the potential level of the node (OUTN) is "H", the n channel normally off FET ($N_3$) is ON, and the p channel normally off FET ($P_4$) is OFF. Since the n channel normally off FET ($N_3$) is ON, the potential level of the node (G) is "L". Since the potential level of the output terminal (OUT) and of the node (G) is "L", the p channel normally off FET ($P_2$) is OFF. Since the potential level of the node (S) is less than the threshold value of the p channel normally off FET ($P_3$), the p channel normally off FET ($P_3$) is OFF. It is noted, however, provided the potential level of the output terminal (OUT) is "L" and provided the potential level of the node (S) is higher than the threshold value of the p channel normally off FETs ($P_2$) and ($P_3$), the p channel normally off FETs ($P_2$) and ($P_3$) turn on to decrease the potential level of the node (S) down to the threshold value of the p channel normally off FETs ($P_2$) and ($P_3$) and to finally turn on the p channel normally off FETs ($P_2$) and ($P_3$). Since the potential level of the output terminal (OUT) is "L", the p channel normally off FET ($P_5$) is OFF.

Provided an "H" level signal is applied to the input terminal (IN), the output level of the NAND gate ($NAND_1$) or the potential level of the node (PG) is shifted to "L", resultantly turning on the p channel normally off FET (Pi). The output level of the NOR gate ($NOR_2$) or the potential level of the node (NG) is shifted to "L" from "H", resultantly turning off the n channel normally off FET ($N_1$).

Since the p channel normally off FET ($P_1$) has turned on, the potential level of the node (S) is increased to the potential level of the internal power supply ($V_{DD}$) or 3V. Since the potential level of the node (G) is "L", the p channel normally off FETs ($P_2$) and ($P_3$) turn on. Since the p channel normally off FET ($P_2$) has turned on, the potential level of the output terminal (OUT) increases up to the level of the internal power supply ($V_{DD}$) or 3V. Since the p channel normally off FET ($P_3$) has turned on, the potential level of the floating bulk (B) increases up to the level of the internal power supply ($V_{DD}$) or 3V. The function of the p channel normally off FET ($P_3$) is to increase the potential level of the floating bulk (B) precisely up to the level of the internal power supply ($V_{DD}$) or 3V, resultantly securing the stable operation of the p channel normally off FET ($P_2$).

Since the potential level of the output terminal (OUT) has increased to the potential level of the internal power supply ($V_{DD}$) or 3V, the output potential of the inverter ($INV_2$) or the potential of the node (OUTN) shifts to an "L" level, resultantly turning off the n channel normally off FET ($N_3$) and turning on the p channel normally off FET ($P_4$). Since the p channel normally off FET ($P_4$) has turned on, the potential level of the node (G) shifts to an "H" level or the potential level of the output terminal (OUT). As a result, the p channel normally off FETs ($P_2$) and ($P_3$) turn off.

In the foregoing manner, the output terminal (OUT) is connected the external power supply (Vcc) or 5V. As a result, the potential of the node (G) increases to 5V, causing the p channel normally off FET ($P_5$) to turn on and the potential of the floating bulk (B) to shift to 5V.

In the foregoing manner, provided the potential level of the enable input terminal (EB) is "H", and provided the input terminal (IN) is inputted an "H" level signal, the p channel normally off FETs ($P_2$) and ($P_3$) are OFF, similarly to the case where the enable input terminal (EB) is "L". Since the impedance level of the p channel normally off FET ($P_1$) or the node (S) is high, no leak current flows to the internal power supply ($V_{DD}$) from the output terminal (OUT) through the node (S) and the bulk of the p channel normally off FET ($P_1$). Since the floating bulk (B) is not connected the internal power supply ($V_{DD}$), no leak current flows to the internal power supply ($V_{DD}$) from the floating bulk through the drain of the p channel normally off FET ($P_2$) and through the sources of p channel normally off FETs ($P_4$) and ($P_5$). Since the input terminal of the inverter ($INV_2$) is connected the gate of a MOS FET (not shown) constituting the inverter ($INV_2$), the impedance level thereof is high. Since the drain and the bulk of the n channel normally off FET ($N_1$) are applied a counter bias each other, the impedance level of the drain of the n channel normally off FET ($N_1$) is high as well. Accordingly, no leak current flows from the output terminal (OUT) to the ground (GND).

Figure 6A:
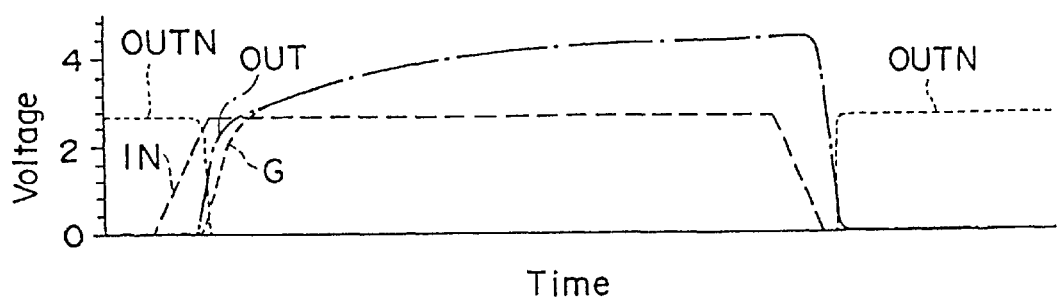
FIG. 6A is a timing chart illustrating the time-wise move of the potential of some terminals and nodes of an output circuit in accordance with the first embodiment of this invention.
Figure 6B:
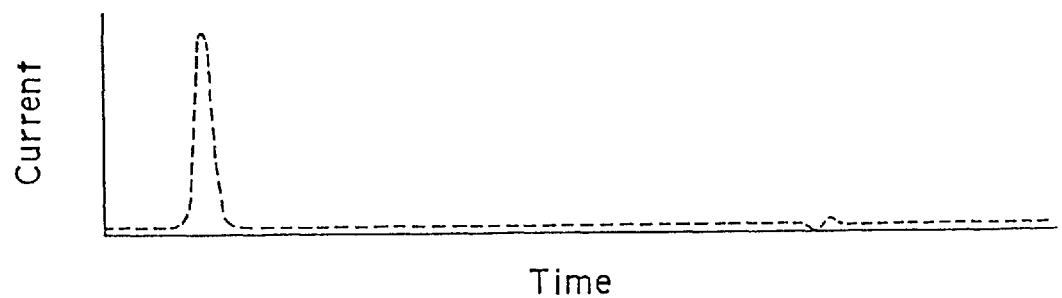
FIG. 6B is a timing chart illustrating the time-wise move of the current flowing in the power supply of an output circuit in accordance with the first embodiment of this invention.

Referring to FIGS. 6A and 6B, the potential of the output terminal (OUT) quickly rises up to the potential level of the internal power supply ($V_{DD}$), regardless the amount of the pull-up resister ($R_1$) arranged in the external circuit. This means that quick operation is allowed for the output circuit in accordance with the first embodiment of this invention, without decreasing the amount of the pull-up resister ($R_1$) arranged in the external circuit for the purpose to expedite the operation of the output circuit. Thereafter, however, the potential of the output terminal (OUT) continues increasing up to the potential level of the external power supply (Vcc) or 5V. As a result, no electric current flows toward the internal power supply ($V_{DD}$), excepting the period in which the output voltage rises up to the potential level of the internal power supply ($V_{DD}$). As a result, when being employed as an interface with an external circuit which works with a power supply of 5V, the output circuit in accordance with the first embodiment of this invention is allowed to work with a high speed until the output voltage rises up to the threshold voltage ($V_{th}$) of the external circuit or approximately 2.5V. As a result, the VIH of the external circuit or 3.5V can be guaranteed. It is particularly noted that although a reduction of the pull-up resister ($R_1$) was essential for an output circuit available in the prior art to enhance the operation speed and to decrease power consumption, a power consumption is decreased for the output circuit in accordance with the first embodiment of this invention, because a reduction of the pull-up resister ($R_1$) is unnecessary to enhance the operation speed.

It is needless to emphasize that 5V representing the voltage of an external circuit is an example and the first embodiment of this invention is allowed to be employed for all the cases where the external voltage is higher than the internal voltage.

The foregoing description has clarified that an output circuit having an advantage in which the rising rate of an output signal is large until it arrives at the voltage of the power supply employed in the output circuit, even if the resistance of a pull-up resister is large, has successfully been provided by the first embodiment of this invention.

Second Embodiment

An output circuit having an advantage in which the rising rate of an output signal is large until it arrives at the voltage of the power supply employed in the output circuit, even if the resistance of a pull-up resister is large, wherein a delay circuit is introduced, for the purpose to delay the time at which the p channel normally off FET ($P_2$) or the second MOS FET turns off and to shorten the time required for the potential of the output terminal (OUT) to increase up to the potential level of $V_{DD}$ or the potential of the first power supply, resultantly enhancing the operation speed of the output circuit.

Figure 7:
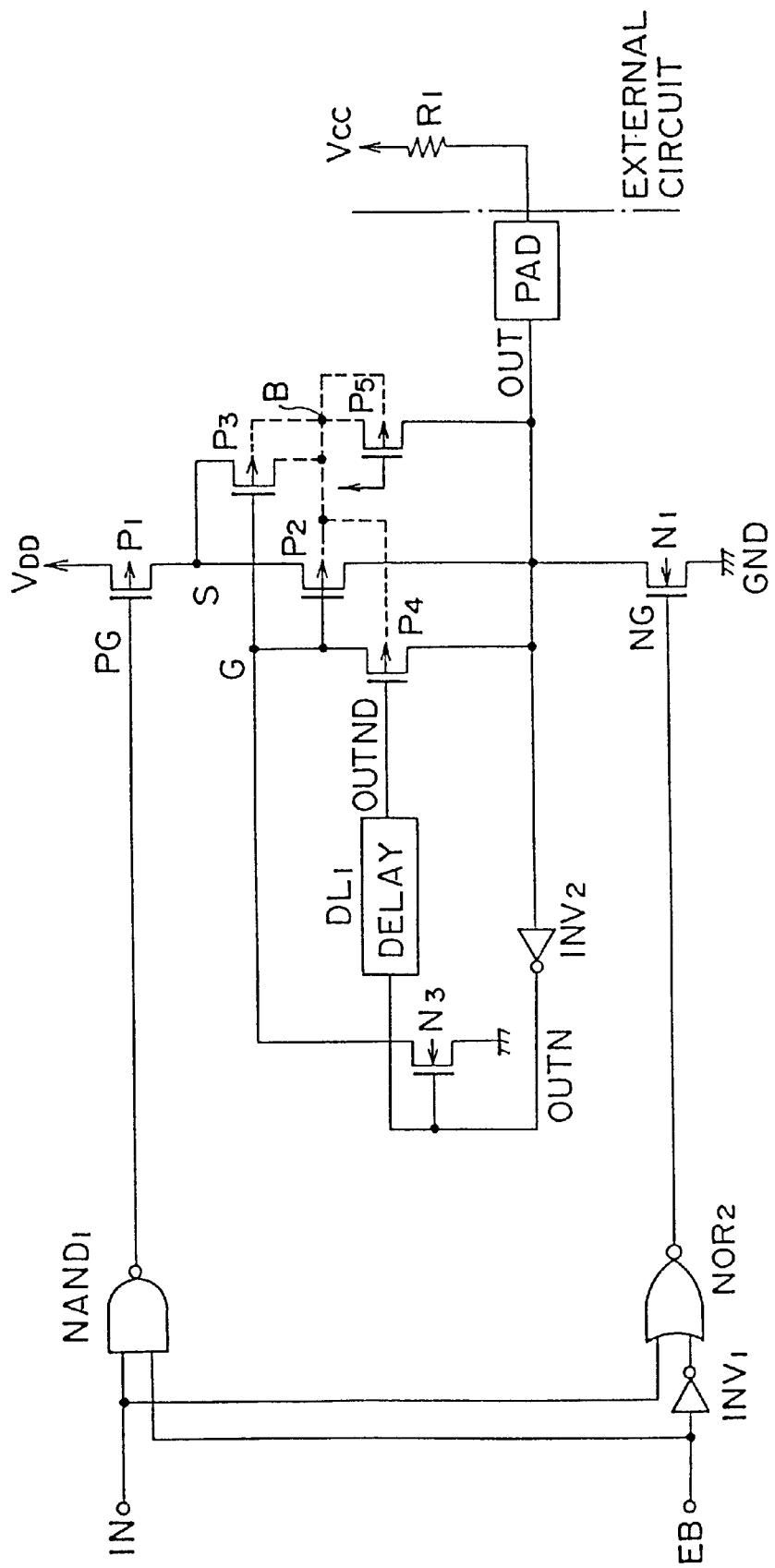
FIG. 7 is a circuit diagram of an output circuit in accordance with the second embodiment of this invention.

Referring to FIG. 7, an output circuit which is allowable to be built-in in an integrated circuit in accordance with the second embodiment of this invention is composed of an input terminal (IN), an enable input terminal (EB), an output terminal (OUT) arranged on a pad of the integrated circuit in which the output circuit is built-in, a NAND gate (NAND$_1$) having two input ports, a NOR gate (NOR$_2$) having two input ports, p channel normally off FETs (P$_1$) through (P$_5$), n channel normally off FETs (N$_1$) and (N$_3$), inverters (INV$_1$) and (INV$_2$) and a delay element (DL$_1$). A pull-up resister (R$_1$) arranged in an external circuit is connected the output terminal (OUT).

The circuit illustrated in FIG. 7 is the circuit illustrated in FIG. 5 to which a delay element (DL$_1$) is added between the node (OUTN) and the gate of the p channel normally off FET (P$_4$). As a result, the gate of the p channel normally off FET (P$_4$) is not connected the node (OUTN) but a node (OUTND).

The input terminal of the delay element (DL$_1$) is connected the node (OUTN), and the output terminal thereof is connected the node (OUTND). As a result, in response to a shift of the potential level of the node (OUTN) from "H" to "L", the delay element (DL$_1$) suspends the action to shift the potential level from "H" to "L" by the period set on the delay element (DL$_1$).

Although the operation of the output circuit illustrated in FIG. 7 is similar to that of the output circuit illustrated in FIG. 5, the operation is different from that of the output circuit illustrated in FIG. 5 for the operation to be conducted on the conditions that the enable input terminal (EB) is set at an "H" level and the potential level of the input signal of the input terminal (IN) is shifted from "L" to "H", as is described below.

Referring to FIG. 7, if the input signal applied to the input terminal (IN) is shifted from "L" to "H" to increase the potential level of the output terminal (OUT) up to the level of the internal power supply (V$_{DD}$) or 3V, the potential level of the output terminal of the inverter (INV$_2$) or of the node (OUTN) shifts from "H" to "L" to turn off the n channel normally off FET (N$_3$).

Figure 8A:
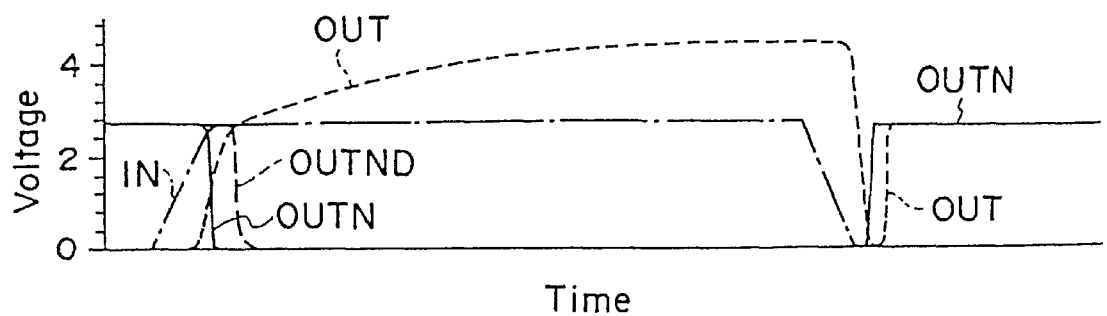
FIG. 8A is a timing chart illustrating the time-wise move of the potential of some terminals and nodes of an output circuit in accordance with the second embodiment of this invention.
Figure 8B:
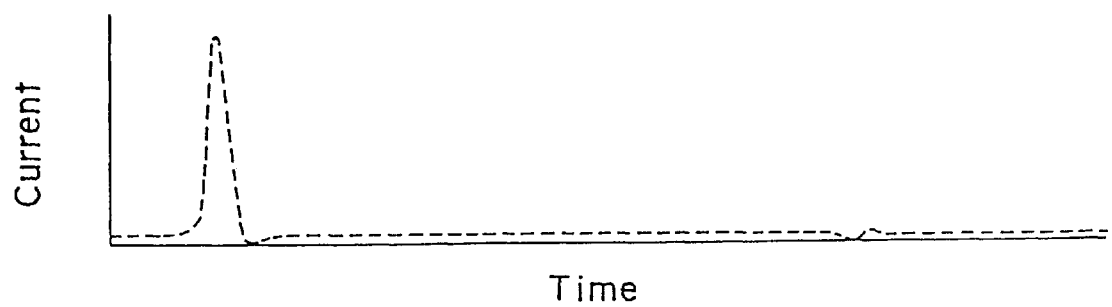
FIG. 8B is a timing chart illustrating the time-wise move of the current flowing in the power supply of an output circuit in accordance with the second embodiment of this invention.

Referring to FIGS. 8A and 8B, the delay element (DL$_1$) delays the transfer of the "L" level from the node (OUTN) to the node (OUTND) by a predetermined length of time. As a result, the p channel normally off FET (P$_4$) does not turn on simultaneously with the n channel normally off FET (N$_3$) but turns on at the time which is later than the time at which the potential level of the node (OUTN) is shifted to "L" by a predetermined length of time. This delays the time at which the p channel normally off FET (P$_4$) turns on and the time at which the p channel normally off FETs (P$_2$) and (P$_3$) turn off.

In the foregoing manner, the length of period in which the p channel normally off FET (P$_4$) is OFF is definitely prolonged, causing the adjustment procedure to be simple and easy. As a result, since the length of period in which the p channel normally off FET (P$_2$) is ON is prolonged, the operation speed of the output circuit in accordance with the second embodiment of this invention is further enhanced.

The foregoing description has clarified that an output circuit having an advantage in which the rising rate of an output signal is large until it arrives at the voltage of the power supply employed in the output circuit, even if the resistance of a pull-up resister is large, wherein the operation speed is further enhanced, has successfully been provided by the second embodiment of this invention.

Third Embodiment

An output circuit having an advantage in which the rising rate of an output signal is large until it arrives at the voltage of the power supply employed in the output circuit, even if the resistance of a pull-up resister is large, wherein a circuit construction in which the power supply voltage of the following stage is not applied between the source and the drain, between the gate and the source and between the gate and the drain of a MOS FET, is employed, whereby FETs which have a less amount of dielectric strength can be employed therefor.

Figure 9:
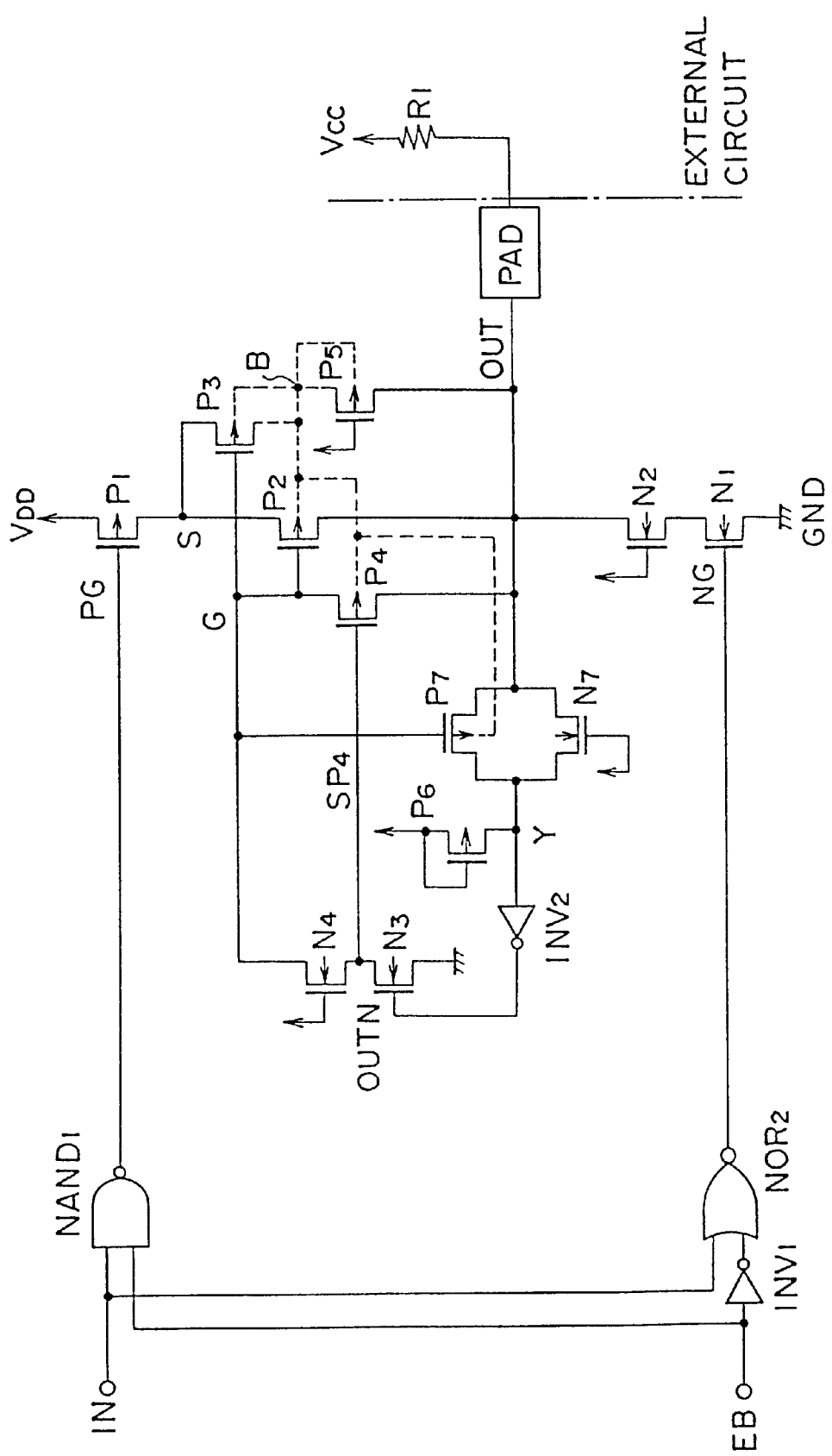
FIG. 9 is a circuit diagram of an output circuit in accordance with the third embodiment of this invention.

Refereeing to FIG. 9, an output circuit which is allowable to be built-in in an integrated circuit in accordance with the third embodiment of this invention is composed of an input terminal (IN), an enable input terminal (EB), an output terminal (OUT) arranged on a pad of the integrated circuit in which the output circuit is built-in, a NAND gate (NAND$_1$) having two input ports, a NOR gate (NOR$_2$) having two input ports, p channel normally off FETs (P$_1$) through (P$_7$), n channel normally off FETs (N$_1$) through (N$_4$) and (N$_7$), inverters (INV$_1$) and (INV$_2$). A pull-up resister (R$_1$) arranged in an external circuit is connected the output terminal (OUT).

The circuit illustrated in FIG. 9 is the circuit illustrated in FIG. 5 in which the connection of the gate of the p channel normally off FET (P$_4$) is moved from the node (OUTN) to the drain of the n channel normally off FET (N$_3$) and to which n channel normally off FETs (N$_2$), (N$_4$) and (N$_7$) and p channel normally off FETs (P$_6$) and (P$_7$) are newly introduced. A node defined by the connection point of the drain of the n channel normally off FET (N$_3$) and the gate of the p channel normally off FET (P$_4$) is named (SP$_4$).

The gate of the n channel normally off FET (N$_2$) is connected the internal power supply (V$_{DD}$), the drain of the n channel normally off FET (N$_2$) is connected the output terminal (OUT) and the source of the n channel normally off FET (N$_2$) is connected the drain of the n channel normally off FET (N$_1$). The drain of the n channel normally off FET (N$_3$) is not connected the output terminal (OUT). The gate of the n channel normally off FET (N$_4$) is connected the internal power supply (V$_{DD}$), the drain of the n channel normally off FET (N$_4$) is connected the node (G) and the source of the n channel normally off FET (N$_4$) is connected the node (SP$_4$). The drain of the n channel normally off FET (N$_3$) is not connected the node (G). A parallel circuit of the n channel normally off FET (N$_7$) and the p channel normally off FET (P$_7$) is connected between the output terminal (OUT) and the input terminal of the inverter (INV$_2$). The input terminal of the inverter (INV$_2$) is not connected the output terminal (OUT). A node connected the input terminal of the inverter (INV$_2$) is named (Y). The gate and the source of the p channel normally off FET (P$_6$) are connected the internal power supply (V$_{DD}$) and the drain of the p channel normally off FET (P$_6$) is connected the node (Y). The p channel normally off FET (P$_6$) connected in the foregoing manner stays in an OFF position, as long as the potential of the node (Y) is less than the internal power supply (V$_{DD}$).

The gate of the n channel normally off FET (N$_7$) is connected the internal power supply (V$_{DD}$), the first electrode (either drain or source) thereof is connected the output terminal (OUT) and the second electrode (either source or drain) thereof is connected the node (Y). The gate of the p channel normally off FET (P$_7$) is connected the node (G), the first electrode (either drain or source) thereof is connected the node (Y) and the second electrode (either source or drain) thereof is connected the output terminal (OUT).

The output terminal (OUT) is connected the drain of the p channel normally off FET (P$_2$), the sources of the p channel normally off FETs (P$_4$) and (P$_5$), the second electrode of the p channel normally off FET (P$_7$), the drain of the n channel normally off FET ($N_2$) and the first electrode of the n channel normally off FET ($N_7$). The node (G) is connected the gates of the p channel normally off FETs ($P_2$), ($P_3$) and ($P_7$), the drain of the p channel normally off FET ($P_4$) and the drain of the n channel normally off FET ($N_4$). The node (OUTN) is connected the output terminal of the inverter ($INV_2$) and the gate of the n channel normally off FET ($N_3$).

Supposing the enable input terminal (EB) is set to an "L" level or 0V, the operation of the output circuit in accordance with the third embodiment of this invention will be described below.

Referring to FIG. 9, regardless the polarity of the signal applied to the input terminal (IN), the output level of the NAND gate ($NAND_1$) or the potential of the node (PG) is "H" or e.g. 3V. As a result, the p channel normally off FET ($P_1$) is in an OFF position. Since the output potential of the NOR gate ($NOR_2$) or the potential level of the node (NG) is "L", regardless the polarity of the signal applied to the input terminal (IN), the n channel normally off FET ($N_1$) is in an OFF position. In this manner, as long as the enable input terminal (EB) is applied an "L" level signal, both the p channel normally off FET ($P_1$) and the n channel normally off FET ($N_1$) are in an OFF position. Thus, the impedance level of the output terminal (OUT) is high, regardless of the potential level of the input terminal (IN). The potential of the output terminal (OUT) is identical to that of the external power supply (Vcc) or 5V, because it is connected with the external power supply (Vcc) via the pull-up resister ($R_1$). Since the potential level of the output terminal (OUT) is 5V, the potential level of the node ($SP_4$) is not higher than ($V_{DD}$-$V_{th}$). Thus, the p channel normally off FET ($P_4$) is in an ON position. The potential level of the node (G) is identical to that of the output terminal (OUT) or 5V. Since the potential level of the output terminal (OUT) is 5V, the p channel normally off FET ($P_5$) is in an ON position, resultantly keeping the potential level of the floating bulk (B) at the potential level of the output terminal (OUT) or 5V. Since the potential level of the output terminal (OUT) and of the node (G) is 5V, the p channel normally off FET ($P_2$) is in an OFF position. Since the potential level of the output terminal (OUT) and of the floating bulk (B) is 5V, the p channel normally off FET ($P_3$) is in an OFF position as well.

Since the potential level of the output terminal (OUT) and of the node (G) is 5V, the p channel normally off FET ($P_7$) and the n channel normally off FET ($N_7$) are in an OFF position. Since the p channel normally off FET ($P_7$) has increased the potential level of the node (Y) up to 3V, before it turns off, the potential level of the node (Y) stays at 3V. Thus, the potential level of the output terminal of the inverter ($INV_2$) or of the node (OUTN) is "L", and the n channel normally off FET ($N_3$) is OFF. Since the potential level of the node (G) is 5V, the potential level of the source of the n channel normally off FET ($N_4$) or of the node ($SP_4$) is (5V-2$V_{th}$).

In the foregoing manner, provided the enable input terminal (EB) is set at an "L" level, the p channel normally off FETs ($P_2$) and ($P_3$) are OFF, the impedance level of the drain of the p channel normally off FET ($P_1$) or of the node (S) is high. Thus, no leak current flows to internal power supply ($V_{DD}$) from the output terminal (OUT) through the node (S) and through the bulk of the p channel normally off FET ($P_1$). Since the floating bulk (B) is not connected the internal power supply ($V_{DD}$), no leak current flows to the internal power supply ($V_{DD}$) from the floating bulk (B) through the drain of the p channel normally off FET ($P_2$) and through the sources of the p channel normally off FETs ($P_4$) and ($P_5$). Since the input terminal of the inverter ($INV_2$) is connected the gate of a MOS FET (not shown) constituting the inverter ($INV_2$), the impedance level thereof is high. Since the drain and the bulk of the n channel normally off FET ($N_1$) is applied a counter bias each other, the impedance level of the drain of the n channel normally off FET ($N_1$) is high. Thus, no leak current flows to the ground (GND) from the output terminal (OUT).

Supposing the enable input terminal (EB) is set to an "H" level or 3V, the operation of the output circuit in accordance with the third embodiment of this invention will be described below.

Referring to FIG. 9, provided an "L" level signal or 0V is applied to the input terminal (IN), the NAND gate ($NAND_1$) outputs an "H" level signal to turn off the p channel normally off FET ($P_1$). The NOR gate ($NOR_2$) outputs an "H" level signal to make the potential level of the node (NG) an "H" level. As a result, the n channel normally off FET ($N_1$) is ON. As a result, the potential level of the output terminal (OUT) is "L" or 0V.

Since the potential level of the output terminal (OUT) is "L", the n channel normally off FET ($N_7$) is ON, resultantly making the potential level of the node (Y) "L". Thus, the potential level of the output terminal of the inverter ($INV_2$) or of the node (OUTN) is "H" or 3V. Since the potential level of the node (OUTN) is "H", the n channel normally off FET ($N_3$) is ON, and the n channel normally off FET ($N_4$) is ON. Since the n channel normally off FETs ($N_3$) and ($N_4$) are ON, the potential level of the nodes (G) and ($SP_4$) is "L". Since the potential level of the node (G) and of the output terminal (OUT) is "L", the p channel normally off FETs ($P_2$), ($P_4$), ($P_5$) and ($P_7$) are OFF. Since the potential level of the node (S) is less than the $V_{th}$, the p channel normally off FET ($P_3$) is OFF as well.

Provided an "H" level signal is applied to the input terminal (IN), the output level of the NAND gate ($NAND_1$) or the potential level of the node (PG) is shifted to "L", resultantly turning on the p channel normally off FET ($P_1$). The output level of the NOR gate ($NOR_2$) or the potential level of the node (NG) is shifted to "L" from "H", resultantly turning off the n channel normally off FET ($N_1$).

Since the p channel normally off FET ($P_1$) has turned on, the potential level of the node (S) is increased to the potential level of the internal power supply ($V_{DD}$) or 3V. Since the potential level of the node (G) is "L", the p channel normally off FETs ($P_2$) and ($P_3$) turn on. Since the p channel normally off FET ($P_2$) has turned on, the potential level of the output terminal (OUT) increases up to the level of the internal power supply ($V_{DD}$) or 3V. Since the p channel normally off FET ($P_3$) has turned on, the potential level of the floating bulk (B) increases up to the level of the internal power supply ($V_{DD}$) or 3V.

Since the potential level of the output terminal (OUT) has increased to the $V_{th}$, the p channel normally off FET s ($P_4$) and ($P_7$) turn on. As a result, the potential level of the node (Y) becomes identical to the potential level of the output terminal (OUT). The potential level of the node (G) is clamped at an "L" level until the n channel normally off FET ($N_7$) turns off. An increase of the potential level of the output terminal (OUT) and of the node (G) up to that of the internal power supply or 3V shifts the potential level of the output terminal of the inverter ($INV_2$) or the node (OUTN) to an "L" level, resultantly turning off the n channel normally off FET ($N_3$). Since the n channel normally off FET ($N_3$) has turned on, the potential level of the node (G) becomes identical to that of the output terminal (OUT) or 3V, resultantly turning off the p channel normally off FET ($P_7$). The potential level of the node ($SP_4$) becomes (3V-$V_{th}$). Since the potential level of the node (G) becomes identical to that of the node (S), the p channel normally off FETs ($P_2$) and ($P_3$) turn off.

Thereafter, the potential level of the output terminal (OUT) increases up to the potential level of the external power supply (Vcc) or 5V, because it is connected the external power supply (Vcc) through the pull-up resister ($R_1$). The p channel normally off FET ($P_4$) stays in an ON position. When the potential of the output terminal (OUT) has increased up to ($3V+V_{th}$), the p channel normally off FET ($P_5$) turns on, resultantly causing the potential level of the floating bulk (B) to become identical to that of the output terminal (OUT). When the potential of the output terminal (OUT) has finally increased up to the level of the external power supply (Vcc) or 5V, the potential of the node (G) and of the floating bulk (B) becomes 5V. If the potential of the output terminal (OUT) has exceeded ($3V+V_{th}$), before the p channel normally off FET ($P_7$) turns off, the p channel normally off FET ($P_6$) turns on to clamp the potential of the output terminal (OUT) at the potential ($3V+V_{th}$).

In the foregoing manner, also under conditions that the enable input terminal (EB) is set at an "H" level and that the input terminal (IN) is applied an "H" level signal, the p channel normally off FETs ($P_2$) and ($P_3$) are OFF. As a result, no leak current flows into the internal power supply ($V_{DD}$) through the node (S) and the bulk of the p channel normally off FET ($P_1$). Since the floating bulk (B) is not connected the internal power supply ($V_{DD}$), no leak current flows from the floating bulk (B) to the internal power supply ($V_{DD}$). Incidentally, no leak current flows to the ground (GND) from the input terminal of the inverter ($INV_2$) and the drain of the n channel normally off FET ($N_1$).

Figure 10A:
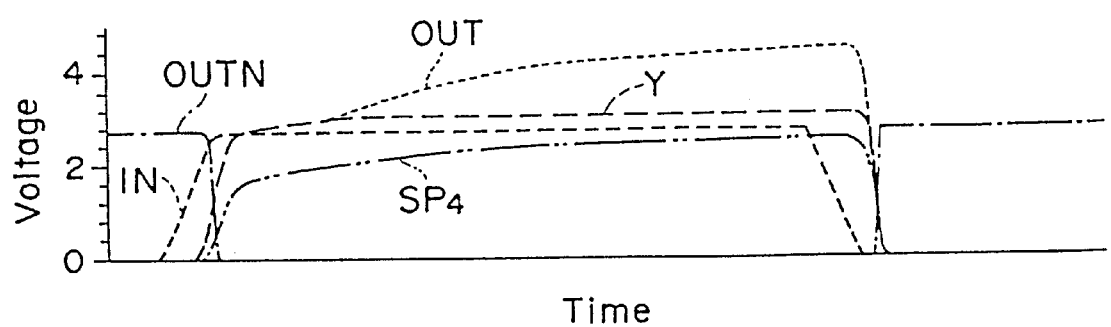
FIG. 10A is a timing chart illustrating the time-wise move of the potential of some terminals and nodes of an output circuit in accordance with the third embodiment of this invention.
Figure 10B:
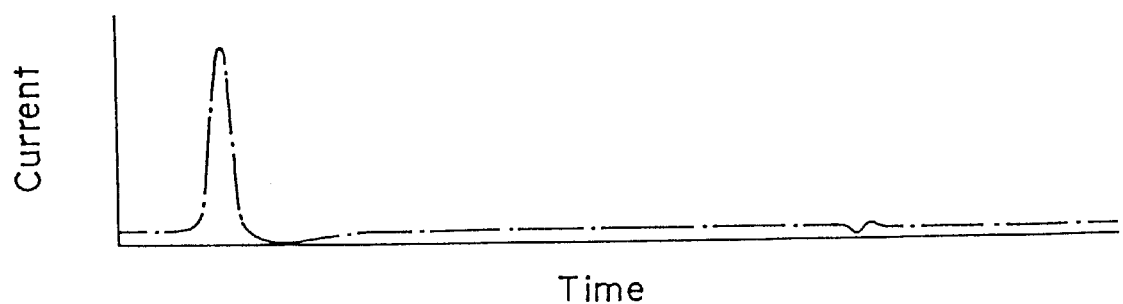
FIG. 10B is a timing chart illustrating the time-wise move of the current flowing in the power supply of an output circuit in accordance with the third embodiment of this invention.

Referring to FIGS. 10A and 10B, the rising rate of an output signal is large until it arrives at the voltage of the internal power supply, even if the resistance of a pull-up resister is large, and the power consumption is small, because the resistance of a pull-up resister is large.

The foregoing description has clarified that the third embodiment of this invention has successfully provided an output circuit having an advantage in which the rising rate of an output signal is large until it arrives at the voltage of the power supply employed in the output circuit, even if the resistance of a pull-up resister is large, and the power consumption is small, because the resistance of a pull-up resister is large, wherein a circuit construction in which the power supply voltage of the following stage is not applied between the source and the drain, between the gate and the source and between the gate and the drain of a MOS FET, is employed, whereby FETs which have a less amount of dielectric strength can be employed therefor.

Fourth Embodiment

An output circuit having an advantage in which the rising rate of an output signal is large until it arrives at the voltage of the power supply employed in the output circuit, even if the resistance of a pull-up resister is large, and the power consumption is small, because the resistance of a pull-up resister is large, wherein the output circuit has an additional advantage that the output circuit is allowed to interface either an external circuit which employs a power supply of which the potential level is identical to that of the output circuit or an external circuit which employs a power supply of which the potential level is different from that of the output circuit.

Figure 11:
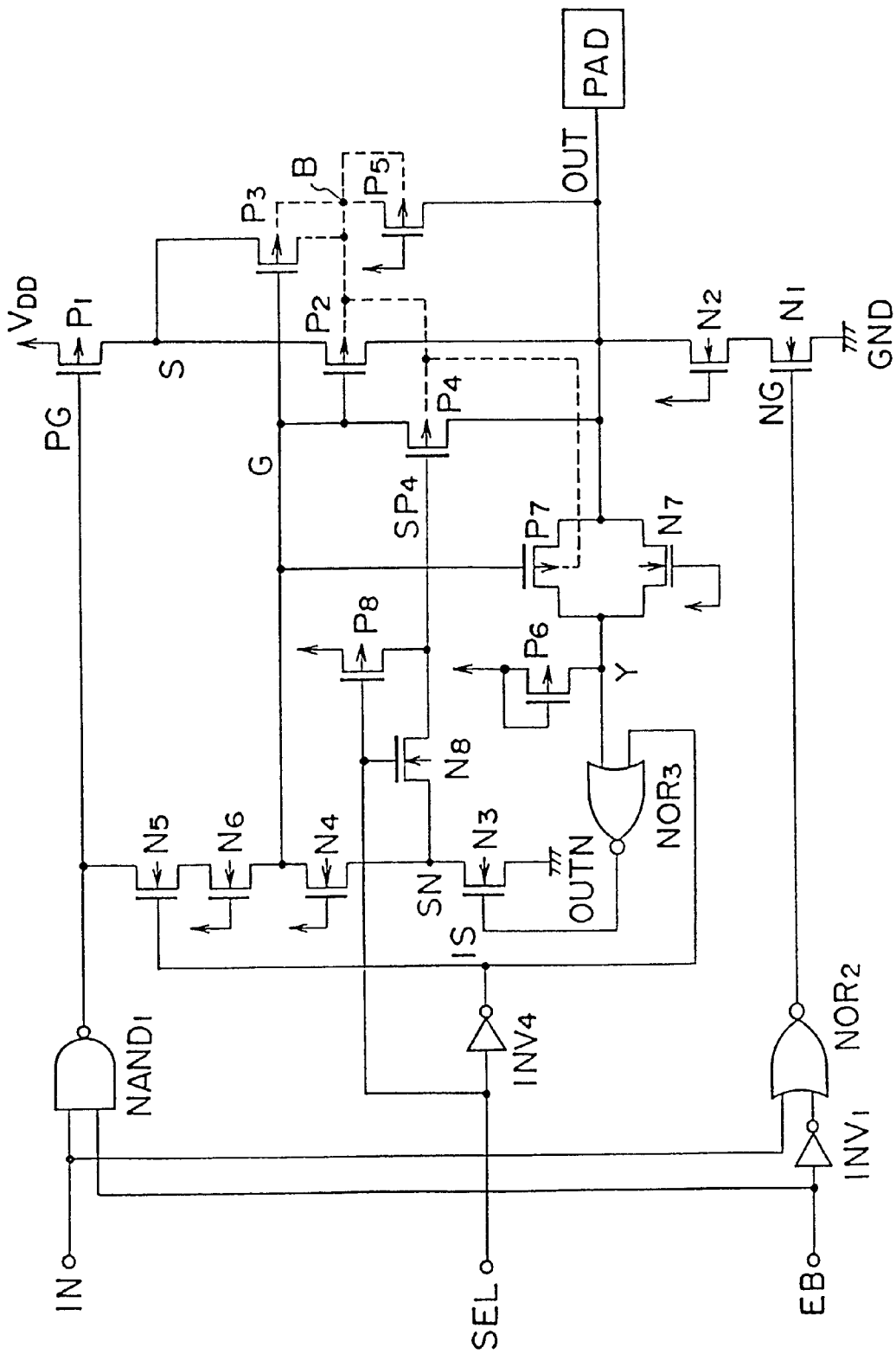
FIG. 11 is a circuit diagram of an output circuit in accordance with the fourth embodiment of this invention.

Referring to FIG. 11, an output circuit which is allowable to be built-in in an integrated circuit in accordance with the fourth embodiment of this invention is composed of an input terminal (IN), an enable input terminal (EB), an output terminal (OUT) arranged on a pad of the integrated circuit in which the output circuit is built-in, a NAND gate ($NAND_1$) having two input ports, NOR gates ($NOR_2$) and ($NOR_3$) having two input ports, p channel normally off FETs ($P_1$) through ($P_8$), n channel normally off FETs ($N_1$) through ($N_8$) and inverters ($INV_1$) and ($INV_4$). A pull-up resister is not necessarily employed for the output circuit.

The circuit illustrated in FIG. 11 is the circuit illustrated in FIG. 7 from which the inverter ($INV_2$) is removed and to which n channel normally off FETs ($N_5$), ($N_6$) and ($N_8$), a p channel normally off FET ($P_8$), a NAND gate ($NAND_2$) and an inverter ($INV_4$) are newly introduced. The input terminal of the inverter ($INV_4$) is connected a select input terminal (SEL), and the output terminal thereof is connected an internal node (IS). The first input terminal of the NOR gate ($NOR_3$) is connected the node (IS), the second input terminal thereof is connected the node (Y) and the output terminal thereof is connected the node (OUTN).

The gate of the n channel normally off FET ($N_5$) is connected the node (IS) and the drain thereof is connected the node (PG). The gate of the n channel normally off FET ($N_6$) is connected the internal power supply ($V_{DD}$), the drain thereof is connected the source of the n channel normally off FET ($N_5$) and the source thereof is connected the node (G).

The gate of the n channel normally off FET ($N_8$) is connected the select input terminal (SEL), the first terminal (the drain or the source) thereof is connected the node ($SP_4$) and the second terminal (the source or the drain) thereof is connected the internal node (SN). The drain of the n channel normally off FET ($N_3$) and the source of the n channel normally off FET ($N_4$) are not connected the node ($SP_4$) but the node (SN). The gate of the p channel normally off FET ($P_8$) is connected the select input terminal (SEL), the drain thereof is connected the node ($SP_4$) and the source thereof is connected the internal power supply ($V_{DD}$).

Figure 12A:
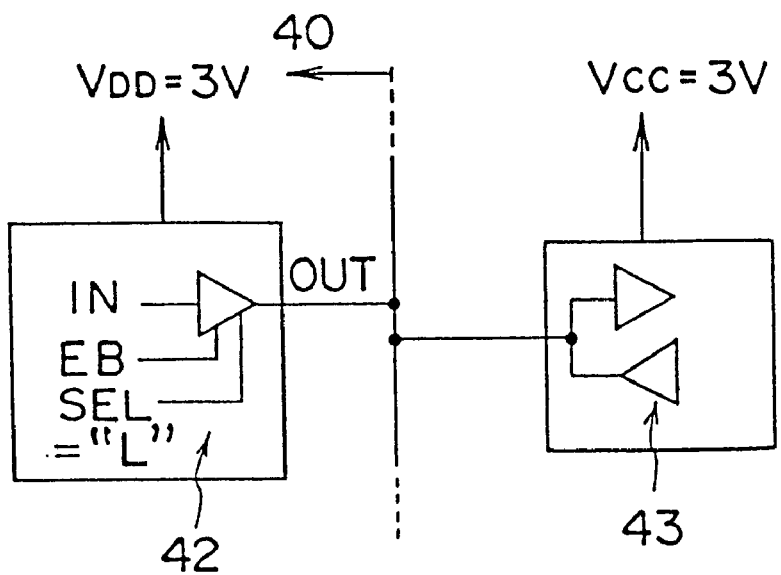
FIG. 12A is a block diagram illustrating a combination of an output circuit in accordance with the fourth embodiment of this invention and an external circuit working under a power supply of 3V.
Figure 12B:
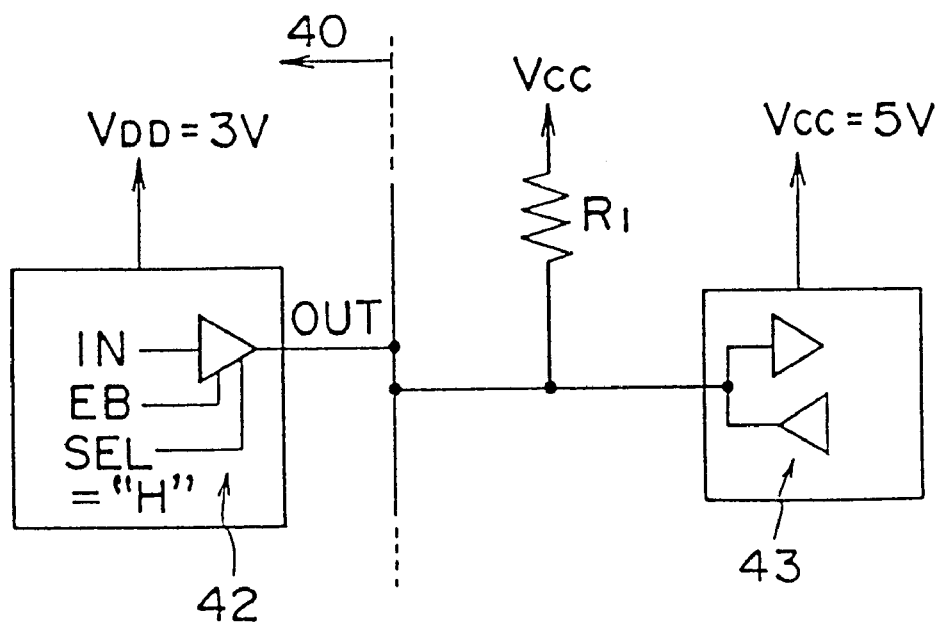
FIG. 12B is a block diagram illustrating a combination of an output circuit in accordance with the fourth embodiment of this invention and an external circuit working under a power supply of 5V.

FIGS. 12A and 12B are block diagrams illustrating a combination of an output circuit (42) in accordance with the fourth embodiment of this invention which is built-in in an integrated circuit (40) which works with a power supply of 3V and an external circuit (43) which works with an external power supply (Vcc). Referring to FIG. 12A, the voltage of the external power supply (Vcc) is 3V. Referring to FIG. 12B, the voltage of the external power supply (Vcc) is 5V, and the pull-up resister ($R_1$) is connected the output terminal (OUT) of the output circuit (42).

Referring again to FIG. 11, supposing the enable input terminal (EB) is set an "H" level or 3V, the operation of the output circuit in accordance with the fourth embodiment of this invention will be described below.

Firstly, the potential level of the select input terminal (SEL) is supposed to be set at an "L" level. In this case, the output circuit is connected the external circuit (43) as is illustrated in FIG. 12A. If the input terminal (IN) is applied an "L" level signal, the output potential of the NAND gate ($NAND_1$) or the potential level of the node (PG) becomes an "H" level. As a result, the p channel normally off FET ($P_1$) is turned off. The output potential of the NOR gate ($NOR_2$) or the potential level of the node (NG) becomes an "H" level. As a result, the n channel normally off FET ($N_1$) is turned on. As a result, the potential level of the output terminal (OUT) is in an "L" level.

Since the potential level of the output terminal (OUT) is "L", the n channel normally off FET ($N_7$) is ON. Thus, the potential level of the node (Y) is "L". Since the potential level of the node (IS) is "H", however, the output potential of the NOR gate ($NOR_3$) or the potential level of the node (OUTN) is "U", resultantly turning off the n channel normally off FET ($N_3$). Since the node (IS) is in an "H" level, the n channel normally off FET ($N_5$) is ON. Since the n channel normally off FETs ($N_4$) and ($N_6$) are ON and since the node (PG) is in an "H" level, the potential level of the node (G) is ($V_{DD}$-$V_{th}$). Since the select terminal (SEL) is inputted an "L" level signal, the n channel normally off FET ($N_8$) is OFF and the p channel normally off FET ($P_8$) is ON. Accordingly, the potential level of the node ($SP_4$) is identical to the internal power supply ($V_{DD}$) or 3V. Since the potential of the node (G) is ($V_{DD}$-$V_{th}$), and since the potential level of the output terminal (OUT) is in an "L" level, and since the potential of the node ($SP_4$) is 3V, the p channel normally off FETs ($P_2$), ($P_4$), ($P_5$) and ($P_7$) are OFF.

Thereafter, the input signal applied to the input terminal (IN) is shifted to an "H" level. Since this action shifts the output level of the NAND gate ($NAND_1$) or the potential level of the node (PG) to an "L" level, the p channel normally off FET ($P_1$) is turned on. Since the potential level of the NOR gate ($NOR_2$) or the potential level of the node (NG) shifts to "L", the n channel normally off FET ($N_1$) turns off.

Since the p channel normally off FET ($P_1$) has turned on, the potential of the node (S) becomes the potential level of the internal power supply ($V_{DD}$) or 3V. Since the potential level of the node (PG) becomes an "L" level, the potential level of the node (G) shifts from ($V_{DD}$-$V_{th}$) to an "L" level or 0V, turning on the p channel normally off FETs ($P_2$) and ($P_3$). Since the p channel normally off FET ($P_2$) has turned on, the potential level of the output terminal (OUT) increases to the potential level of the internal power supply ($V_{DD}$) or 3V. Since the p channel normally off FET ($P_3$) has turned on, the potential of the floating bulk (B) increases to the potential level of the internal power supply ($V_{DD}$) or 3V.

When the potential of the output terminal (OUT) has increased to the $V_{th}$, the p channel normally off FET ($P_7$) turns on to cause the potential of the node (Y) to become identical to the potential of the output terminal (OUT). The p channel normally off FET ($P_4$) stays at an OFF position.

Secondly, the potential level of the select input terminal (SEL) is supposed to be set at an "H" level. In this case, the output circuit is connected the external circuit (43) as is illustrated in FIG. 12B. If the input terminal (IN) is applied an "L" level signal, the output potential of the NAND gate ($NAND_1$) or the potential level of the node (PG) becomes an "H" level. As a result, the p channel normally off FET ($P_1$) is turned off. The output potential of the NOR gate ($NOR_2$) or the potential level of the node (NG) becomes an "H" level. As a result, the p channel normally off FET ($P_1$) is in an OFF position. The output potential of the NOR gate ($NOR_2$) or the potential level of the node (NG) is "H". As a result, the n channel normally off FET ($N_1$) is ON. Accordingly, the potential level of the output terminal (OUT) is in an "L" level or 0V.

Since the potential level of the output terminal (OUT) is "L", the n channel normally off FET ($N_7$) is ON, causing the potential level of the node (Y) to be an "L" level. Since an "H" level input signal has been applied the select input terminal (SEL), the potential level of the node (IS) is in an "L" level. Thus, the output level of the NOR gate (NOR3) or the potential level of the node (OUTN) becomes "H" to turn on the n channel normally off FET ($N_3$). Since the potential level of the node "IS" is in an "L" level, the n channel normally off FET (Ns) is always OFF. As a result, the potential level of the node (G) is "L". Since the potential level of the select input terminal (SEL) is "H", the n channel normally off FET ($N_8$) is ON, and the p channel normally off FET ($P_8$) is OFF. As a result, the potential level of the node ($SP_4$) is in an "L" level. Since the potential level of the node (G), the node (SP) and the output terminal (OUT) is "L" or 0V, the p channel normally off FETs ($P_2$), ($P_4$), ($P_5$) and ($P_7$) are OFF.

If the potential level of the input terminal (IN) is shifted to "H", the output potential of the NAND gate ($NAND_1$) or the potential level of the node (PG) is shifted to "L", resultantly turning on the p channel normally off FET ($P_1$). Since the output potential of the NOR gate ($NOR_2$) shifts to "L", the n channel normally off FET ($N_1$) turns off.

Since the p channel normally off FET ($P_1$) has turned on, the potential level of the node (S) is the level of the internal power supply ($V_{DD}$) or 3V. Since the potential level of the node (G) is "L", the p channel normally off FETs ($P_2$) and ($P_3$) turn on. The turning on of the p channel normally off FET ($P_2$) causes the potential level of the output terminal (OUT) to increase to the level of the internal power supply ($V_{DD}$) or 3V. The turning on of the p channel normally off FET ($P_3$) causes the potential level of the floating bulk (B) to the level of the internal power supply ($V_{DD}$) or 3V.

When the potential level of the output terminal (OUT) has increased to the $V_{th}$, the p channel normally off FETs ($P_4$) and ($P_7$) turn on to increase the potential level of the nodes (G) and (Y) to the level of the internal power supply ($V_{DD}$) or 3V. In spite of the increase of the potential level of the output terminal (OUT) and of the node (G) to the level of the internal power supply ($V_{DD}$) or 3V, the p channel normally off FET ($P_4$) stays in an ON position. The increase of the potential level of the node (G) to the level of the internal power supply ($V_{DD}$) or 3V causes the p channel normally off FET ($P_7$) to turn off and causes the p channel normally off FETs ($P_2$) and ($P_3$) to turn off, because the potential level of the node (G) becomes identical to that of the node (S).

Thereafter, the potential level of the output terminal (OUT) increases up to the level of the external power supply (Vcc) or 5V, because the output terminal (OUT) is connected the external power supply (Vcc) through the pull-up resister ($R_1$). The p channel normally off FET ($P_4$) stays in an ON position. When the potential level of the output terminal (OUT) has increased up to (3V+$V_{th}$), the p channel normally off FET ($P_5$) turns on to cause the potential level of the floating bulk (B) to the level of the internal power supply ($V_{DD}$) or 3V. And, when the potential level of the output terminal has increased to the level of the external power supply (Vcc) or 5V, the potential level of the node (G) and of the floating bulk (B) increases to the level of the external power supply (Vcc) or 5V.

Figure 13A:
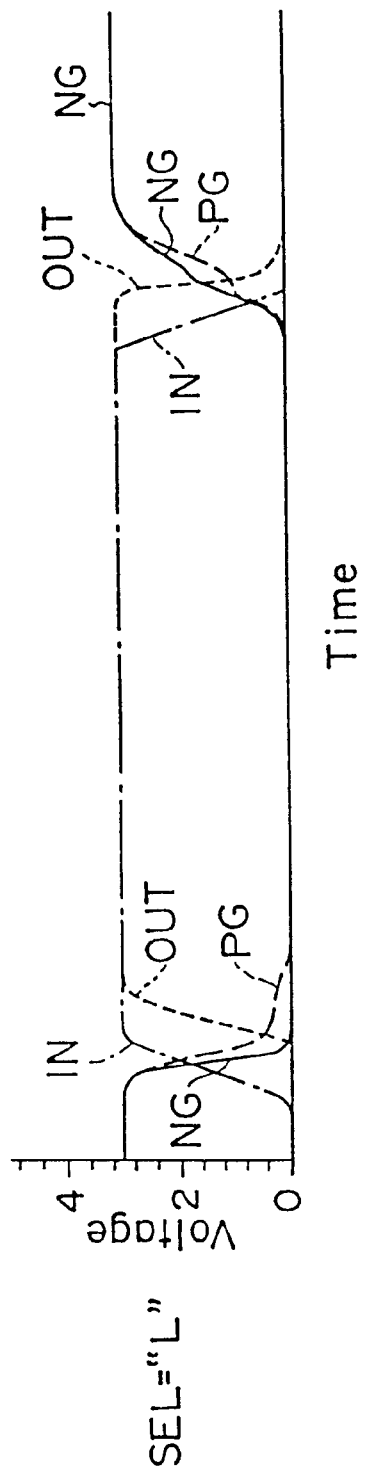
FIG. 13A is a timing chart illustrating the time-vise move of the potential of some terminals and nodes of an output circuit in accordance with the fourth embodiment of this invention, under a condition that the potential level of the SEL terminal is "L"
Figure 13B:
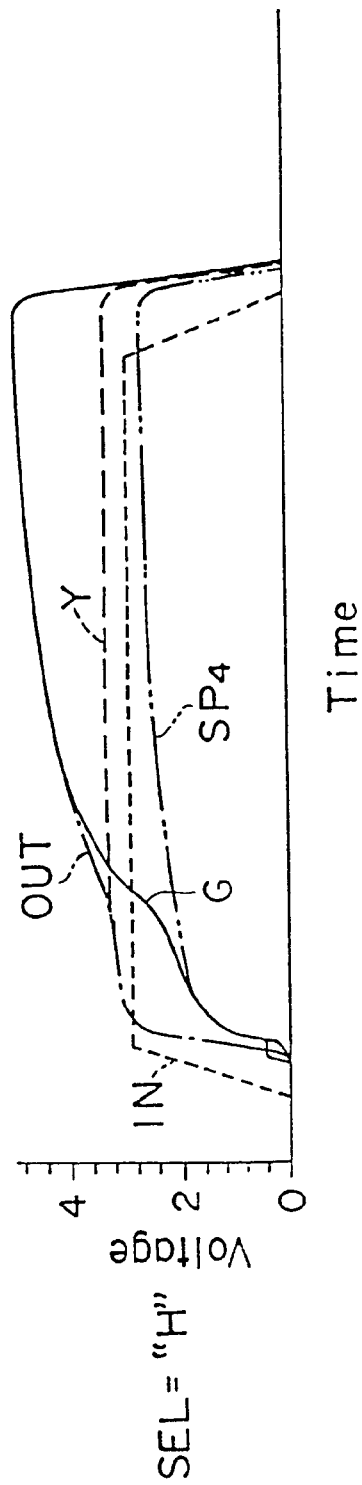
FIG. 13B is a timing chart illustrating the time-wise move of the potential of some terminals and nodes of an output circuit in accordance with the fourth embodiment of this invention, under a condition that the potential level of the SEL terminal is "H"

Referring to FIGS. 13A and 13B, the rising rate of an output signal is large until it arrives at the voltage of the internal power supply, even if the resistance of a pull-up resister is large. This is true both in the case where the output circuit is connected an external circuit which works under a power supply of 3V (See FIG. 13A.), provided the select input terminal (SEL) is applied an "L" level signal and in the case where the output circuit is connected an external circuit which works under a power supply of 5V (See FIG. 13B.), provided the select input terminal (SEL) is applied an "L" level signal.

In the foregoing manner, introduction of a select input terminal (SEL) enables the output circuit in accordance with the fourth embodiment of this invention to output an output signal of which the potential voltage is identical to the potential voltage of the power supply employed in an external circuit or 5V. Incidentally, it is noted that the output circuit can output an output signal of which the potential level is identical to the potential level of the internal power supply or 3V, without depending on a pull-up resister. In other words, as shown in FIGS. 12A and 12B, the output circuit is allowed to interface either an external circuit which employs a power supply of 3V or an external circuit which employs a power supply of 5V. Further, the signal to be applied to the select input terminal can be stemmed from either outside the output circuit or within the output circuit.

The foregoing description has clarified that the fourth embodiment of this invention has successfully provided an output circuit having an advantage in which the rising rate of an output signal is large until it arrives at the voltage of the power supply employed in the output circuit, even if the resistance of a pull-up resister is large, wherein the output circuit has an additional advantage that the output circuit is allowed to interface either an external circuit which employs a power supply of which the potential level is identical to that of the output circuit or an external circuit which employs a power supply of which the potential level is different from that of the output circuit.

Fifth Embodiment

An input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit.

Figure 14:
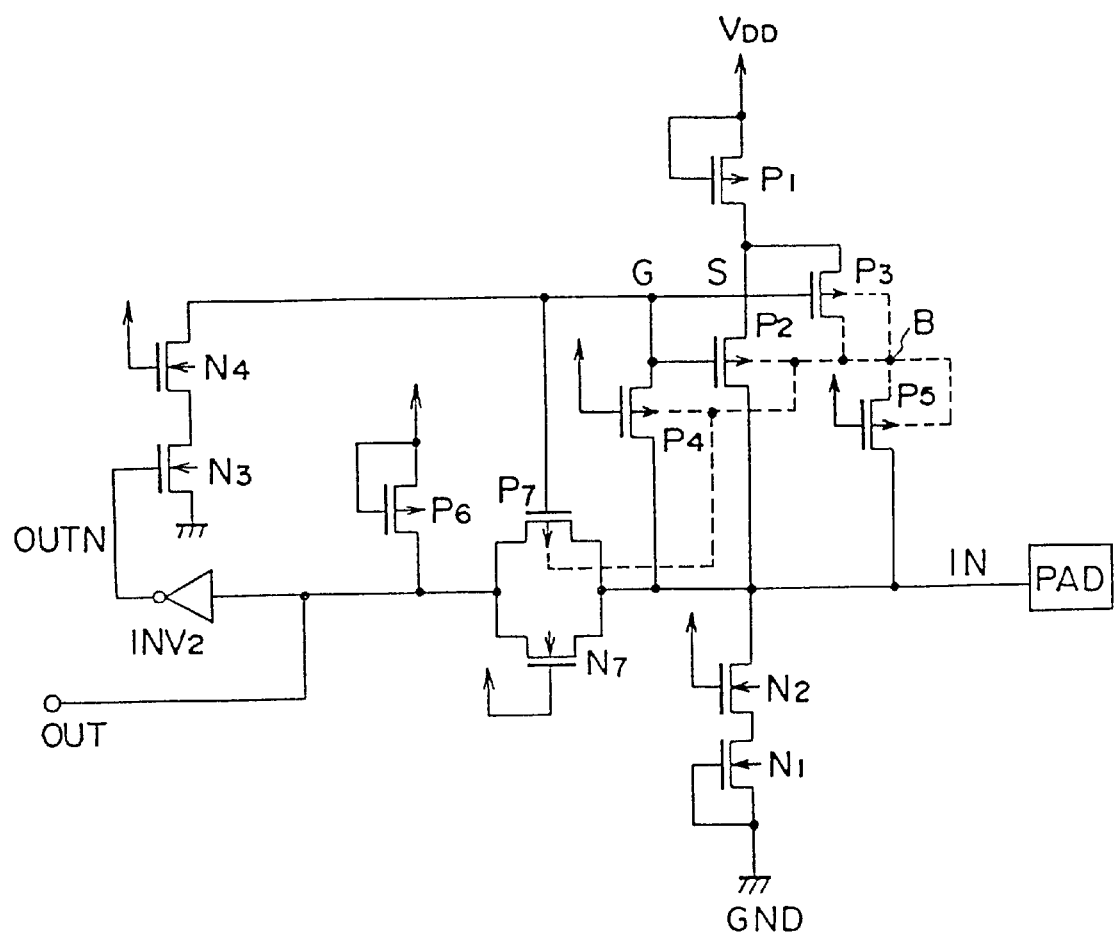
FIG. 14 is a circuit diagram of an input circuit in accordance with the fifth embodiment of this invention.

Referring to FIG. 14, an input circuit which is allowable to be built-in in an integrated circuit in accordance with the fifth embodiment of this invention is composed of an input terminal (IN), an output terminal (OUT), p channel normally off FETs ($P_1$) through ($P_7$), n channel normally off FETs ($N_4$) and ($N_7$) and an inverter ($INV_2$). The voltage of the power supply ($V_{DD}$) employed for the input circuit in accordance with the fifth embodiment of this invention is supposed to be 3V. The "H" level voltage of an input signal to be received by the input terminal (IN) is supposed to be 5V. An output terminal (OUT) is scheduled to be connected the other circuits built-in in the same integrated circuit. The input terminal of the inverter ($INV_2$) is connected the output terminal (OUT) and the output terminal thereof is connected an internal node (OUTN).

The gate and the source of an n channel normally off FET ($N_1$) are connected the ground (GND). The gate of an n channel normally off FET ($N_2$) is connected the internal power supply ($V_{DD}$), the drain thereof is connected the input terminal (IN) and the source thereof is connected the drain of the n channel normally off FET ($N_1$). The gate of the n channel normally off FET ($N_3$) is connected the node (OUTN) and the source thereof is grounded. The gate of the n channel normally off FET ($N_4$) is connected the internal power supply ($V_{DD}$), the drain thereof is connected an internal node (G) and the source thereof is connected the drain of the n channel normally off FET ($N_3$).

The gate and the source of the p channel normally off FET ($P_1$) are connected the internal power supply ($V_{DD}$) or 3V, and the drain thereof is connected an internal node (S). The gate of the p channel normally off FET ($P_2$) is connected the node (G), the drain thereof is connected the input terminal (IN) and the source thereof is connected the node (S). The gate of the p channel normally off FET ($P_3$) is connected the node (G) and the source thereof is connected the node (S). The gate of the p channel normally off FET ($P_4$) is connected the internal power supply ($V_{DD}$) or 3V, the drain thereof is connected the node (G) and the source thereof is connected the input terminal (IN). The gate of the p channel normally off FET ($P_5$) is connected the internal power supply ($V_{DD}$) or 3V and the source thereof is connected the input terminal (IN).

The gate of the n channel normally off FET ($N_7$) is connected the internal power supply ($V_{DD}$) or 3V, the first electrode thereof (the drain or the source thereof is connected the input terminal (IN) and the second electrode thereof (the source or the drain thereof) is connected the output terminal (OUT). The gate of the p channel normally off FET ($P_7$) is connected the node (G), the first electrode thereof (the drain or the source thereof ) is connected the output terminal (OUT) and the second electrode thereof (the source or the drain thereof) is connected the input terminal (IN). The gate and the source of the p channel normally off FET ($P_6$) are connected the internal power supply ($V_{DD}$) or 3V, and the drain thereof is connected the output terminal (OUT).

The p channel normally off FETs ($P_2$), ($P_3$), ($P_4$), ($P_5$) and ($P_7$) are produced in an n well or a floating bulk (B) which is a common bulk or a common substrate which is neither connected the ground (GND) nor connected the internal power supply ($V_{DD}$) or 3V. The drain of the p channel normally off FETs ($P_3$) and ($P_5$) are connected the floating bulk (B). The bulk of the p channel normally off FETs ($P_1$) and ($P_6$) is connected the internal power supply ($V_{DD}$) or 3V, and the bulk of the n channel normally off FETs ($N_1$) through ($N_4$) and ($N_7$) is grounded.

In the foregoing manner, the input terminal (IN) is connected the drain of the p channel normally off FET ($P_2$), the source of the p channel normally off FETs ($P_4$) and ($P_5$), the second electrode of the p channel normally off FET ($P_7$), the drain of the n channel normally off FET ($N_2$), the first electrode of the n channel normally off FET ($N_7$) and the input terminal of the inverter ($INV_2$).

The node (G) is connected the gates of the p channel normally off FETs ($P_2$), ($P_3$) and ($P_7$), the drain of the p channel normally off FET ($P_4$) and the drain of the n channel normally off FET ($N_4$). The node (S) is connected the drain of the p channel normally off FET ($P_1$) and the sources of the p channel normally off FETs ($P_2$) and ($P_3$). The output terminal (OUT) is connected the drain of the p channel normally off FET ($P_6$), the first electrode of the p channel normally off FET ($P_7$), the second electrode of the n channel normally off FET ($N_7$) and the input terminal of the inverter ($INV_2$).

Referring to FIG. 14, the operation of the input circuit in accordance with the fifth embodiment of this invention will be described below. If an input signal of which the potential level is "L" or 0V is applied the input terminal (IN), the n channel normally off FET ($N_7$) turns on and the potential level of the output terminal (OUT) becomes "L", making the output level of the inverter ($INV_2$) an "H" level. As a result, the n channel normally off FETs ($N_3$) and ($N_4$) are turned on. Since the n channel normally off FETs ($N_3$) and ($N_4$) are in an ON position, the potential level of the node (G) is in an "L" level. Since the potential level of the node (G) and the input terminal (IN) is "L" or 0V, the p channel normally off FETs ($P_2$), ($P_4$) and ($P_5$) are OFF. The potential level of the node (S) is less than the $V_{th}$ to keep the p channel normally off FET ($P_3$) in an OFF position.

A shift of the potential level of the input terminal (IN) from the "L" level or 0V to the voltage level of the external power supply (Vcc) or 5V, causes the output terminal (OUT) to output a signal having the potential level of the internal power supply ($V_{DD}$). When the potential level of the input terminal (IN) has increased up to the $V_{th}$ (the threshold voltage of an n channel normally off FET or the absolute value of the threshold voltage of a p channel normally off FET), the p channel normally off FET ($P_7$) turns on, because the potential level of the node (G) is in an "L" level. The n channel normally off FET ($N_7$) stays in an ON position, as long as the potential level of the input terminal (IN) is less than (3V-$V_{th}$), and the n channel normally off FET ($N_7$) turns off, when the potential level of the input terminal (IN) is in excess of the (3V-$V_{th}$). Accordingly, when the potential level of the input terminal (IN) has increased up to 3V, the potential of the output terminal (OUT) increases up to 3V rather than (3V-$V_{th}$), due to the operation of a parallel circuit of the p channel normally off FET ($P_7$) and the n channel normally off FET ($N_7$).

When the potential level of the input terminal (IN) has increased up to the $V_{th}$, the p channel normally off FET ($P_2$) turns on, because the potential level of the node (G) is "L". When the p channel normally off FET ($P_2$) has turned on, the potential of the node (S) increases up to the potential of the input terminal (IN), to cause the p channel normally off FET ($P_3$) to turn on. Since the p channel normally off FETs ($P_2$) and ($P_3$) have turned on, the potential level the floating bulk (B) increases up to the potential level of the input terminal (IN). The function of the p channel normally off FET ($P_3$) is to increase the potential level of the floating bulk (B) precisely to 3V for the ultimate purpose to secure the operation of the p channel normally off FET ($P_2$).

A shift of the potential levels of the input terminal (IN) and the output terminal (OUT) to 3V, causes the output level of the inverter ($INV_2$) to shift from "H" to "L", turning off the n channel normally off FET ($N_3$). The potential level of the node (G), however, stays in an "L" level.

Thereafter, the potential level of the input terminal (IN) increases up to the level of the external power supply (Vcc) or 5V. When the potential level of the input terminal (IN) increases to (3V+$V_{th}$) or higher, the p channel normally off FETs ($P_4$) and ($P_5$) turn on. The turning on of the p channel normally off FET ($P_4$) causes the potential level of the node (G) to increase from the "L" level to the level of the internal power supply ($V_{DD}$) or 3V. When the potential level of the node (G) becomes identical to the level of the input terminal (IN), the p channel normally off FET ($P_7$) turns off. When the potential level of the node (G) becomes identical to the level of the node (S), the p channel normally off FETs ($P_2$) and ($P_3$) turn off. The turning on of the p channel normally off FET ($P_5$) causes the potential of the floating bulk (B) to become identical to that of the input terminal (IN).

When the potential of the input terminal (IN) has increased up to 5V, the potential of the node (G) and of the floating bulk (B) become 5V. If the potential of the output terminal (OUT) has exceeded (3V+$V_{th}$), before the p channel normally off FET ($P_7$) turns off, the p channel normally off FET ($P_6$) turns on, resultantly clamping the potential of the output terminal (OUT) to (3V+$V_{th}$). On the other hand, if the potential of the input terminal (IN) turns out to be less than (-$V_{th}$), the n channel normally off FET ($N_1$) turns on to clamp the potential of the input terminal (IN) to (-$V_{th}$). In the third place, if the potential of the input terminal (IN) and of the node (S) has exceeded (3V+$V_{th}$), the p channel normally off FET ($P_1$) turns on, to clamp the potential of the input terminal (IN) to (3V+$V_{th}$). The function of the n channel normally off FETs ($N_2$) and ($N_4$) is to prevent a voltage applied to the input terminal (IN) and to the node (G) from being applied between the source and the drain of the n channel normally off FETs ($N_1$) and ($N_4$), when a potential of 5V is applied to the input terminal (IN) and to the node (G). Due to existence of the n channel normally off FETs ($N_2$) and ($N_4$), semiconductor devices having a low amount of dielectric strength are allowed to be employed for the input circuit in accordance with the fifth embodiment of this invention.

As long as the potential of the input terminal (IN) is kept at 5V, the p channel normally off FETs ($P_2$) and ($P_3$) stay in an OFF position to keep the impedance level of the drain of the p channel normally off FET ($P_1$) or of the node (S) high. As a result, no leak current flows from the input terminal (IN) to the internal power supply ($V_{DD}$) through the node (S) and the bulk of the p channel normally off FET ($P_1$). Since the floating bulk (B) is not connected the internal power supply ($V_{DD}$), no leak current flows from the floating bulk (B) to the internal power supply ($V_{DD}$).

In the forgoing manner, even if the input terminal (IN) is applied an input signal having a potential of 5V, a combination of or parallel circuit of the p channel normally off FET ($P_7$) and the n channel normally off FET ($N_7$) effectively prevents an electric current from flowing into the input circuit.

Although an internal power supply is supposed to be 3V and an external power supply is supposed to be 5V in the foregoing description, this does not have any limiting sense. The input circuit can be employed under a condition that the potential of the external power supply is larger than that of the internal power supply.

The foregoing description has clarified that the fifth embodiment of this invention has successfully provided an input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit.

Sixth Embodiment

An input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the potential of the output terminal (OUT) is kept at the potential of the internal power supply ($V_{DD}$), under a condition that the input terminal (IN) is open and in which no current flows into the internal power supply ($V_{DD}$), under a condition that the potential of the input terminal (IN) is higher than that of the internal power supply ($V_{DD}$).

Figure 15:
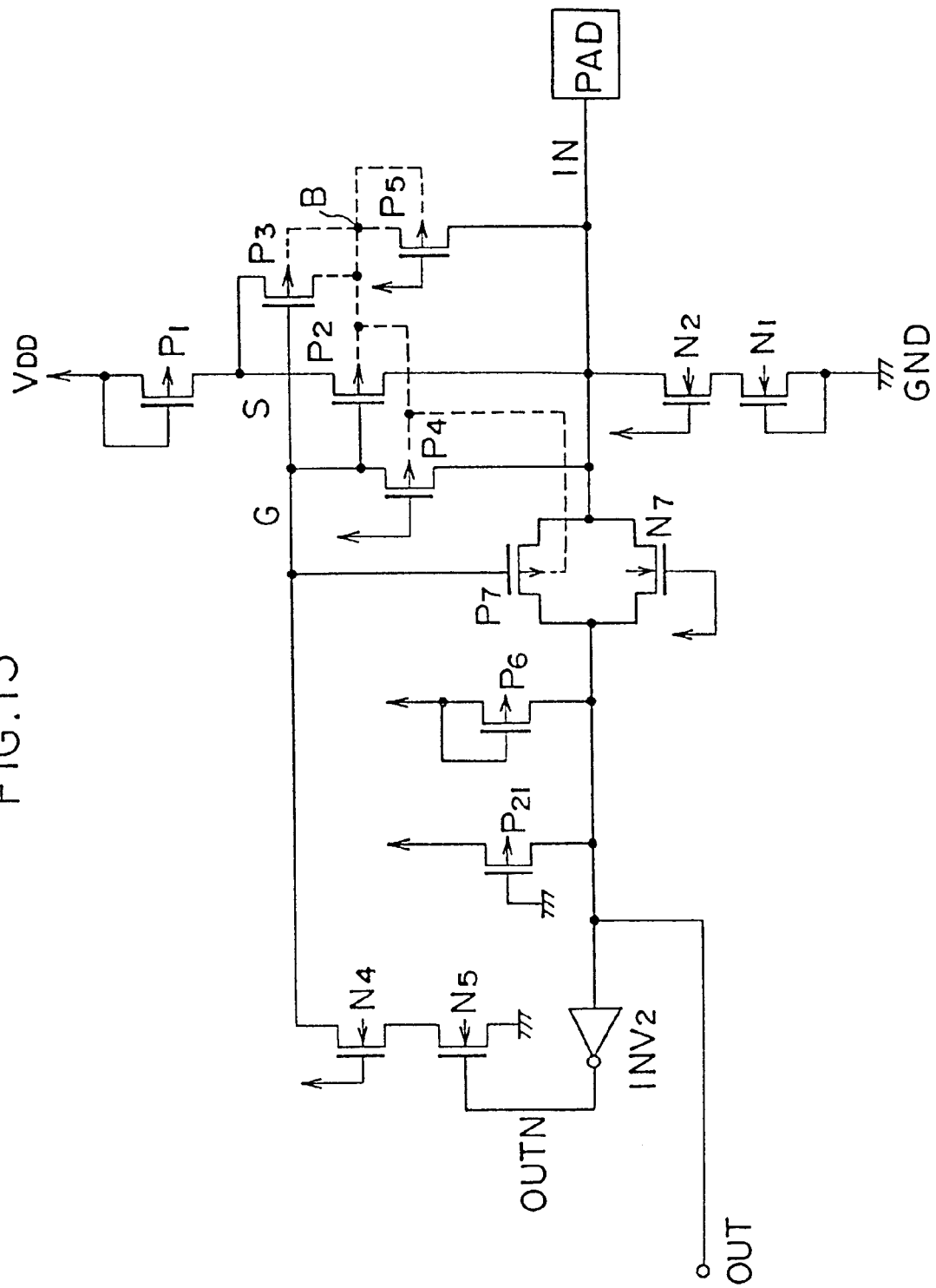
FIG. 15 is a circuit diagram of an input circuit in accordance with the sixth embodiment of this invention.

Referring to FIG. 15, an input circuit which is allowable to be built-in in an integrated circuit in accordance with the sixth embodiment of this invention is composed of an input terminal (IN), an output terminal (OUT), p channel normally off FETs ($P_1$) through ($P_7$) and ($P_{21}$), n channel normally off FETs ($N_1$) through ($N_4$) and ($N_7$) and an inverter ($INV_2$).

The input circuit in accordance with the sixth embodiment of this invention is the input circuit in accordance with the fifth embodiment of this invention described, referring to FIG. 14, to which a p channel normally off FET ($P_{21}$) is newly introduced. The p channel normally off FET ($P_{21}$) of which the gate is grounded, of which the drain is connected the output terminal (OUT) and of which the source is connected the internal power supply ($V_{DD}$), has a function to pull up the potential of the output terminal (OUT) to a potential level identical to the level of the internal power supply ($V_{DD}$) or 3V, under a condition that the input terminal (IN) is open and the impedance level thereof is high.

The operation of the input circuit in accordance with the sixth embodiment of this invention is quite similar to that of the input circuit in accordance with the fifth embodiment of this invention excepting the operation under a condition that the input terminal (IN) is open and the impedance level thereof is high.

Referring to FIG. 15, although the p channel normally off FET ($P_{21}$) is always ON, it works as a pull-up resister, because the mutual conductance thereof is small. Under a condition that the input terminal (IN) is open and the impedance level thereof is high, the potential of the output terminal (OUT) does not turn out to float but is fixed at the level of the internal power supply ($V_{DD}$) or 3V. Incidentally, however, if the potential of the input terminal (IN) is 5V, the p channel normally off FET ($P_7$) and the n channel normally off FET ($N_7$) turn off. Thus, no current flows the input terminal (IN) to the internal power supply ($V_{DD}$).

In the foregoing manner, the potential of the output terminal (OUT) becomes identical to that of the internal power supply ($V_{DD}$), under a condition that the impedance level of the input terminal (IN) is high or the input terminal (IN) is open. As a result, the potential level of the input signal to be applied to the internal circuits which are connected the output terminal of the input circuit of this embodiment, is secured. Incidentally, even if the input terminal (IN) is applied 5V, no current flows into the internal power supply ($V_{DD}$) through the p channel normally off FET ($P_{21}$), because the p channel normally off FET ($P_7$) and the n channel normally off FET ($N_7$) are OFF.

The foregoing description has clarified that the sixth embodiment of this invention has successfully provided an input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the potential of the output terminal (OUT) is kept at the potential of the internal power supply ($V_{DD}$), under a condition that the input terminal (IN) is open and in which no current flows into the internal power supply ($V_{DD}$), under a condition that the potential of the input terminal (IN) is higher than that of the internal power supply ($V_{DD}$).

Seventh Embodiment

An input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the potential of the output terminal (OUT) is kept at the ground potential, under a condition that the input terminal (IN) is open and in which FETs of which the dielectric strength is weak can be employed.

Figure 16:
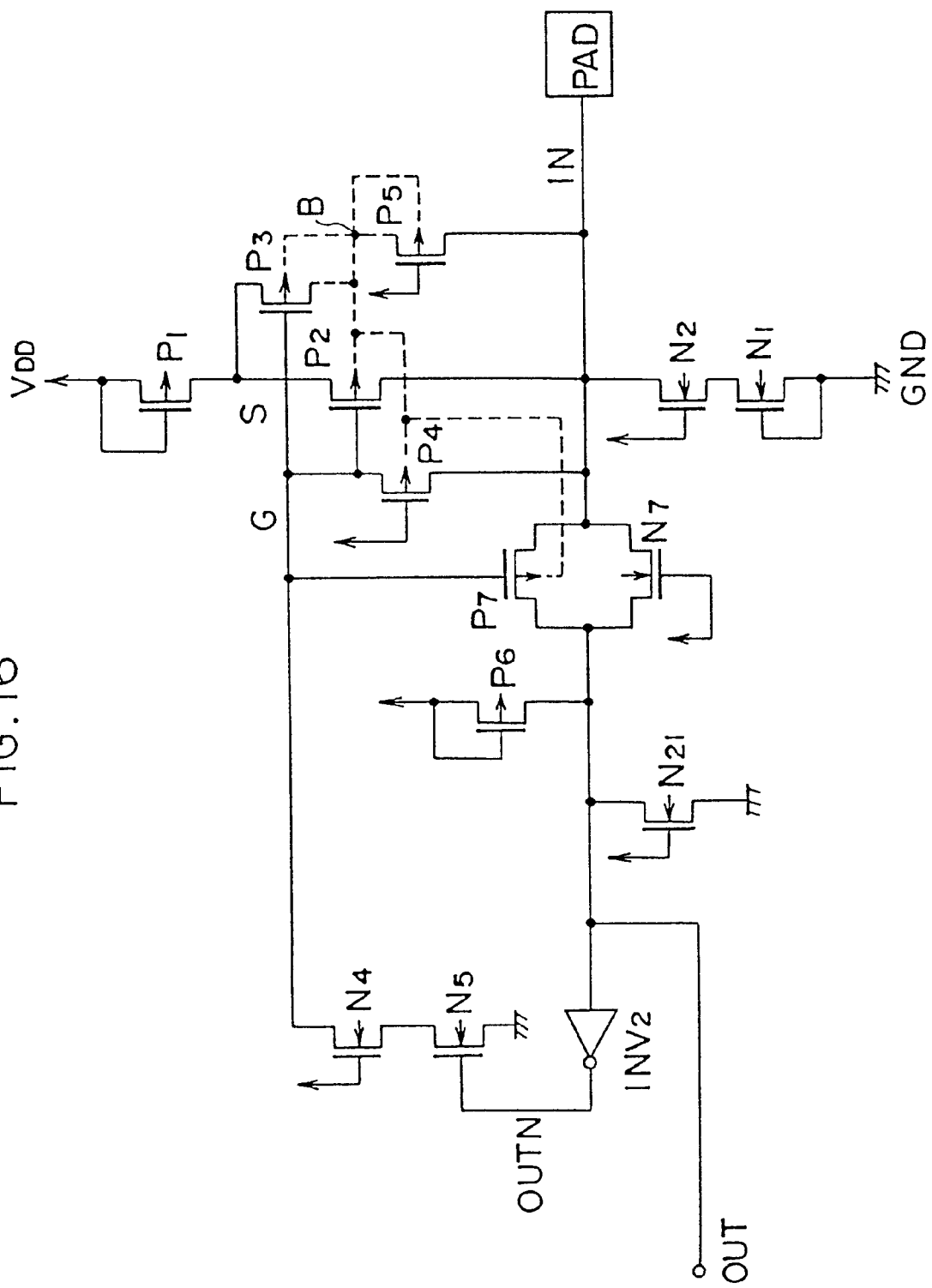
FIG. 16 is a circuit diagram of an input circuit in accordance with the seventh embodiment of this invention.

Referring to FIG. 16, an input circuit which is allowable to be built-in in an integrated circuit in accordance with the seventh embodiment of this invention is composed of an input terminal (IN), an output terminal (OUT), p channel normally off FETs ($P_1$) through ($P_7$), n channel normally off FETs ($N_1$) through ($N_7$) and ($N_{21}$) and an inverter ($INV_2$).

The input circuit in accordance with the seventh embodiment of this invention is the input circuit in accordance with the fifth embodiment of this invention described, referring to FIG. 14, to which an n channel normally off FET ($N_{21}$) is newly introduced. The n channel normally off FET ($N_{21}$) of which the gate is connected the internal power supply ($V_{DD}$), of which the drain is connected the output terminal (OUT) and of which the source is grounded, has a function to pull down the potential of the output terminal (OUT) to the ground level, under a condition that the input terminal (IN) is open and the impedance level thereof is high. As a result, the potential level of the output terminal (OUT) is fixed at the ground level, while the input terminal (IN) is open.

Referring to FIG. 16, the operation of the input circuit in accordance with the seventh embodiment of this invention is quite similar to that of the input circuit in accordance with the fifth embodiment of this invention, described referring to FIG. 14, excepting the operation under a condition that the input terminal (IN) is open and the impedance level thereof is high.

Referring to FIG. 16, although the n channel normally off FET ($N_{21}$) is always ON, it works as a pull-down resister, because the mutual conductance thereof is small. Under a condition that the input terminal (IN) is open and the impedance level thereof is high, the potential of the output terminal (OUT) does not turn out to float but is fixed at the ground level, because of the existence of the n channel normally off FET ($N_{21}$).

In the foregoing manner, the potential of the output terminal (OUT) is grounded under a condition that the input terminal (IN) is open and the impedance level thereof is high. As a result, the potential level of the input signal to be applied to the internal circuit which is connected the output terminal of the input circuit of this embodiment, is secured. Incidentally, even if the input terminal (IN) is applied 5V, the potential of the output terminal (OUT) becomes identical to that of the internal power supply ($V_{DD}$), due to the existence of the p channel normally off FETs ($P_6$) and ($P_7$) and the n channel normally off FET ($N_7$). As a result, a voltage difference of 5V does not applied among the drain, the gate and the source of the n channel normally off FET ($N_{21}$), resultantly allowing an FET of which the dielectric strength is weak to be employed for this input circuit.

The foregoing description has clarified that the seventh embodiment of this invention has successfully provided an input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the potential of the output terminal (OUT) is kept at the ground potential, under a condition that the input terminal (IN) is open and in which FETs of which the dielectric strength is weak can be employed.

Eighth Embodiment

An input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the potential of the input terminal and of the output terminal becomes a fixed value, when the impedance of the input terminal is made high and in which FETs having a less amount of dielectric strength can be employed.

Figure 17:
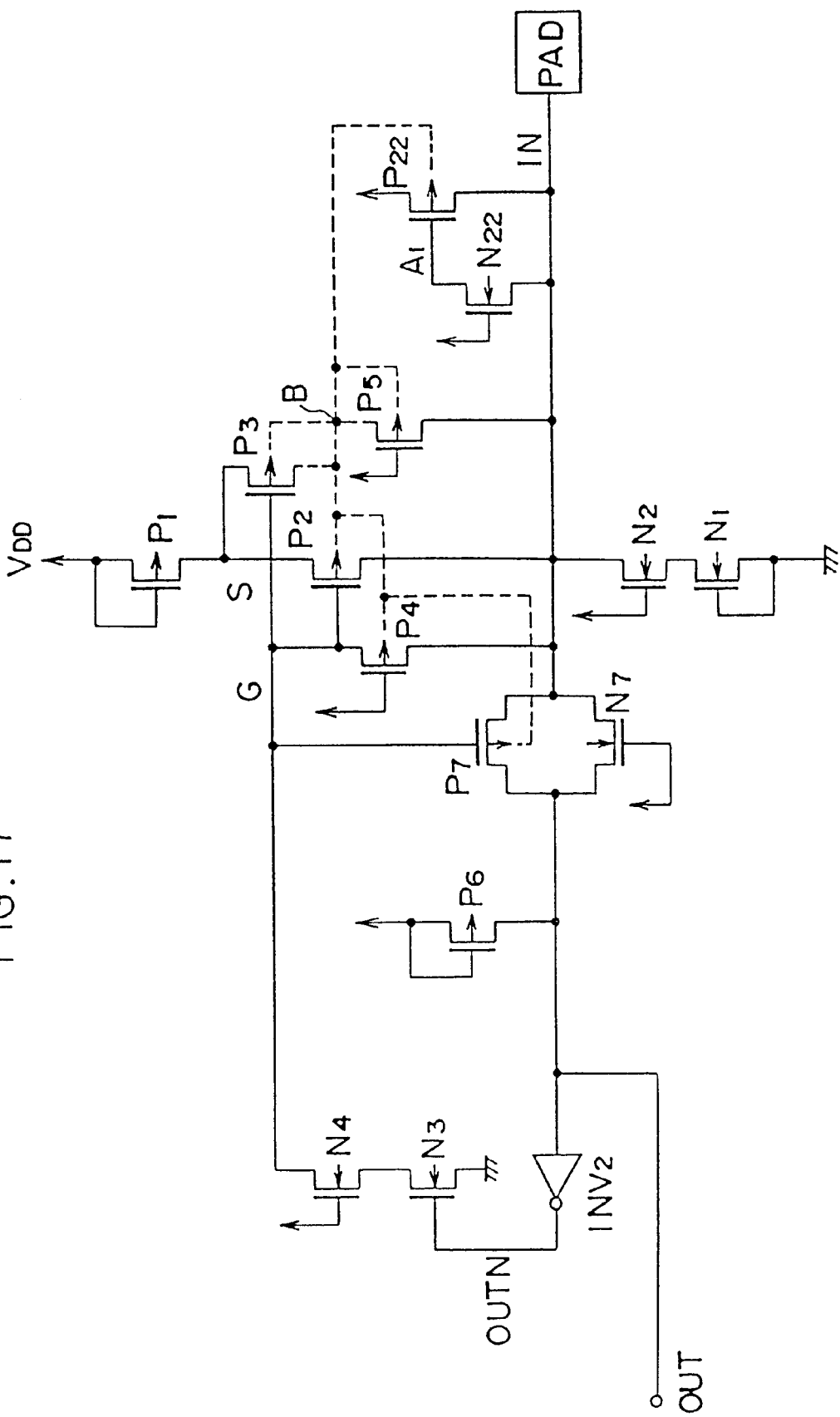
FIG. 17 is a circuit diagram of an input circuit in accordance with the eighth embodiment of this invention.

Referring to FIG. 17, an input circuit which is allowable to be built-in in an integrated circuit in accordance with the eighth embodiment of this invention is composed of an input terminal (IN), an output terminal (OUT), p channel normally off FETs ($P_1$) through ($P_7$) and ($P_{22}$), n channel normally off FETs ($N_1$) through ($N_4$), ($N_7$) and ($N_{22}$) and an inverter ($INV_2$).

The input circuit in accordance with the eighth embodiment of this invention is the input circuit in accordance with the fifth embodiment of this invention described, referring to FIG. 14, to which a p channel normally off FET ($P_{22}$) and an n channel normally off FET ($N_{22}$) are newly introduced. The gate of the n channel normally off FET ($N_{22}$) is connected the internal power supply ($V_{DD}$), the drain thereof is connected a node ($A_1$), the source thereof is connected the internal power supply ($V_{DD}$) and the bulk thereof is grounded. The gate of the p channel normally off FET ($P_{22}$) is connected the node ($A_1$), the drain thereof is connected the input terminal (IN) and the source thereof is connected the internal power supply ($V_{DD}$). The bulk of the p channel normally off FET ($P_{22}$) is a floating bulk (B).

The operation of the input circuit in accordance with the eighth embodiment of this invention is similar to that of the input circuit in accordance with the fifth embodiment of this invention described referring to FIG. 14, excepting the operation under a condition that the input terminal (IN) is open and the impedance level thereof is high.

Figure 18A:
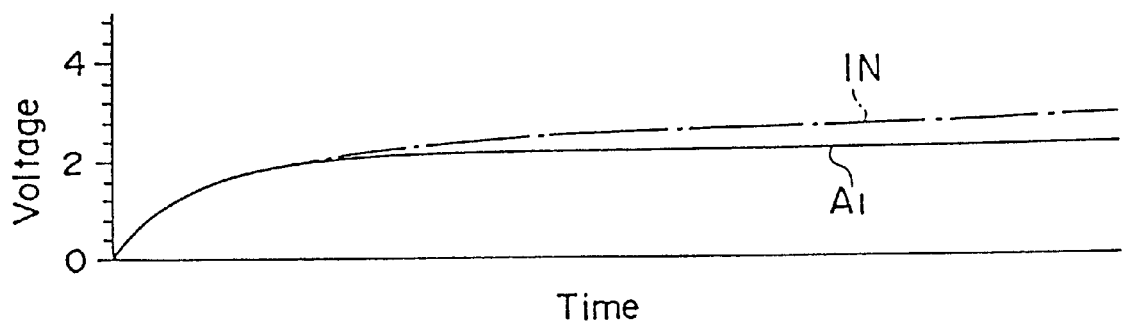
FIG. 18A is a timing chart illustrating the time-wise move of the potential of the input terminal and of the node ($A_1$) in response to an action to shift the input terminal (IN) to an open position, resultantly shifting the impedance thereof to a high position from the potential level of 0V.
Figure 18B:
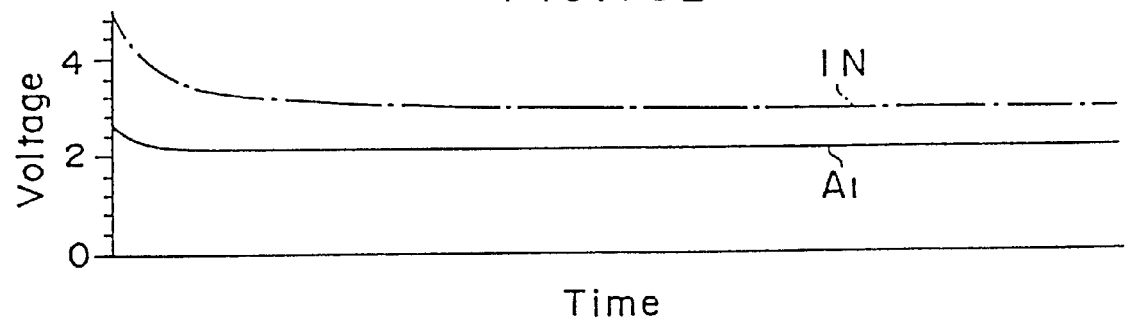
FIG. 18B is a timing chart illustrating the time-wise move of the potential of the input terminal and of the node ($A_1$) in response to an action to shift the input terminal (IN) to an open position, resultantly shifting the impedance thereof to a high position from the potential level of 5V.

FIG. 18A illustrates the time-wise move of the potential of the input terminal (IN) and of the node ($A_1$) in response to an action to open the input terminal (IN) to shift the impedance thereof to a high position from the potential level of 0V, and FIG. 18B illustrates the time-wise move of the potential of the input terminal (IN) and of the node ($A_1$) in response to an action to open the input terminal (IN) to shift the impedance thereof to a high position from the potential level of 5V.

Referring to FIGS. 17, 18A and 18B, the operation of the input circuit in accordance with the eighth embodiment of this invention will be described below.

Firstly, the potential of the input terminal (IN) is supposed to be in an "L" level or 0V. Since the potential of the input terminal (IN) is "L", the n channel normally off FET ($N_{22}$) is ON to make the potential level of the node ($A_1$) "L" or 0V. Although the p channel normally off FET ($P_{22}$) is ON, it works as if it is a pull-up resister. As a result, the potential difference ($V_{DD}$) is applied between the source and the drain of the p channel normally off FET ($P_{22}$).

When the impedance level of the input terminal (IN) is made high (or the circuit which grounded the input terminal (IN) is disconnected), the potential of the input terminal (IN) increases to the level of the internal power supply ($V_{DD}$) or 3V, resultantly increasing the potential of the output terminal (OUT) to 3V. The potential of the node ($A_1$) becomes ($V_{DD}-V_{th}$), due to the existence of the n channel normally off FET ($N_{22}$).

Secondly, the initial potential of the input terminal (IN) was supposed to be 5V. On this condition, the potential of the node ($A_1$) is ($V_{DD}-V_{th}$). Although the p channel normally off FET ($P_{22}$) is ON, the potential difference between the source and the drain thereof is ($5V-V_{DD}$), because it works as if it is a pull-down resister. The potential of the output terminal (OUT) is identical to the internal power supply ($V_{DD}$) or 3V.

When the impedance level of the input terminal (IN) is made high (or the circuit which connects the input terminal (IN) and the external power supply or 5V is disconnected), the potential of the input terminal (IN) is shifted to 3V.

During a period in which the potential of the input terminal (IN) is kept at 5V, no electric current flows into the internal power supply ($V_{DD}$) from the input terminal (IN) through the bulk of the p channel normally off FET ($P_{22}$), because the p channel normally off FET ($P_{22}$) is produced in the floating bulk (B) in which the p channel normally off FETs ($P_2$) through ($P_5$) and ($P_7$) are produced.

In the foregoing manner, when the impedance of the input terminal (IN) is made high, the potential of the input terminal (IN) and of the output terminal (OUT) becomes identical to the potential of the internal power supply ($V_{DD}$). Incidentally, when the potential of the input terminal (IN) is made 5V, no current flows into the bulk, because the p channel normally off FET ($P_{22}$) and the p channel normally off FETs ($P_2$) through ($P_5$) and ($P_7$) are produced on the common floating bulk (B). As a result, the potential difference between the drain thereof (5V) and the gate thereof ($V_{DD}-V_{th}$) is less than 5V, resultantly allowing an FET having a less amount of dielectric strength to be employed for the input circuit.

The foregoing description has clarified that the eighth embodiment of this invention has successfully provided an input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the potential of the input terminal and of the output terminal becomes a fixed value, when the impedance of the input terminal is made high and in which FETs having a less amount of dielectric strength can be employed.

Ninth Embodiment

An input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the input terminal and the output terminal are grounded, when the impedance of the input terminal is made high and in which FETs having a less amount of dielectric strength can be employed.

Figure 19:
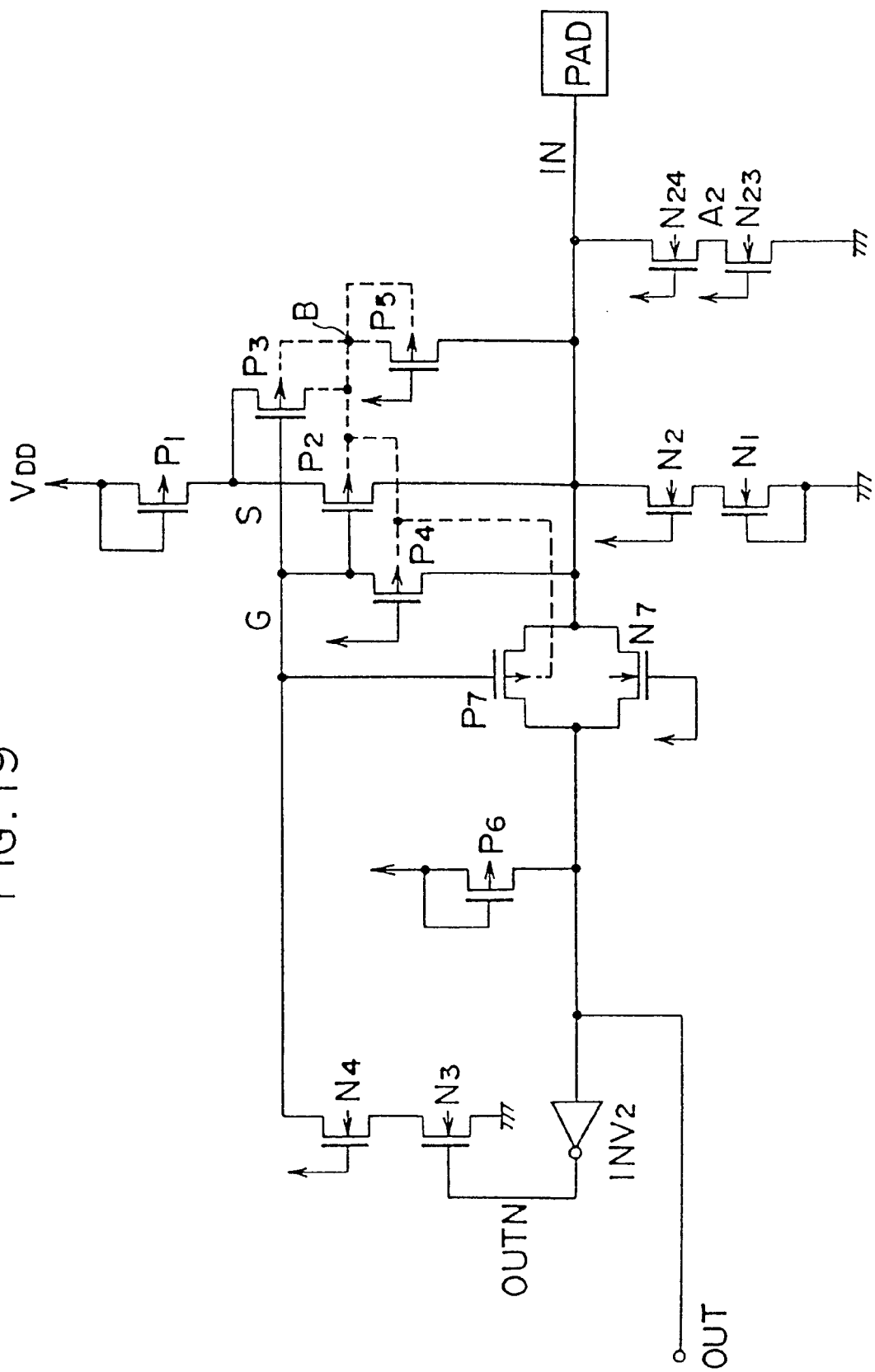
FIG. 19 is a circuit diagram of an input circuit in accordance with the ninth embodiment of this invention.

Referring to FIG. 19, an input circuit which is allowable to be built-in in an integrated circuit in accordance with the ninth embodiment of this invention is composed of an input terminal (IN), an output terminal (OUT), p channel normally off FETs ($P_1$) through ($P_7$), n channel normally off FETs ($N_1$) through ($N_4$), ($N_7$), ($N_{23}$) and ($N_{24}$) and an inverter ($INV_2$).

The input circuit in accordance with the ninth embodiment of this invention is the input circuit in accordance with the fifth embodiment of this invention described, referring to FIG. 14, to which n channel normally off FETs ($N_{23}$) and ($N_{24}$) are newly introduced.

The gate of the n channel normally off FET ($N_{23}$) is connected the internal power supply ($V_{DD}$), the drain thereof is connected a node ($A_2$) and the source thereof is grounded. The gate of the n channel normally off FET ($N_{23}$) is connected the internal power supply ($V_{DD}$), the drain thereof is connected the node ($A_2$) and the source thereof is grounded. The gate of the n channel normally off FET ($N_{24}$) is connected the internal power supply ($V_{DD}$), the drain thereof is connected the input terminal (IN) and the source thereof is connected the node ($A_2$). In other words, a series circuit of the n channel normally off FETs ($N_{23}$) and ($N_{24}$) is connected between the input terminal (IN) and the ground (GND).

The operation of the input circuit in accordance with the ninth embodiment of this invention is similar to that of the input circuit in accordance with the fifth embodiment of this invention excepting the operation under a condition that the input terminal (IN) is open and the impedance level thereof is high.

Although the n channel normally off FETs ($N_{23}$) and ($N_{24}$) are always ON, they act as a pull-down resister, because the mutual conductance thereof is small. When the impedance of the input terminal (IN) has become high, the potential of the input terminal (IN) does not become a floating position but is fixed at the ground potential, because the n channel normally off FETs ($N_{23}$) and ($N_{24}$) are always ON.

In the foregoing manner, when the impedance of the input terminal (IN) is made high, both the input terminal (IN) and the output terminal (OUT) are grounded. Incidentally, even when the input terminal (IN) is applied 5V, the voltage is divided by the n channel normally off FETs ($N_{23}$) and ($N_{24}$) and the potential of the node ($A_2$) is determined between the 5V and 0V. As a result, a voltage in excess of 5V is not applied between the source and the drain of the n channel normally off FETs ($N_{23}$) and ($N_{24}$). Accordingly, FETs having a less amount of dielectric strength can be employed for this input circuit.

The foregoing description has clarified that the ninth embodiment of this invention has successfully provided an input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the input terminal and the output terminal are grounded, when the impedance of the input terminal is made high and in which FETs having a less amount of dielectric strength can be employed.

Tenth Embodiment

An input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the input terminal and the output terminal are grounded, when the impedance of the input terminal is made high and in which FETs having a less amount of dielectric strength can be employed.

Figure 20:
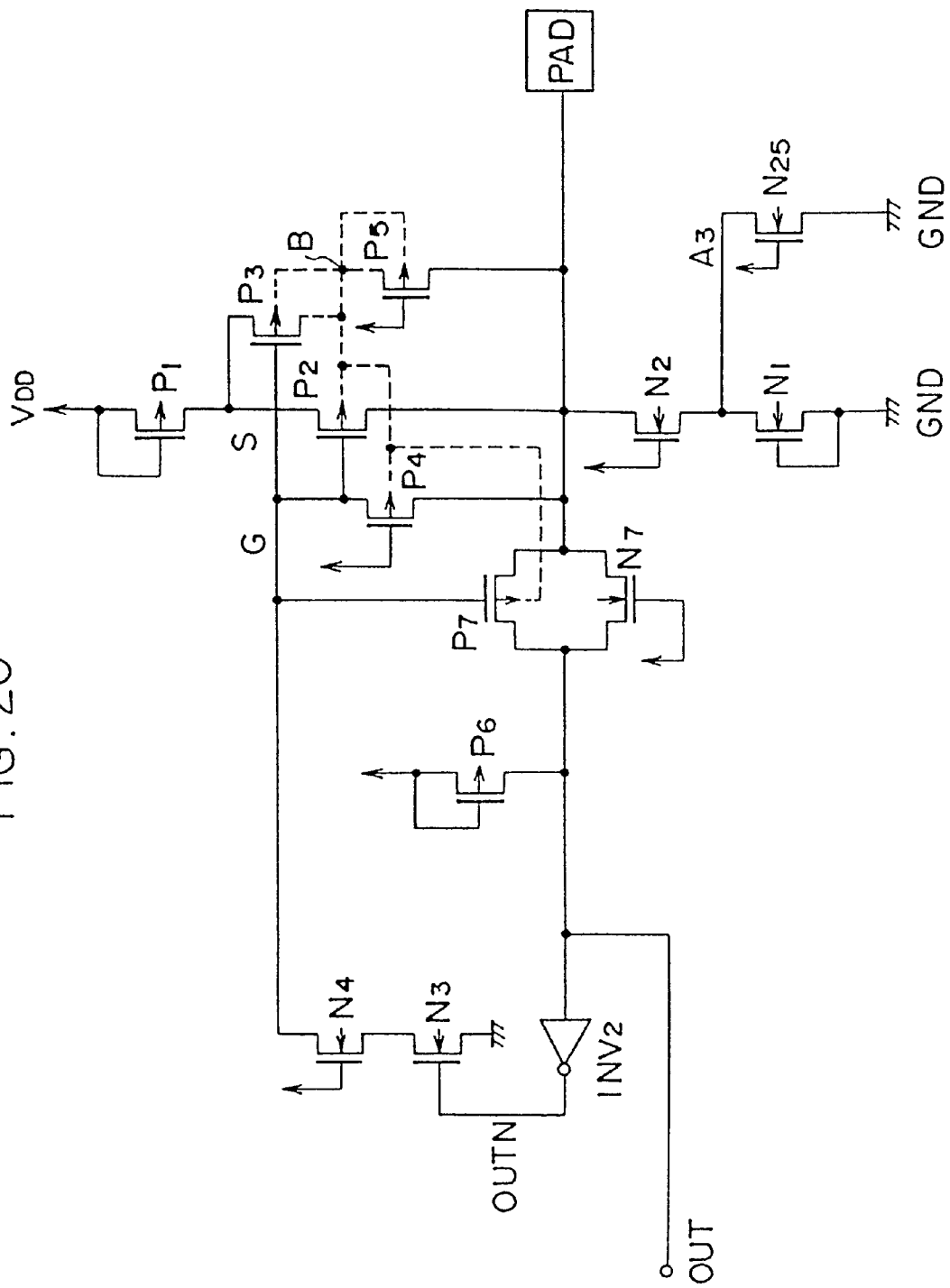
FIG. 20 is a circuit diagram of an input circuit in accordance with the tenth embodiment of this invention.

Referring to FIG. 20, an input circuit which is allowable to be built-in in an integrated circuit in accordance with the tenth embodiment of this invention is composed of an input terminal (IN), an output terminal (OUT), p channel normally off FETs ($P_1$) through ($P_7$), n channel normally off FETs ($N_1$) through ($N_4$), ($N_7$) and ($N_{25}$) and an inverter ($INV_2$).

The input circuit in accordance with the tenth embodiment of this invention is the input circuit in accordance with the fifth embodiment of this invention described, referring to FIG. 14, to which an n channel normally off FET ($N_{25}$) is newly introduced to be connected in parallel with the n channel normally off FET ($N_1$).

The gate of the n channel normally off FET ($N_{25}$) is connected the internal power supply ($V_{DD}$), the drain thereof is connected the node ($A_3$), the source thereof is grounded. The drain of the n channel normally off FET ($N_1$) and the source of the n channel normally off FET ($N_2$) are connected the node ($A_3$).

The operation of the input circuit in accordance with the tenth embodiment of this invention is similar to that of the input circuit in accordance with the fifth embodiment of this invention excepting the operation under a condition that the input terminal (IN) is open and the impedance level thereof is high.

Although the n channel normally off FETs ($N_2$) and ($N_{25}$) are always ON, the mutual conductance of the n channel normally off FET ($N_{25}$) is small. A series circuit is the n channel normally off FETs ($N_2$) and ($N_{25}$) work as pull-down resisters. When the impedance of the input terminal (IN) has become high, the potential of the input terminal (IN) does not become a floating position but is fixed at the ground potential, because the n channel normally off FETs ($N_2$) and ($N_{25}$) are always ON.

In the foregoing manner, when the impedance of the input terminal (IN) is made high, both the input terminal (IN) and the output terminal (OUT) are grounded. Incidentally, even when the input terminal (IN) is applied 5V, the voltage is divided by the n channel normally off FETs ($N_2$) and ($N_{25}$) and the potential of the node ($A_3$) is determined between the 5V and 0V. As a result, a voltage in excess of 5V is not applied between the source and the drain of the n channel normally off FET ($N_{25}$). Accordingly, FETs having a less amount of dielectric strength can be employed for this input circuit. Further, the quantity of the FETs employed to produce the input circuit of this embodiment is less than that of the FETs employed to produce the input circuit of the ninth embodiment of this invention.

The foregoing description has clarified that the tenth embodiment of this invention has successfully provided an input circuit which can receive an input signal from an external circuit which works under a power supply of which the voltage is higher than the voltage of a power supply under which the input circuit works, and can forward the input signal having a voltage of the full amount of the power supply employed in the input circuit, to the next stage circuit, wherein it is allowed to enjoy an additional advantage in which the input terminal and the output terminal are grounded, when the impedance of the input terminal is made high and in which FETs having a less amount of dielectric strength can be employed.

Eleventh Embodiment

An input circuit which outputs an "L" level signal, when being inputted a signal of a potential identical to the voltage of a power supply employed in the input circuit and which outputs an "H" level signal, when being inputted a signal of a potential higher than the voltage of a power supply employed in the input circuit.

Figure 21:
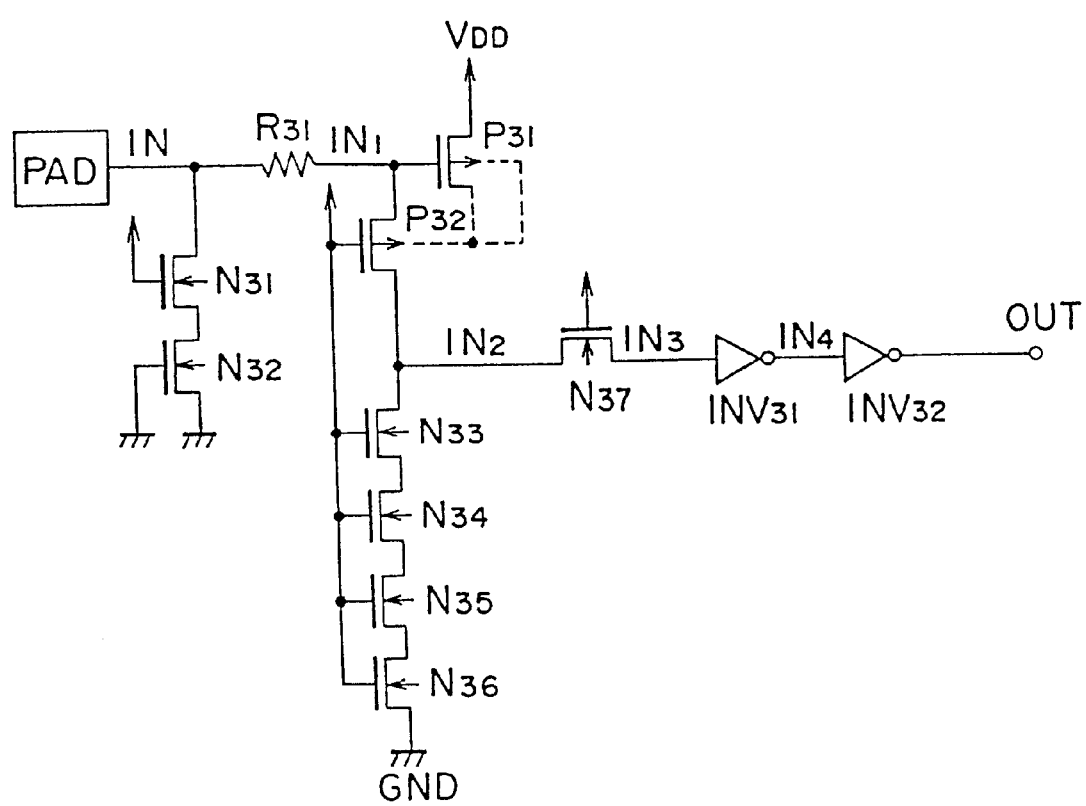
FIG. 21 is a circuit diagram of an input circuit in accordance with the eleventh embodiment of this invention.

Referring to FIG. 21, an input circuit which is allowable to be built-in in an integrated circuit in accordance with the eleventh embodiment of this invention is composed of an input terminal (IN), an output terminal (OUT), p channel normally off FETs ($P_{31}$) and ($P_{32}$), n channel normally off FETs ($N_{31}$) and ($N_{37}$), inverters ($INV_3$,) and ($INV_{32}$) and a resister ($R_{31}$). The voltage of the internal power supply ($V_{DD}$) is supposed to be 3V. The input circuit in accordance with the eleventh embodiment of this invention has a function to output an "L" level signal, when being inputted a signal of a potential identical to the voltage of a power supply employed in the input circuit and to output an "H" level signal, when being inputted a signal of a potential higher than the voltage of a power supply employed in the input circuit. Accordingly, this input circuits has a function to output a select input signal (SEL) defined for an output circuit in accordance with the fourth embodiment of this invention which was described earlier referring to FIG. 11. The input terminal (IN) is connected the power supply (Vcc) which is employed in an external circuit (not shown) to receive an input signal. The input circuit in accordance with the eleventh embodiment of this invention has a function to inspect whether the potential corresponding to the "H" level of the input signal is identical to that of the internal power supply ($V_{DD}$) or the potential corresponding to the "H" level of the input signal is larger than that of the internal power supply ($V_{DD}$).

The gate of the n channel normally off FET ($N_{31}$) is connected the internal power supply ($V_{DD}$) and the drain thereof is connected the input terminal (IN). The gate and the source of the n channel normally off FET ($N_{32}$) is grounded and the drain thereof is connected the source of the n channel normally off FET ($N_{31}$). One end of the resister ($R_1$) is connected the input terminal (IN) and the other end thereof is connected a node ($IN_1$). The gate of the p channel normally off FET ($P_{31}$) is connected the node ($IN_1$) and the source thereof is connected the internal power supply ($V_{DD}$). The gate of the p channel normally off FET ($P_{32}$) is connected the internal power supply ($V_{DD}$), the drain thereof is connected a node ($IN_2$), the source thereof is connected the node ($N_1$) and the bulk thereof is connected the drain and the bulk of the p channel normally off FET ($P_{31}$). The bulk of the p channel normally off FETs ($P_{31}$) and ($P_{32}$) is not connected the internal power supply ($V_{DD}$), resultantly preventing an electric current from flowing into the internal power supply ($V_{DD}$) from the input terminal (IN).

A series circuit of the n channel normally off FETs ($N_{33}$) through ($N_{36}$) is connected between the node ($IN_2$) and the ground (GND). The gates of the n channel normally off FETs ($N_{33}$) through ($N_{36}$) are connected the internal power supply ($V_{DD}$). The first electrode of the n channel normally off FET ($N_{37}$) is connected the node ($IN_2$) and the second electrode thereof is connected a node ($IN_3$). The input terminal of the inverter ($INV_{31}$) is connected the node ($IN_3$) and the output terminal thereof is connected a node ($IN_4$). The input terminal of the inverter ($INV_{32}$) is connected the node ($IN_4$) and the output terminal thereof is connected the output terminal (OUT).

Figure 22A:
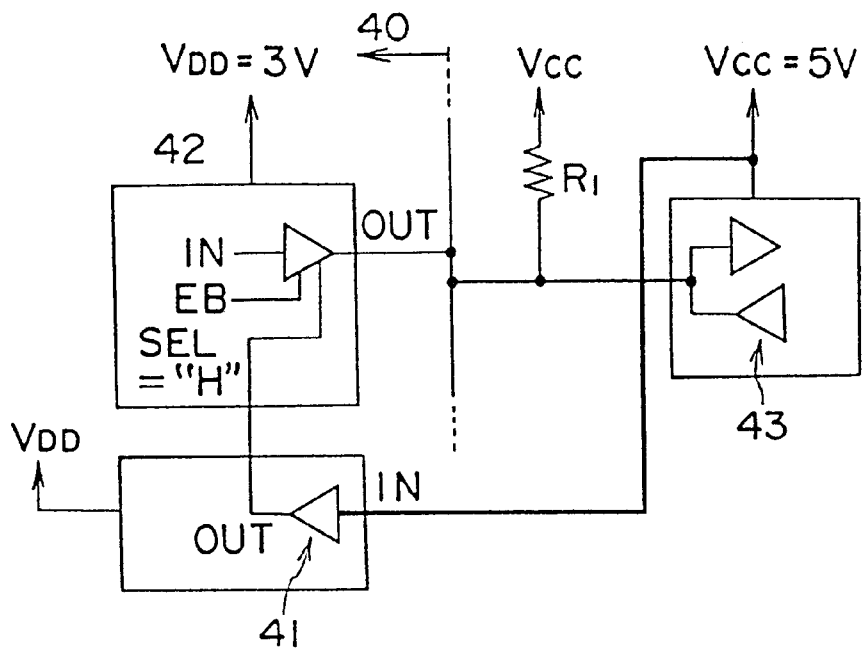
FIG. 22A is a block diagram illustrating a combination of an input circuit in accordance with the eleventh embodiment of this invention, an output circuit in accordance with the fourth embodiment of this invention and an external circuit working under a power supply of 5V.
Figure 22B:
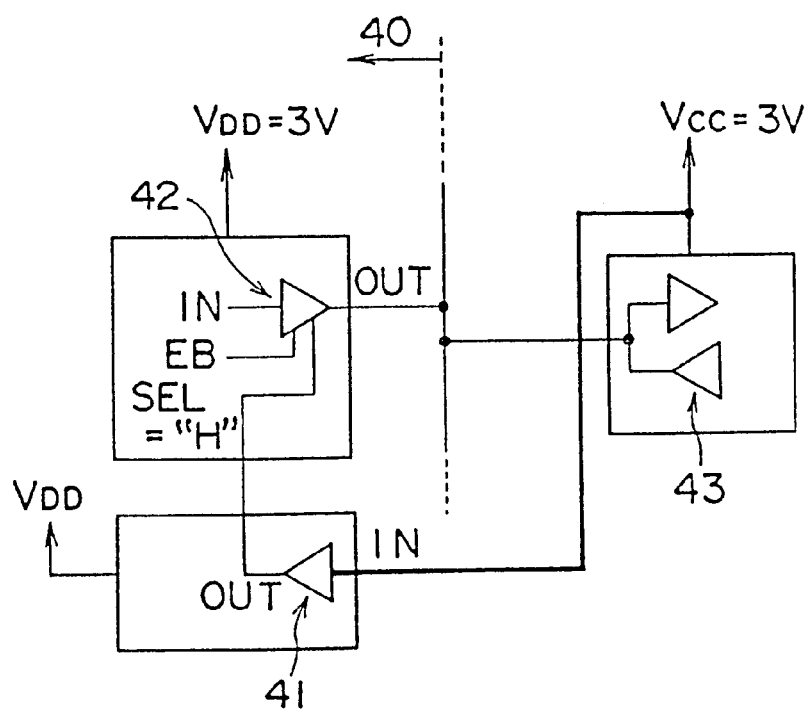
FIG. 22B is a block diagram illustrating a combination of an input circuit in accordance with the eleventh embodiment of this invention, an output circuit in accordance with the fourth embodiment of this invention and an external circuit working under a power supply of 3V.

FIG. 22A illustrates connection among an input circuit (41) of this embodiment, an output circuit (42) in accordance with the fourth embodiment of this invention described earlier referring to FIG. 11 and an external circuit (43) which works with a power supply (Vcc) of 5V. FIG. 22B illustrates connection among an input circuit (41) of this embodiment, an output circuit (42) in accordance with the fourth embodiment of this invention described earlier referring to FIG. 11 and an external circuit (43) which works with a power supply (Vcc) of 3V. The voltage of the internal power supply ($V_{DD}$) of the input circuit (41) and of the output circuit (42) is supposed to be 3V, and the input circuit (41) and the output circuit (42) are built-in in a common integrated circuit.

Referring to FIGS. 22A and 22B, the output terminal (OUT) of the output circuit (42) is connected the external circuit (43), and the input terminal (IN) of the input circuit (41) is connected the external power supply (Vcc). The output terminal (OUT) of the input circuit (41) is connected the select input terminal (SEL) of the output circuit (42).

Figure 23:
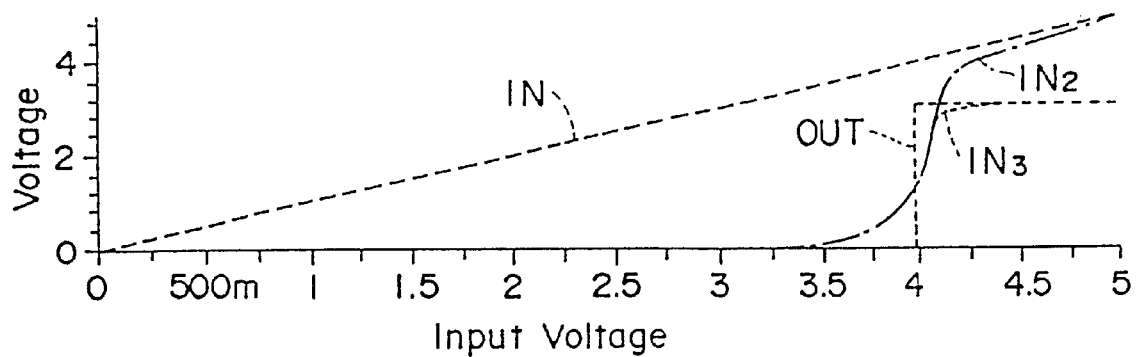
FIG. 23 is a timing chart illustrating the time-wise move of the potential of some terminals of an input circuit in accordance with the eleventh embodiment of this invention.

FIG. 23 illustrates the comparative relations between the voltage signal outputted from the output terminal (OUT) and the potential of the nodes ($IN_2$) and ($IN_3$), and the voltage of the input signal inputted in the input terminal (IN).

Referring to FIGS. 21, 22A, 22B and 23, the operation of the input circuit in accordance with the eleventh embodiment of this invention will be described below.

Firstly, referring to FIGS. 21 and 22A, since the input circuit is connected an external circuit in which a power supply of 5V is employed, the input terminal thereof (IN) is applied an input signal of 5V. Since the potential of the node ($IN_1$) exceeds the voltage of the ($V_{DD}$), the p channel normally off FET ($P_{31}$) turns off and the p channel normally off FET ($P_{32}$) turns on. Since the potential of the node ($IN_2$) exceeds the potential of the internal power supply ($V_{DD}$) or 3V, the potential of the node ($IN_3$) becomes ($V_{DD}-V_{th}$). As a result, the output potential of the inverter ($INV_{31}$) or the potential level of a node ($IN_4$) becomes "L" or 0V, resultantly causing the inverter ($INV_{32}$) to output a "HIGH" level signal of 3V. This "H" level signal is applied to the output circuit (42) more specifically to the select input terminal (SEL) shown in FIG. 11.

Secondly, referring to FIGS. 21 and 22B, since the input circuit is connected an external circuit in which a power supply of 3V is employed, the input terminal thereof (IN) is applied an input signal of 3V. As a result, the p channel normally off FETs ($P_{31}$) and ($P_{32}$) turn off. Due to the existence of the series circuit of the n channel normally off FETs ($N_{33}$) through ($N_{36}$), the potential level of the node ($IN_2$) is "L", resultantly causing the n channel normally off FET ($N_{37}$) to turn on. As a result, the potential level of the node ($IN_3$) becomes "L", resultantly causing the level of the ($IN_4$) to become "H" or 3V. As a result, the inverter ($INV_{32}$) outputs a "LOW" level signal or 0V. This "L" level signal is applied to the output circuit (42) more specifically to the select input terminal (SEL) shown in FIG. 11.

In the foregoing manner, the input circuit of this embodiment outputs an "L" level signal, when it is inputted a signal of a potential identical to the voltage of a power supply employed in this input circuit, namely Vcc or 3V, and outputs an "H" level signal, when it is inputted a signal of a potential higher than the voltage of a power supply employed in this input circuit, namely Vcc or 5V. As a result, this input circuit is employable for interfacing either an external circuit which works with a power supply having a voltage identical to that which is employed in the input circuit or an external circuit which works with a power supply having a voltage higher than the voltage which is employed in the input circuit. Accordingly, this input circuit is allowed to be employed to output a signal to the select input terminal (SEL) of the output circuit in accordance with the fourth embodiment of this invention.

The foregoing description has clarified that the eleventh embodiment of this invention has successfully provided an input circuit which outputs an "L" level signal, when being inputted a signal of a potential identical to the voltage of a power supply employed in the input circuit and which outputs an "H" level signal, when being inputted a signal of a potential higher than the voltage of a power supply employed in the input circuit.

Twelfth Embodiment

An input circuit which outputs an "L" level signal, when being inputted a signal of a potential identical to the voltage of a power supply employed in the input circuit and which outputs an "H" level signal, when being inputted a signal of a potential higher than the voltage of a power supply employed in the input circuit.

Figure 24:
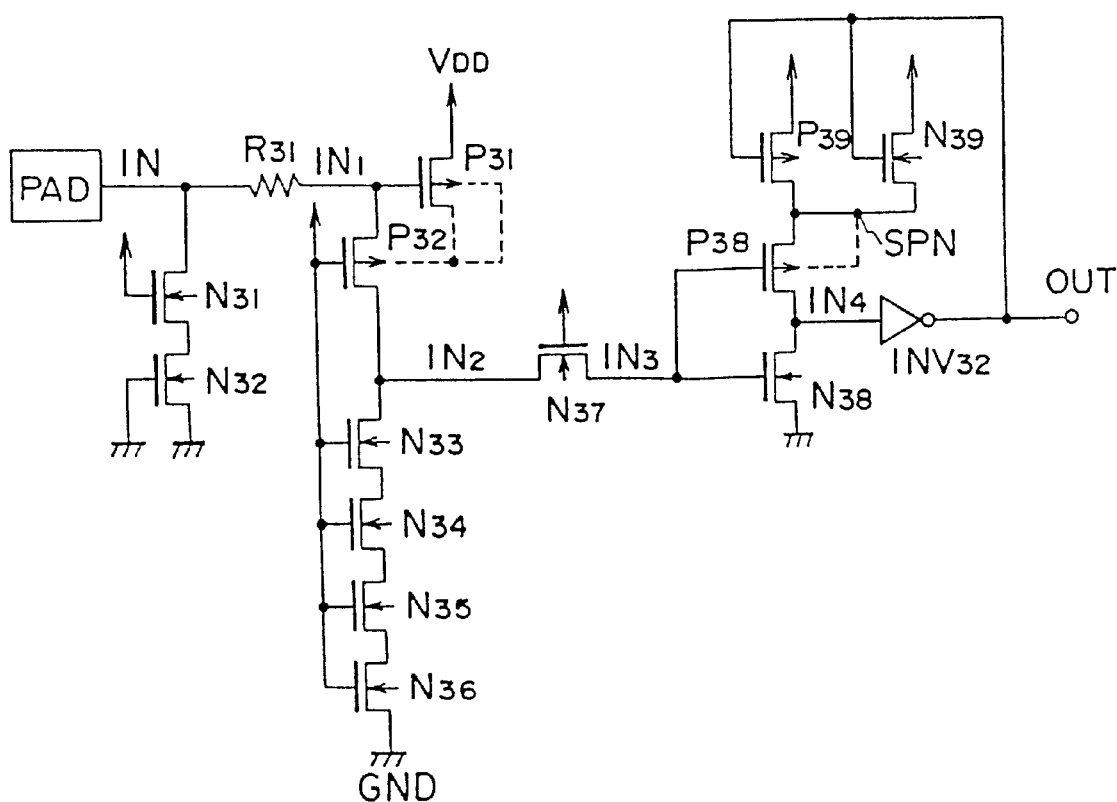
FIG. 24 is a circuit diagram of an input circuit in accordance with the twelfth embodiment of this invention.

Referring to FIG. 24, an input circuit which is allowable to be built-in in an integrated circuit in accordance with the twelfth embodiment of this invention is composed of an input terminal (IN), an output terminal (OUT), p channel normally off FETs ($P_{31}$), ($P_{32}$), ($P_{38}$) and ($P_{39}$), n channel normally off FETs ($N_{31}$) through ($N_{39}$), an inverter ($INV_{32}$) and a resister ($R_{31}$). The input circuit in accordance with the twelfth embodiment of this invention is the input circuit in accordance with the eleventh embodiment of this invention described referring to FIGS. 21, 22A, 22B and 23, to which p channel normally off FETs ($P_{38}$) and ($P_{39}$) and n channel normally off FETs ($N_{38}$) and ($N_{39}$) are newly introduced and from which the inverter ($INV_{31}$) is removed. The connection with an external circuit remains unchanged as is illustrated in FIGS. 22A or 22B.

The gate of the n channel normally off FET ($N_{38}$) is connected the node ($IN_3$), the drain thereof is connected a node ($IN_4$) and the source thereof is grounded. The gate of the p channel normally off FET ($P_{38}$) is connected the node ($IN_3$), the drain thereof is connected the node ($IN_4$) and the source thereof and the bulk thereof are connected a node (SPN). The bulk of the p channel normally off PET ($P_{38}$) is not connected the internal power supply ($V_{DD}$). The gate of the p channel normally off FET ($P_{39}$) is connected the output terminal (OUT), the drain thereof is connected the node (SPN) and the source thereof is connected the internal power supply ($V_{DD}$). The gate of the n channel normally off FET ($N_{39}$) is connected the output terminal (OUT), the drain thereof is connected the internal power supply ($V_{DD}$) and the source thereof is connected the node (SPN).

Figure 25A:
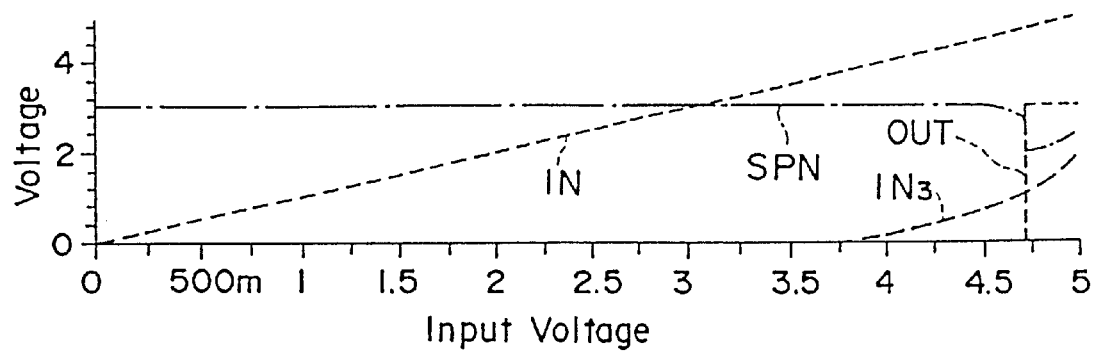
FIG. 25A is a timing chart illustrating the time-wise move of the potential of some terminals and nodes of an output circuit in accordance with the twelfth embodiment of this invention.
Figure 25B:
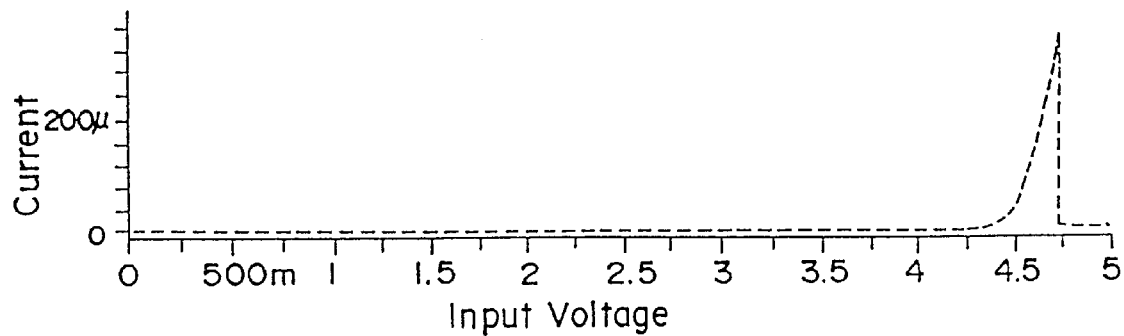
FIG. 25B is a timing chart illustrating the time-wise move of the current flowing in the power supply of an output circuit in accordance with the twelfth embodiment of this invention.

FIG. 25A illustrates the comparative relations between the voltage signal outputted from the output terminal (OUT) and the potential of the nodes ($IN_3$) and (SPN), and the voltage of the input signal inputted in the input terminal (IN). FIG. 25B illustrates the comparative relations between the intensity of electric current flowing into the internal power supply ($V_{DD}$) and the voltage of the input signal inputted in the input terminal (IN).

Referring to FIGS. 24, 25A and 25B, the operation of the input circuit in accordance with the twelfth embodiment of this invention is similar to that of the input circuit in accordance with the eleventh embodiment of this invention, excepting the operation under a condition that the input terminal (IN) is connected an external power supply of 5V.

Under a condition that the input terminal (IN) is connected an external power supply of 5V, the potential of the node ($IN_3$) becomes ($V_{DD}-V_{th}$), causing the n channel normally off FET ($N_{38}$) to turn on. As a result, an output signal having an "H" level or 3V is outputted from the output terminal (OUT). This output level causes the p channel normally off FET ($P_{39}$) to turn off, the n channel normally off FET ($N_{39}$) to turn on and the potential of the node (SPN) to become ($V_{DD}-V_{th}$). Since the potential of the nodes ($IN_3$) and (SPN) becomes ($V_{DD}-V_{th}$), the p channel normally off FET ($P_{38}$) can definitely turn off. As a result, an electric current is prevented from flowing from the internal power supply ($V_{DD}$) to the ground (GND) through the p channel normally off FET ($P_{38}$) and the n channel normally off FET ($N_{38}$).

Under a condition that the input terminal (IN) is connected an external power supply of 3V, the n channel normally off FETs ($N_{38}$) and ($N_{39}$) turn off and the p channel normally off FETs ($P_{38}$) and ($P_{39}$) turn on.

In the foregoing manner, the input circuit of this embodiment outputs an "L" level signal, when it is inputted a signal of a potential identical to the voltage of a power supply employed in this input circuit, namely Vcc or 3V, and outputs an "H" level signal, when it is inputted a signal of a potential higher than the voltage of a power supply employed in this input circuit, namely Vcc or 5V. As a result, this input circuit is employable for interfacing either an external circuit which works with a power supply having a voltage identical to that which is employed in the input circuit or an external circuit which works with a power supply having a voltage higher than the voltage which is employed in the input circuit. Accordingly, this input circuit is allowed to be employed to output a signal to the select input terminal (SEL) of the output circuit in accordance with the fourth embodiment of this invention.

The foregoing description has clarified that the eleventh embodiment of this invention has successfully provided an input circuit which outputs an "L" level signal, when being inputted a signal of a potential identical to the voltage of a power supply employed in the input circuit and which outputs an "H" level signal, when being inputted a signal of a potential higher than the voltage of a power supply employed in the input circuit. In addition, an electric current is prevented from flowing from the internal power supply ($V_{DD}$) to the ground (GND).

Thirteenth Embodiment

An input/output circuit which is convertible between an input circuit which receives a signal from an external circuit which works under a power supply of which the voltage is higher than the voltage of a power supply under which this input/output circuit works, at an input/output terminal (YPAD) and forwards the signal to a circuit which works under a power supply of which the voltage is identical to the voltage of a power supply under which this input/output circuit works, from an output terminal (OUT) and an output which receives a signal from a circuit which works under a power supply of which the voltage is identical to the voltage of a power supply under which this input/output circuit works, at an input terminal (IN) and forwards the signal to an external circuit which works under a power supply of which the voltage is higher than the voltage of a power supply under which this input/output circuit works, from the input/output terminal (YPAD), wherein the input circuit has an advantage that the voltage of the forwarded signal is identical to the voltage of the forwarded signal quickly increases at least up to the voltage of the power supply under which this input/output circuit works or high enough to cause the circuit which receives the forwarded signal to sufficiently work, and the output circuit has an advantage that the voltage of the power supply under which this input/output circuit works.

Figure 26:
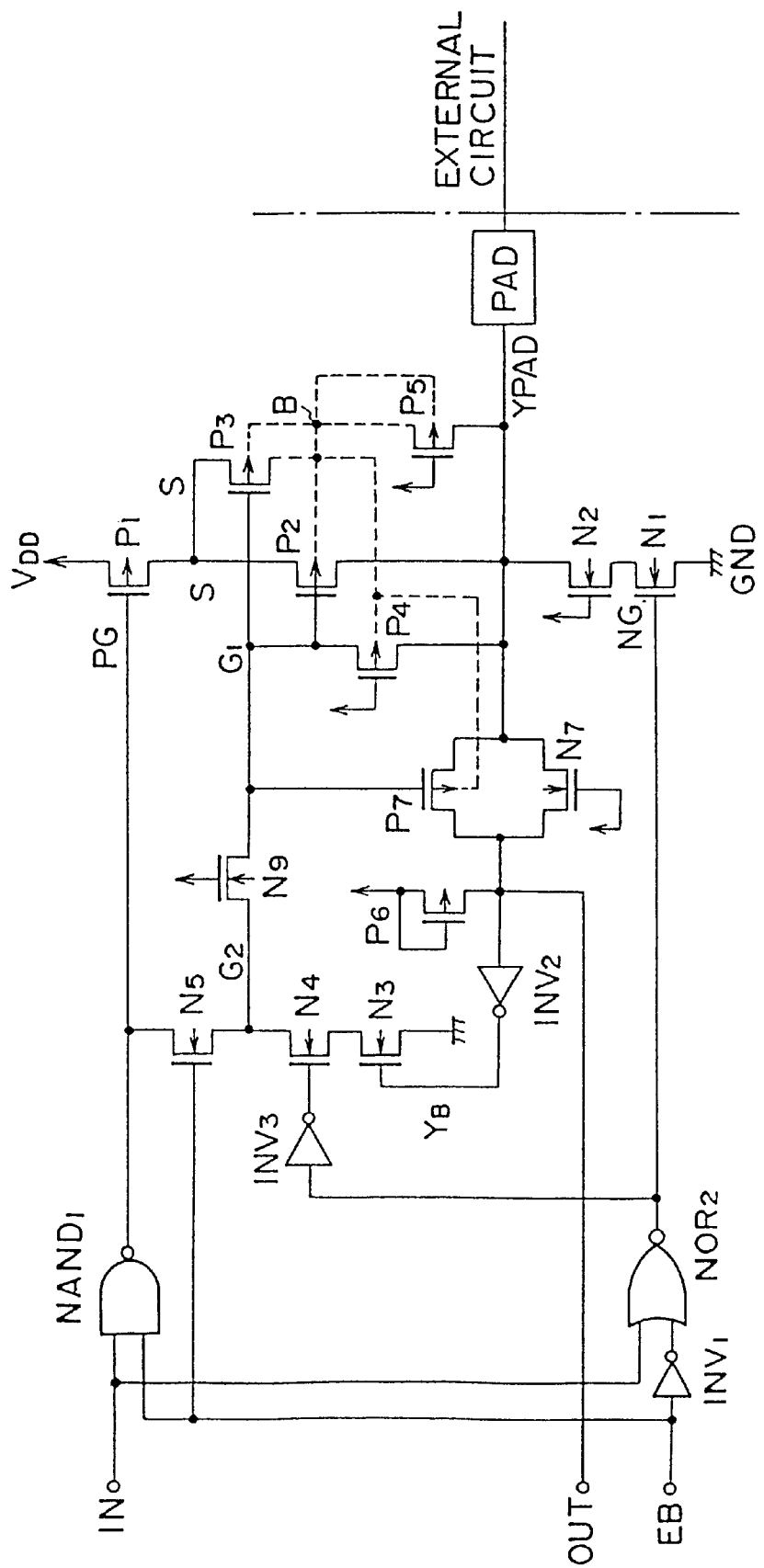
FIG. 26 is a circuit diagram of an input/output circuit in accordance with the thirteenth embodiment of this invention.

Referring to FIG. 26, an input/output circuit which is allowable to be built-in in an integrated circuit in accordance with the thirteenth embodiment of this invention is composed of an input terminal (IN), an enable input terminal (EB), an output terminal (OUT), an input/output terminal (YPAD), a NAND gate having two input ports ($NAND_1$), a NOR gate having two input ports ($NOR_2$), p channel normally off FETs ($P_1$) through ($P_7$), n channel normally off FETs ($N_1$) through ($N_5$), ($N_7$) and (No) and inverters ($INV_1$) through ($INV_3$). The voltage of an internal power supply ($V_{DD}$) employed for the input/output circuit in accordance with this embodiment is supposed to be 3V. The input/output terminal (YPAD) is supposed to be connected an external circuit (not shown) produced on a chip different from the chip on which this input/output circuit is produced. The input/output terminal (YPAD) is convertible to receive an input signal from the external circuit or to output an output signal to the external circuit. The voltage of an external power supply (Vcc) is supposed to be 5V. Accordingly, the "H" level of the input signal inputted to this input/output circuit is supposed to be 5V.

Referring to FIG. 26, the input terminal (IN) is connected the first port of the NAND gate ($NAND_1$), and the enable input terminal (EB) is connected the second port of the NAND gate ($NAND_1$). The output terminal of the NAND gate ($NAND_1$) is connected an internal node (PG). The input terminal (IN) is connected also the first port of the NOR gate ($NOR_2$), and the enable input terminal (EB) is connected the second port of the NOR gate ($NOR_2$) through the inverter ($INV_1$). The output terminal of the NOR gate ($NOR_2$) is connected an internal node (NG).

The gate of the n channel normally off FET ($N_1$) is connected the node (NG), and the source thereof is grounded. The gate of the n channel normally off FET ($N_2$) is connected the internal power supply ($V_{DD}$), the drain thereof is connected the input/output terminal (YPAD) and the source thereof is connected the drain of the n channel normally off FET ($N_1$).

The gate of the n channel normally off FET ($N_3$) is connected the output terminal (OUT) through the inverter ($INV_2$), and the source thereof is grounded. The gate of the n channel normally off FET ($N_4$) is connected the node (NG) through the inverter ($INV_3$), the drain thereof is connected an internal node ($G_2$) and the source thereof is connected the drain of the n channel normally off FET ($N_3$). The gate of the n channel normally off FET ($N_5$) is connected the enable input terminal (EB), the drain thereof is connected the node (PG), and the source thereof is connected the node ($G_2$). The gate of the n channel normally off FET ($N_9$) is connected the internal power supply ($V_{DD}$), the drain thereof is connected the node ($G_2$) and the source thereof is connected a node ($G_1$).

The gate of the p channel normally off FET ($P_1$) is connected the node (PG), the source thereof is connected the internal power supply ($V_{DD}$) and the drain thereof is connected a node (S). The gate of the p channel normally off FET ($P_2$) is connected the node ($G_1$), the drain thereof is connected the input/output terminal (YPAD) and the source thereof is connected a node (S). The gate of the p channel normally off FET ($P_3$) is connected the node ($G_1$) and the source thereof is connected the node (S). The gate of the p channel normally off FET ($P_4$) is connected the internal power supply ($V_{DD}$) and the drain thereof is connected the node ($G_1$) and the source thereof is connected the input/output terminal (YPAD). The gate of the p channel normally off FET ($P_5$) is connected the internal power supply ($V_{DD}$), the source thereof is connected the input/output terminal (YPAD).

The gate of the n channel normally off FET ($N_7$) is connected the internal power supply ($V_{DD}$), the first electrode thereof (the drain or the source thereof is connected the input/output terminal (YPAD) and the second electrode thereof (the source or the drain thereof) is connected the output terminal (OUT). The gate of the p channel normally off FET ($P_7$) is connected the node ($G_1$), the first electrode thereof (the drain or the source thereof is connected the output terminal (OUT) and the second electrode thereof (the source or the drain thereof is connected the input/output terminal (YPAD). The gate and the source of the p channel normally off FET ($P_6$) are connected the internal power supply ($V_{DD}$) and the drain thereof is connected the output terminal (OUT).

The p channel normally off FETs ($P_2$), ($P_3$), ($P_4$), ($P_5$) and ($P_7$) are produced in an n well, which is a floating bulk (B) which is connected neither the internal power supply ($V_{DD}$) nor the ground (GND). The drains of the p channel normally off FETs ($P_3$) and ($P_5$) are connected the floating bulk (B). The bulks of the p channel normally off FETs ($P_1$) and ($P_6$) are connected the internal power supply ($V_{DD}$), and the bulks of the n channel normally off FETs ($N_1$) through ($N_5$), ($N_7$) and ($N_9$) are grounded.

The input/output terminal (YPAD) is connected the drain of the p channel normally off FET ($P_2$), the sources of the p channel normally off FETs ($P_4$) and ($P_5$) and the second electrode of the n channel normally off FET ($N_7$). The node (PG) is connected the output terminal of the NAND gate ($NAND_1$), the gate of the p channel normally off FET ($P_1$) and the drain of the n channel normally off FET (Ns). The node (NG) is connected the output terminal of the NOR gate ($NOR_2$), the input terminal of the inverter ($INV_3$) and the gate of the n channel normally off FET ($N_1$). The node ($G_1$) is connected the gates of the p channel normally off FETs ($P_2$), ($P_3$) and ($P_7$), the drain of the p channel normally off FET ($P_4$) and the source of the n channel normally off FET ($N_9$). The node ($G_2$) is connected the source of the n channel normally off FET ($N_5$) and the drains of the n channel normally off FETs ($N_4$) and ($N_9$). The node (S) is connected the drain of the p channel normally off FET ($P_1$) and the sources of the p channel normally off FETs ($P_2$) and ($P_3$). The output terminal (OUT) is connected the input terminal of the inverter ($INV_2$), the drain of the p channel normally off FET ($P_6$), the first electrode of the p channel normally off FET ($P_7$) and the second electrode of the n channel normally off FET ($N_7$).

The input/output circuit in accordance with the thirteenth embodiment of this invention works as an input circuit to receive an input signal of a voltage higher than that of a power supply under which the input/output circuit works, at the input/output terminal (YPAD) from an external circuit (not shown) and to forward the inputted signal from the output terminal (OUT), under a condition that an "L" level signal is applied the enable input terminal (EB), and works as an output circuit to receive an input signal of a voltage identical to that of a power supply under which the input/output circuit works, at the input terminal (IN) and to output the signal from the input/output terminal (YPAD) to an external circuit (not shown), under a condition that an "H" level signal is applied the enable input terminal (EB).

Figure 27A:
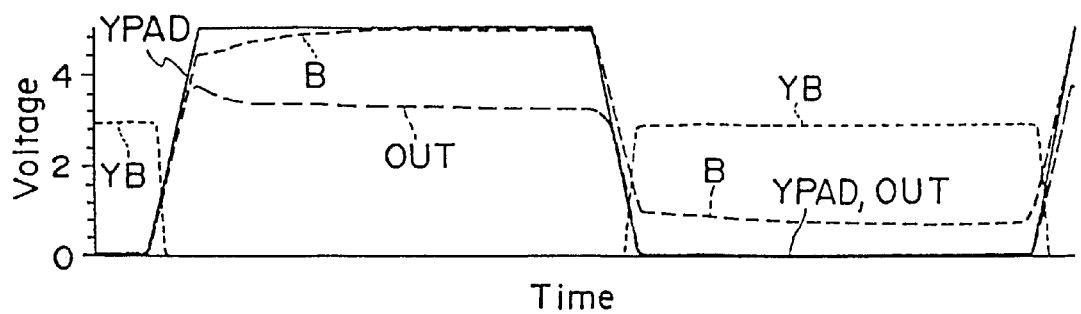
FIG. 27A is a timing chart illustrating the time-wise move of the potential of some terminals and nodes of an output circuit in accordance with the thirteenth embodiment of this invention.
Figure 27B:
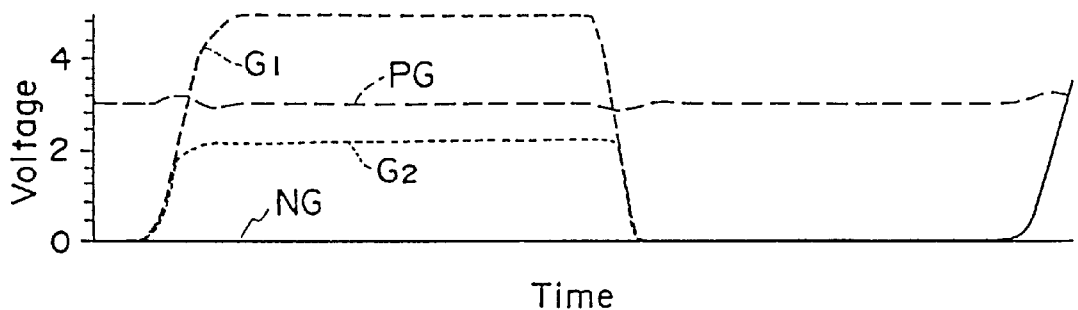
FIG. 27B is a timing chart illustrating the time-wise move of the current flowing in a power supply of an output circuit in accordance with the thirteenth embodiment of this invention.
Figure 27C:
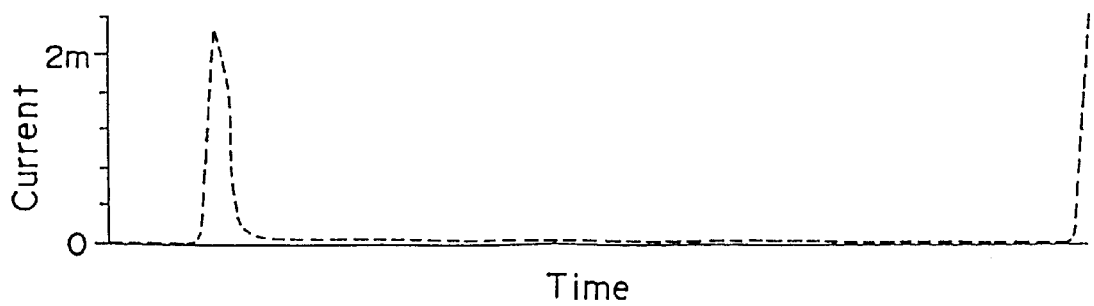
FIG. 27C is a timing chart illustrating the time-wise move of the current flowing in the power supply of an output circuit in accordance with the thirteenth embodiment of this invention.

FIGS. 27A, 27B and 27C respectively illustrate the time-wise move of voltages at the nodes (B) and (YB) and of the signal of the input/output terminal (YPAD) and the output terminal (OUT), the time-wise move of the voltages at the nodes ($G_1$), ($G_2$), (PG) and (NG) and the current flowing in the internal power supply ($V_{DD}$), under a condition that the input/output circuit is working as an input circuit.

Firstly, the enable input terminal (EB) is supposed to be applied an "L" level signal to cause the input/output circuit to work as an input circuit. Since the NAND gate ($NAND_1$) outputs an "H" level signal or 3V, the potential of the node (PG) is made "H" and the p channel normally off FET ($P_1$) is turned off. Since the inverter ($INV_1$) outputs an "H" level signal, the NOR gate ($NOR_2$) outputs an "L" level signal to make the potential level of the node (NG) "L". Thus, the n channel normally off FET ($N_1$) is OFF. Since the potential level of the enable input terminal (EB) is "L", the n channel normally off FET ($N_5$) is OFF. Since the potential level of the node (NG) is "L", the inverter ($INV_3$) outputs an "H" level signal to turn on the n channel normally off FET ($N_4$).

In the foregoing manner, under a condition that the potential level of the enable input terminal (EB) is "L", the p channel normally off FET ($P_1$) and the n channel normally off FET ($N_1$) are OFF. As a result, the impedance of the input/output terminal (YPAD) (the impedance of the input/output terminal (YPAD) toward the inside of the input/output circuit from the input/output terminal (YPAD)) is high, regardless the potential level of the input terminal (IN). In other words, during a period in which the potential level of the enable input terminal (EB) is kept in an "L" level, the impedance of the input/output terminal (YPAD) is kept high, and the input/output circuit to work as an input circuit.

If the potential level of the input/output terminal (YPAD) is in an "L" level or 0V, the n channel normally off FET ($N_7$) is ON and the potential level of the output terminal (OUT) is "L". Since the potential level of the output terminal (OUT) is "L", the output level of the inverter ($INV_2$) becomes "H". As a result, both the n channel normally off FETs ($N_3$) and ($N_4$) are ON. Since both the n channel normally off FETs ($N_3$) and ($N_4$) are ON, the potential level of the node ($G_2$) is "L". Since the potential level of the node ($G_2$) is "L", the n channel normally off FET ($N_9$) is ON. Thus, the level of the node ($G_1$) is in an "L" level.

If the potential level of the input/output terminal (YPAD) shifts from the "L" level to the potential level of the external power supply (Vcc) or 5V, the potential level of the output terminal (OUT) shifts to the level of the internal power supply ($V_{DD}$). For the simplicity's sake, the absolute value of the threshold voltage of a p channel normally off FET is identical to the threshold voltage of an n channel normally off FET, and the value is named "$V_{th}$".

If the potential level of the input/output terminal (YPAD) has increased to the $V_{th}$, the p channel normally off FET ($P_7$) turns on, because the potential level of the node ($G_1$) is "L". The n channel normally off FET ($N_7$) is ON, when the potential of the input/output terminal (YPAD) is less than ($3V-V_{th}$), and the n channel normally off FET ($N_7$) is OFF, when the potential of the input/output terminal (YPAD) is higher than ($3V-V_{th}$). Accordingly, when the potential of the input/output terminal (YPAD) has increased up to 3V, a combination (a parallel circuit) of the p channel normally off FET ($P_7$) and the n channel normally off FET ($N_7$) causes the output terminal (OUT) to output a 3V signal rather than a signal of ($3V-V_{th}$).

When the potential of the input/output terminal (YPAD) has increased up to the $V_{th}$, the p channel normally off FET ($P_2$) turns on, because the potential level of the node ($G_1$) is "L". Since the p channel normally off FET ($P_2$) has turned on, the potential of the node (S) increases to the level of the input/output terminal (YPAD), resultantly causing the p channel normally off FET ($P_3$) to turn on. Since the p channel normally off FETs ($P_2$) and ($P_3$) have turned on, the potential level of the floating bulk (B) increases to the potential of the input/output terminal (YPAD).

If the potential of the input/output terminal (YPAD) and of the output terminal (OUT) has increased to 3V, the output level of the inverter ($INV_2$) shifts to an "L" level from an "H" level, to turn off the n channel normally off FET ($N_3$). However, the potential level of the node ($G_1$) stays unchanged at "L" level.

If the potential of the input/output terminal (YPAD) has increased to ($3V+V_{th}$), the p channel normally off FETs ($P_4$) and ($P_5$) turn on. Since the p channel normally off FET ($P_4$) has turned on, the potential level of the node ($G_1$) shifts from an "L" level to a level identical to that of the input/output terminal (YPAD) and of the node (S). Since the potential level of the node ($G_1$) becomes identical to that of the input/output terminal (YPAD), the p channel normally off FET ($P_7$) turns off. Since the potential level of the node ($G_1$) becomes identical to that of the input/output terminal (YPAD), the p channel normally off FETs ($P_2$) and ($P_3$) turn off. Since the p channel normally off FET ($P_5$) turns on, the potential level of the floating bulk (B) becomes identical to that of the input/output terminal (YPAD).

When the potential level of the input/output terminal (YPAD) has finally increased to the level of the external power supply (Vcc) or 5V, the potential level of the floating bulk (B) and of the node ($G_1$) becomes 5V. If the potential of the output terminal (OUT) has exceeded ($3V+V_{th}$), before the p channel normally off FET ($P_7$) turns off, the p channel normally off FET ($P_6$) turns on. Due to the p channel normally off FET ($P_6$) which is presently working as a diode connected in a forward direction, the potential of the output terminal (OUT) is clamped at ($3V+V_{th}$).

In the foregoing manner, under a condition that the potential level of the enable input terminal (EB) is "L" and that the potential level of the input/output terminal (YPAD) is 5V, the p channel normally off FETs ($P_2$) and ($P_3$) turn off, causing the impedance level of the drain of the p channel normally off FET ($P_1$) or of the node (S) to become high. As a result, no leak current flows from the input/output terminal (YPAD) to the internal power supply ($V_{DD}$) through the node (S) and through the bulk of the p channel normally off FET ($P_1$). Since the floating bulk (B) is not connected the internal power supply ($V_{DD}$), no leak current flows from the floating bulk (B) to the internal power supply ($V_{DD}$) through the drain of the p channel normally off FET ($P_2$) and the sources of the p channel normally off FETs ($P_4$) and ($P_5$). Since the input terminal of the inverter ($INV_2$) is connected the gate of FET (not shown) constituting the inverter ($INV_2$), the impedance level of the input terminal of the inverter ($INV_2$) is high. Since the drain and the bulk of the n channel normally off FET ($N_1$) are counter biased each other, the impedance level of the n channel normally off FET ($N_1$) is high as well. Accordingly, no leak current flows from the output terminal (OUT) to the ground (GND).

Accordingly, the input/output circuit in accordance with the thirteenth embodiment of this invention works as an input circuit to receive an input signal of which the voltage is higher than the voltage of the power supply under which the input/output circuit of this embodiment works, at the input/output terminal (YPAD) from an external circuit which works under a power supply of which the voltage is higher than the voltage of the power supply under which the input/output circuit of this embodiment works, and to forward the inputted signal to the next stage circuit which works under a power supply of which the voltage is identical to the voltage of the power supply under which the input/output circuit of this embodiment works, from the output terminal (OUT). It is noted this function is realized by the p channel normally off FET ($P_7$) produced on the floating bulk (B).

Secondly, the enable input terminal (EB) is supposed to be applied an "H" level signal or a 3V signal to cause the input/output circuit to work as an output circuit, which receives an input signal at the input terminal (IN) and forward the outputted signal from the input/output terminal (YPAD).

If the input terminal (IN) is applied an "L" level signal or a 0V signal, the NAND gate ($NAND_1$) outputs an "H" level signal to cause the potential level of the node (PG) to be in an "H" level and to cause the p channel normally off FET ($P_1$) to turn off. The NOR gate ($NOR_2$) outputs an "H" level signal to cause the potential level of the node (NG) to be in an "H" level and the n channel normally off FET ($N_1$) to turn on. As a result, the potential level of the input/output terminal (YPAD) is in an "L" level or 0V.

Since the potential level of the input/output terminal (YPAD) is in an "L" level or 0V, the n channel normally off FET ($N_7$) is ON, resultantly causing an "L" level signal to be outputted from the output terminal (OUT). Since the potential level of the output terminal of the inverter ($INV_2$) or of the node (YB) is in an "H" level or 3V, the n channel normally off FET ($N_3$) is ON. Since the potential level of the node (NG) is in an "H" level, the inverter ($INV_3$) outputs an "L" level signal, causing the n channel normally off FET ($N_4$) to turn off. Since the potential level of the enable input terminal (EB) is "H", the potential level of the source of the n channel normally off FET ($N_5$) or of the node ($G_2$) becomes ($3V-V_{th}$) and the potential level of the source of the n channel normally off FET ($N_9$) or of the node ($G_1$) becomes ($3V-V_{th}$). Since the potential level of the node ($G_1$) and of the internal power supply ($V_{DD}$) is higher than that of the input/output terminal (YPAD), the p channel normally off FETs (P$_2$), (P$_4$), (P$_5$) and (P$_7$) are OFF. Since the potential level of the node (S) is less than (3V−V$_{th}$), the p channel normally off FET (P$_3$) is OFF as well.

If the potential level of the input terminal (IN) is shifted from an "L" level to an "H" level, the potential level of the output terminal of the NAND gate (NAND$_1$) or of the node (PG) shifts from an "H" level to an "L" level, causing the p channel normally off FET (P$_1$) and the n channel normally off FET (N$_5$) to turn on. The potential level of the output terminal of the NOR gate (NOR$_2$) or of the node (NG) shifts from an "H" level to an "L" level, resultantly causing the n channel normally off FET (N$_1$) to turn off. Since the potential level of the node (NG) has shifted to an "L" level, the inverter (INV$_3$) outputs an "H" level signal, resultantly causing the n channel normally off FET (N$_4$) to turn on. Since the n channel normally off FETs (N$_4$) and (N$_5$) have turned on, the potential level of the node (G$_2$) shifts to an "L" level. As a result, the n channel normally off FET (N$_9$) turns on and the potential level of the node (G$_1$) is shifted to an "L" level.

Since the p channel normally off FET (P$_1$) has turned on, the potential of the node (S) becomes 3V or the level of the internal power supply (V$_{DD}$). Since the potential level of the node (G$_1$) is "L", the p channel normally off FETs (P$_2$) and (P$_3$) turn on. Since the p channel normally off FET (P$_2$) has turned on, the potential level of the input/output terminal (YPAD) increases to the level of the internal power supply (V$_{DD}$) or 3V. Since the p channel normally off FET (P$_3$) has turned on, the potential of the floating bulk (B) increases to the level of the internal power supply (V$_{DD}$) or 3V. The function of the p channel normally off FET (P$_3$) is to increase the potential of the floating bulk (B) definitely to 3V or higher and to secure the stable operation of the p channel normally off FET (P$_2$).

If the potential of the input/output terminal (YPAD) has increased to the V$_{th}$, the p channel normally off FET (P$_7$) turns on. If the potential of the input/output terminal (YPAD) has increased to the potential of the internal power supply (V$_{DD}$) or 3V, the potential of the output terminal (OUT) increases to the potential of the internal power supply (V$_{DD}$) or 3V, resultantly causing the n channel normally off FET (N$_7$) to turn on. Since the potential level of the output signal of the inverter (INV$_2$) or of the node (YB) shifts to an "L" level, the n channel normally off FET (N$_3$) turns off. However, the potential level of the node (G$_1$) stays unchanged at an "L" level.

In the foregoing manner, under a condition that the potential level of the enable input terminal is "H", the input/output circuit in accordance with this embodiment works as an output circuit which receives a signal form a circuit which works under a power supply of which the voltage is identical to that of the power supply under which the input/output circuit works, at the input terminal (IN) and forward the inputted signal from the input/output terminal (YPAD) to an external circuit which works under a power supply of which the voltage is higher than that of the power supply under which the input/output circuit works.

The foregoing description has clarified that the thirteenth embodiment of this invention has successfully provided an input/output circuit which is convertible between an input circuit which receives a signal from an external circuit which works under a power supply of which the voltage is higher than the voltage of a power supply under which this input/output circuit works, at an input/output terminal (YPAD) and forwards the inputted signal to a circuit which works under a power supply of which the voltage is identical to the voltage of a power supply under which this input/output circuit works, from an output terminal (OUT) and an output which receives a signal from a circuit which works under a power supply of which the voltage is identical to the voltage of a power supply under which this input/output circuit works, at an input terminal (IN) and forwards the inputted signal to an external circuit which works under a power supply of which the voltage is higher than the voltage of a power supply under which this input/output circuit works, from the input/output terminal (YPAD), wherein the input circuit has an advantage that the voltage of the forwarded signal is identical to the voltage of the power supply under which this input/output circuit works or high enough to cause the circuit which receives the forwarded signal to sufficiently work, and the output circuit has an advantage that the voltage of the forwarded signal quickly increases at least up to the voltage of the power supply under which this input/output circuit works.

Although this invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. An input circuit comprising:
   a first type field effect transistor having a channel of a first conductivity having a gate connected to a first power supply, having a first electrode connected to said first power supply and having a second electrode connected to a first node,
   a second type field effect transistor having a channel of the first conductivity, having a gate connected to a second node, having a first electrode connected to said first node, having a second electrode connected to a third node and having a substrate connected to a fourth node which is floating,
   a third type field effect transistor having a channel of the first conductivity, having a gate connected to said first power supply, having a first electrode connected to said second node, having a second electrode connected to said third node and having a substrate connected to said fourth node,
   a fourth type field effect transistor having a channel of a second conductivity opposite the first conductivity, having a gate connected to said first power supply, having a first electrode connected to said third node and having a second electrode connected to a fifth node,
   a fifth type effect transistor having a channel of the first conductivity, having a gate connected to said second node, having a first electrode connected to said fifth node, having a second electrode connected to said third node and having a substrate connected to said fourth node.
   an inverter having an input terminal connected to said fifth node and an output terminal connected to a sixth node,
   a sixth type field effect transistor having a channel of the second conductivity, having a gate connected to said sixth node, having a first electrode connected to a second power supply and having a second electrode connected to a seventh node, and
   a seventh type field effect transistor having a channel of the second conductivity, having a gate connected to said first power supply, having a first electrode connected to said seventh node and having a second electrode connected to said second node.

2. An input circuit in accordance with claim 1, further comprising:

an eighth type field effect transistor having a channel of the first conductivity, having a gate connected to said first power supply, having a first electrode connected to said first power supply and having a second electrode connected to said fifth node.

3. An input circuit in accordance with claim 1, further comprising:

an eighth type field effect transistor having a channel of the first conductivity, having a gate connected to said second power supply, having a first electrode connected to said first power supply and having a second electrode connected to said fifth node.

4. An input circuit in accordance with claim 1, further comprising:

an eighth type field effect transistor having a channel of the second conductivity, having a gate connected to said first power supply, having a first electrode connected to said fifth node and having a second electrode connected to said second power supply.

5. An input circuit in accordance with claim 1, further comprising:

an eighth type field effect transistor having a channel of the second conductivity, having a gate connected to said first power supply, having a first electrode connected to said third node and having a second electrode connected to an eighth node, and a ninth type field effect transistor having a channel of the first conductivity, having a gate connected to said eighth node, having a first electrode connected to said first power supply, having a second electrode connected to said third node and having a substrate connected to said fourth node.

6. An input circuit in accordance with claim 1, further comprising:

an eighth type field effect transistor having a channel of the second conductivity, having a gate connected to said first power supply, having a first electrode connected to said second power supply and having a second electrode connected to an eighth node, and a ninth type field effect transistor having a channel of the second conductivity, having a gate connected to said first power supply, having a first electrode connected to said eighth node and having a second electrode connected to said third node.

7. An input circuit in accordance with claim 1, further comprising:

an eighth type field effect transistor having a channel of the first conductivity, having a gate connected to said second node, having a first electrode connected to said first node, having a second electrode connected to said fourth node and having a substrate connected to said fourth node.

8. An input circuit in accordance with claim 1, further comprising: an eighth type field effect transistor having a channel of the first conductivity, having a gate connected to said first power supply, having a first electrode connected to said third node, having a second electrode connected to said fourth node and having a substrate connected to said fourth node.

9. An input circuit in accordance with claim 1, further comprising:

an input terminal connected to said third node, an output terminal connected to said fifth node, an eighth type field effect transistor having a channel of the second conductivity, having a gate connected to said second power supply, having a first electrode connected to said second power supply and having a second electrode connected to an eighth node, and a ninth type field effect transistor having a channel of the second conductivity, having a gate connected to said first power supply, having a first electrode connected to said eighth node and having a second electrode connected to said third node.

10. An input circuit in accordance with claim 9, further comprising:

a tenth type field effect transistor having a channel of the second conductivity, having a gate connected to said first power supply, having a first electrode connected to said eighth node and having a second electrode connected to said second power supply.

* * * * *